United States Patent [19]
Kogure et al.

[11] Patent Number: 5,636,048
[45] Date of Patent: Jun. 3, 1997

[54] EQUALIZING AMPLIFIER, RECEIVER USING THE SAME AND PREAMPLIFIER

[75] Inventors: Kazuhisa Kogure; Hirokazu Osada, both of Oyama; Yasuhiro Tanaka, Sapporo; Hiroo Kitasagami, Kawasaki; Makoto Miyoshi; Kakuji Inoue, both of Oyama; Takayoshi Ikegami, Sapporo; Kenichi Kobayashi, Oyama; Shinichiro Sano, Oyama; Setsuo Misaizu, Oyama; Masahiko Yamashita; Tatsuya Nishimura, both of Kawasaki, all of Japan

[73] Assignee: Fujitsu Limited, Kanagawa, Japan

[21] Appl. No.: 406,200

[22] Filed: Mar. 16, 1995

[30] Foreign Application Priority Data

| Mar. 17, 1994 | [JP] | Japan | 6-046922 |
| Dec. 14, 1994 | [JP] | Japan | 6-311022 |
| Mar. 14, 1995 | [JP] | Japan | 7-053875 |

[51] Int. Cl.$^6$ ............................................. H04B 10/06
[52] U.S. Cl. .......................... 359/189; 359/194; 330/278; 330/304; 330/291
[58] Field of Search ....................... 359/189, 194, 359/195; 330/278, 279, 284, 285, 291, 304, 308, 59, 75, 140

[56] References Cited

U.S. PATENT DOCUMENTS

| 4,241,455 | 12/1980 | Eibner | 359/194 |
| 4,502,021 | 2/1985 | Hill | 330/279 |
| 4,621,238 | 11/1986 | Fenk | 330/278 |
| 4,679,252 | 7/1987 | Holland | 359/194 |

FOREIGN PATENT DOCUMENTS

| 0580089 | 1/1994 | European Pat. Off. | 359/194 |
| 0624009 | 11/1994 | European Pat. Off. | 359/194 |
| 62-15909 | 1/1987 | Japan . | |
| 0048839 | 3/1987 | Japan | 359/194 |
| 62-139403 | 6/1987 | Japan . | |
| 62-202635 | 9/1987 | Japan . | |

*Primary Examiner*—Leslie Pascal

[57] ABSTRACT

In an equalizing amplifier that equalizes an electric signal obtained from a light signal received via an optical transmission path, an AGC circuit generates first and second signals from the electric signal by referring to a threshold voltage. The first and second signals are complementary signals. An offset compensation circuit generates a first difference signal based on a difference between the first and second signals, compares the first difference signal with a first reference signal, and outputs, as the threshold voltage, a resultant error signal to the AGC circuit. The threshold voltage is varied so that it is located in the center of an amplitude of the electric signal whereby an offset of the AGC circuit can be compensated for.

33 Claims, 47 Drawing Sheets

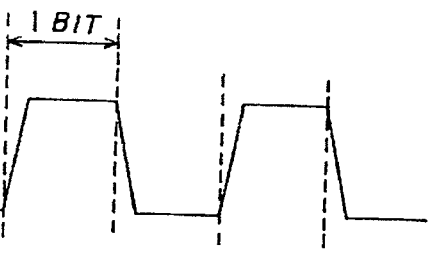
FIG. 7(A) LIGHT INPUT (MAX) S1
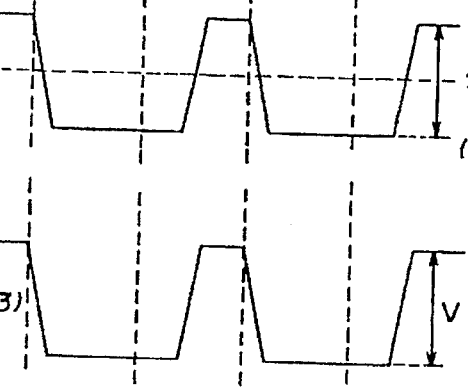
FIG. 7(B) PREAMP OUTPUT S2
AGC THRESHOLD VOLTAGE S5 (CONTROLLED TO BE LOCATED IN THE AMPLITUDE CENTER)
FIG. 7(C) AGC OUTPUT (NON-INVERTED S3)
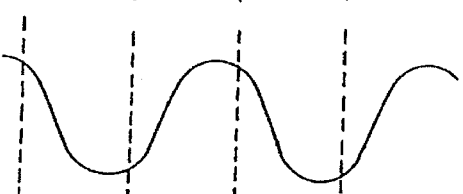
FIG. 7(D) OUTPUT OF LPF
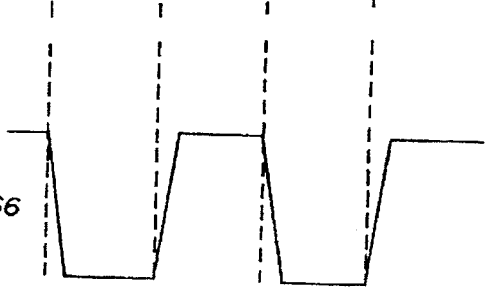
FIG. 7(E) PULSE-WIDTH COMPENSATED S6

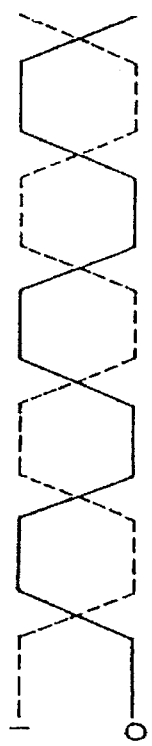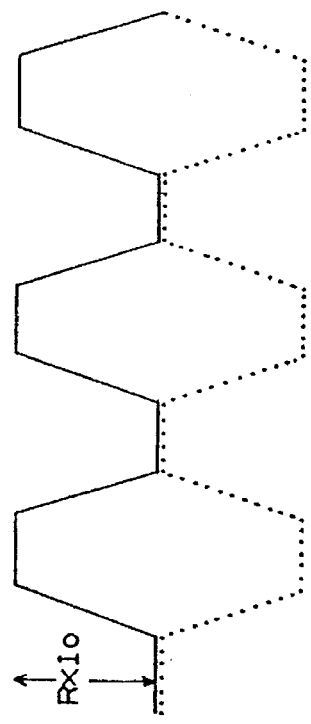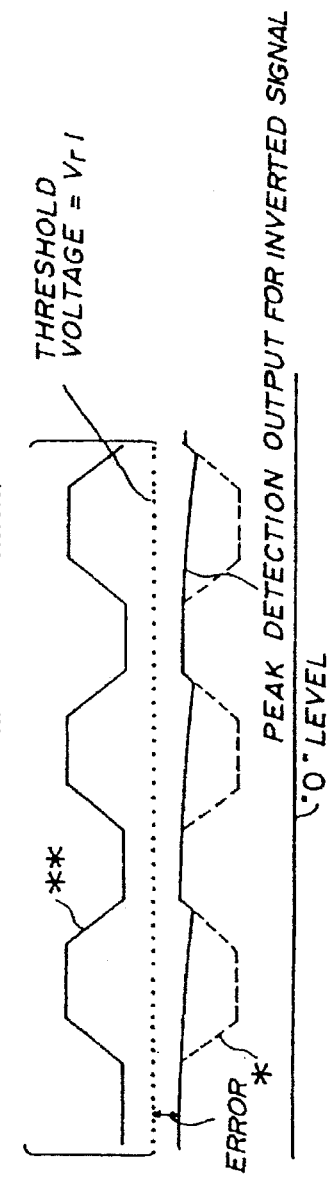
FIG. 11(A) (1) AGC OUTPUT
FIG. 11(B) (2) WAVEFORM LEVEL-SHIFTED BY Rx Io
FIG. 11(C) (3) WAVEFORM DIFFERENCE BETWEEN INVERTED AND NON-INVERTED SIGNALS (1) AGC OUTPUT (4) WAVEFORM LEVEL-SHIFTED BY RxIo (5) WAVEFORM DIFFERENCE BETWEEN INVERTED AND NON-INVERTED SIGNALS THRESHOLD VOLTAGE = $v_{r2}$

PEAK DETECTION OUTPUT FOR INVERTED SIGNAL

ERROR

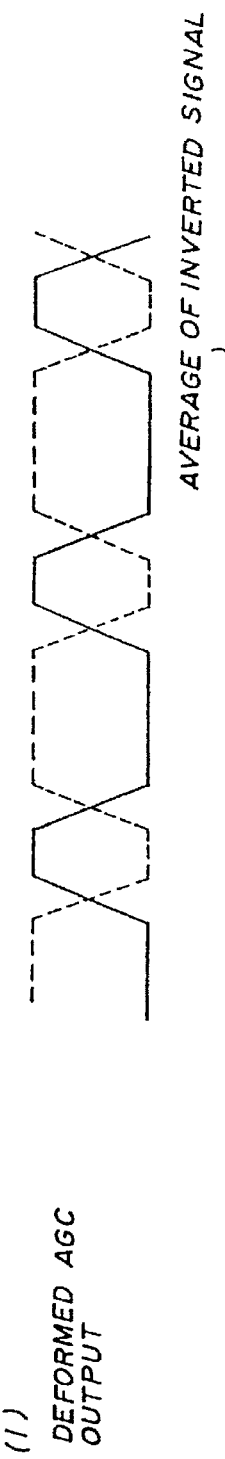
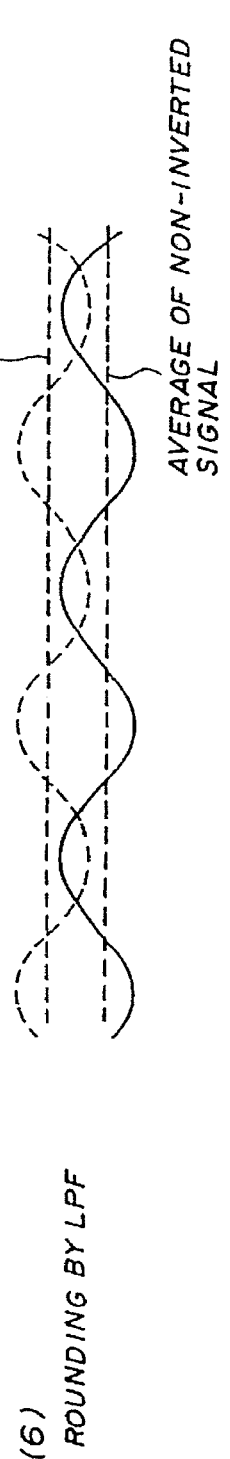
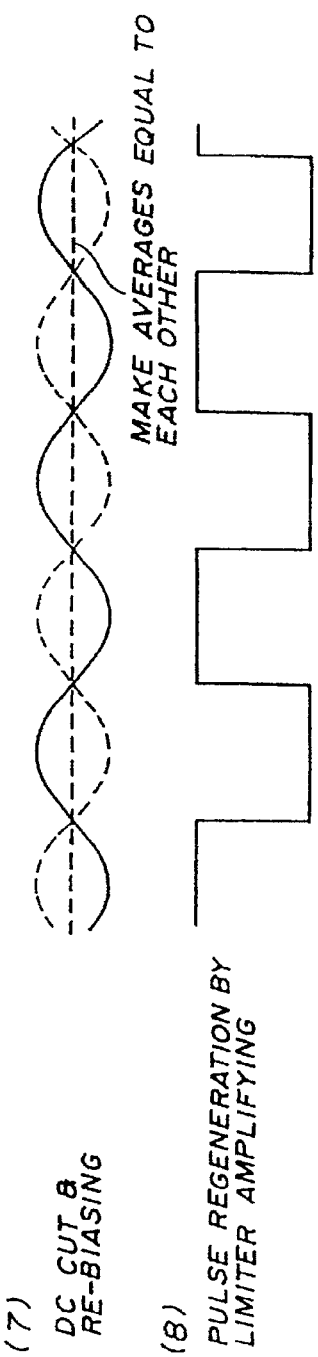
FIG. 13(A) (1) DEFORMED AGC OUTPUT
FIG. 13(B) (6) ROUNDING BY LPF
FIG. 13(C) (7) DC CUT & RE-BIASING
FIG. 13(D) (8) PULSE REGENERATION BY LIMITER AMPLIFYING

NO SIGNAL     SIGNAL IS INPUT

CONTROLLED SO THAT PEAK VALUES BECOME EQUAL TO EACH OTHER

FIG. 29(A) DATA
FIG. 29(B) $\overline{CLK}$
FIG. 29(C) CLK
FIG. 29(D) MASTER
FIG. 29(E) SLAVE

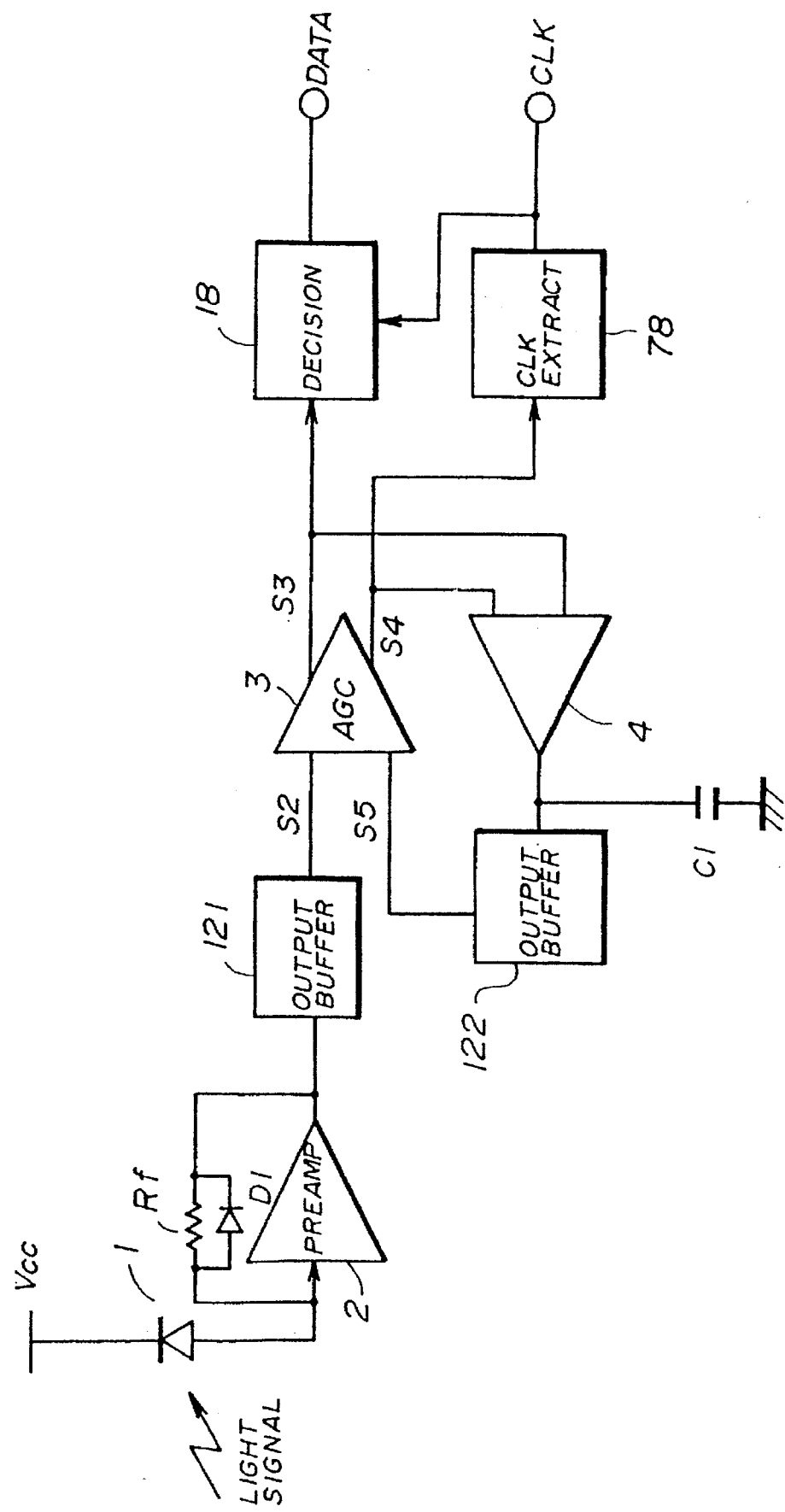

EQUALIZING AMPLIFIER, RECEIVER USING THE SAME AND PREAMPLIFIER

BACKGROUND OF THE INVENTION

1. Field of the Invention

The present invention generally relates to equalizing amplifiers, and more particularly to an equalizing amplifier and a receiver using the same. Further, the present invention is concerned with a preamplifier suitable for such a receiver.

In optical transmission systems conforming to the CCITT recommendations, there are two types of transmissions, namely, a short-distance transmission connecting switching frames together, and a long-distance transmission connecting switching stations together. It is desired to provide an equalizing amplifier capable of shaping a waveform deformed in a transmission path of either the short-distance transmission or the long-distance transmission.

2. Description of the Prior Art

FIG. 1 is a block diagram of a structure of a conventional light receiver for optical transmission. The receiver shown in FIG. 1 is primarily made up of an equalizing amplifier and a decision circuit.

The equalizing amplifier is connected to a light receiving element 11a and a preamplifier 12, and is comprised of a limiter 13, an averaging circuit 14, and an amplifier 15. The light receiving element 11a is formed of, for example, a PIN photodiode which converts a light signal transmitted over the optical transmission line into an electric signal. The preamplifier 12 has a feedback resistor Rf with a diode connected in parallel therewith, and amplifies a fine current signal S1 from the light receiving element 11a. The limiter 13 has the function of amplifying an output signal S2 of the preamplifier 12 to a level which can be decided at a following stage. The averaging circuit 14 receives a non-inverted signal S3 and an inverted signal S4 from the limiter 13, and detects the respective average values. The amplifier 15 amplifies the output signals of the averaging circuit 14, and generates therefrom a threshold voltage S5 to be applied to the limiter 13. The averaging circuit 14 and the amplifier 15 form a DC offset compensation circuit.

The decision circuit is made up of a band-pass filter (BPF) 16, a limiter 17, and a decision (discrimination) circuit 18. The band-pass filter 16 extracts a second-harmonics component (2fo) of the inverted signal S4 which is one of the output signals of the limiter 13. The limiter 17 receives an analog signal from the filter 16, and generates therefrom a non-inverted clock signal and an inverted clock signal. The decision circuit 18 receives the non-inverted signal S3 and the inverted signal S4 from the limiter 13, and decides data using the non-inverted clock signal and the inverted clock signal from the limiter 17.

A description will now be given, with reference to FIG. 2 which is a waveform diagram, of the operation of the light receiver shown in FIG. 1. The light receiving element 11a converts the light signal into the current signal S1 (part (A) of FIG. 2) and applies it to the preamplifier 12. The preamplifier 12 amplifies the received current signal S1 by i×Rf where i is the value of the current signal S1, as shown in part (B) of FIG. 2.

The output signal S2 of the preamplifier 12 is applied to the non-inverting input terminal of the limiter 13, which outputs the non-inverted signal S3 (solid line) having an amplitude of i×Rf×G where G is a predetermined gain (equal to a maximum gain which can be decided by the decision circuit 18) and outputs its inverted version S4 (dotted line), as shown in part (C) of FIG. 2.

The averaging circuit 14 receives the non-inverted signal S3 and the inverted signal S4, detects the respective average values S3' and S4', as shown in part (d) of FIG. 2, and generates the threshold voltage S5 equal to the difference between the average value S3' and the average value S4'. The limiter 13 is controlled by the above threshold voltage S5.

As described above, the current-voltage converting rate as well as the receiving level (receiving sensitivity) of the preamplifier 12 mainly depend on the value of the feedback resistor Rf. Hence, it is necessary to determine the value of the feedback resistor Rf so that a desired receiving level can be obtained.

FIG. 3 is a circuit diagram of a circuit configuration of the preamplifier 12 equipped with the feedback resistor Rf as described above. When it is assumed that the diode D10 connected to the feedback resistor Rf is omitted from the circuit, the preamplifier operates as follows. At the time of receiving no light input signal, a base current flows in a transistor Tr2 via a resistor Rc connected to the base thereof, a diode D12 and an emitter resistor Ro coupled to the emitter thereof. The base current also flows in a diode D11 from the base of the transistor Tr1 via the feedback resistor Rf. That is, a feedback loop system is formed so that the currents always flow in both of the transistors Tr1 and Tr2. This feedback loop system functions to make the circuit operation stable and outputs a predetermined voltage to the output terminal of the preamplifier.

When a light signal is received in the above state, the current S1 flows from the light receiving element 11, and a current flows in the feedback resistor Rf and the emitter resistor Ro. Hence, the voltage of the output terminal is a divided voltage due to the feedback resistor Rf and the emitter resistor Ro. Normally, the feedback resistor Rf is designed to have a large value in order to suppress noise, and hence a small voltage is obtained at the output terminal. Thus, if the light input signal has a high level, the transistor Tr2 may be saturated (cut off), and the normal feedback operation cannot be obtained.

In order to overcome the above disadvantage, as shown in FIG. 3, the diode D10 is connected to the feedback resistor Rf in parallel in order to perform voltage clumping due to a voltage drop of 0.8 V developing across the diode D10. The voltage drop by means of the transistor Tr1 and the diode D11 is equal to 1.6 V (equal to 0.8 V+0.8 V), and the voltage across the emitter resistor Ro is always maintained at 0.8 V equal to 1.6 V–0.8 V, as shown in FIG. 3. In the above way, the transistor Tr2 can be prevented from being cut off.

The diode D10, which is connected to the feedback resistor Rf in parallel in the preamplifier 12 connected to the equalizing amplifier of the light receiver, causes a problem when the light input signal (dotted line) having a large receiving level as shown in FIG. 4 is received. This problem is such that the output level of the amplifier is clamped at 0.8 V, as shown in FIG. 4 and hence the pulse width thereof greatly deviates from a mark/space ratio of 1/2. As described before, the limiter 13 functions to amplify the signal S2 to the maximum level that can be decided by the decision circuit 18 of the following stage. When the threshold voltage S5 applied to the limiter 13 is controlled by the error (difference) shown in part (D) of FIG. 2, the threshold voltage S5 behaves, as shown in part (B) of FIG. 5, in a way different from that obtained when the light input signal at a minimum level is received (part (A) of FIG. 5). That is, the threshold voltage S5 shifts toward the lower level ("0") as shown in part (B) of FIG. 5. Hence, the light receiver is liable to be affected by noise which may be caused due to various factors as well as variations of the received signal.

SUMMARY OF THE INVENTION

It is a general object of the present invention to eliminate the above disadvantages.

A more specific object of the present invention is to provide an equalizing amplifier in which the threshold voltage can be maintained at the center value of the received signal (the output signal of the preamplifier) and hence the following decision can be made correctly.

The above objects of the present invention are achieved by an equalizing amplifier equalizing an electric signal obtained from a light signal received via an optical transmission path, the equalizing amplifier comprising:

an AGC circuit generating first and second signals from the electric signal by referring to a threshold voltage, the first and second signals being complementary signals; and offset compensation circuit generating a first difference signal based on a difference between the first and second signals, comparing the first difference signal with a first reference signal and outputting, as the threshold voltage, a resultant error signal to the AGC circuit, the threshold voltage being varied so that it is located in the center of an amplitude of the electric signal whereby an offset of the AGC circuit can be compensated for.

Another object of the present invention is to provide a receiver having the above-mentioned equalizing amplifier.

This object of the present invention is achieved by a receiver comprising:

an equalizing amplifier which equalizes an electric signal obtained from a light signal transmitted over an optical transmission path;

a timing generator which generates a clock signal from timing information contained in the electric signal; and a decision circuit which makes a decision on an output signal of the equalizing amplifier using the clock signal, the equalizing amplifier comprising:

an AGC circuit generating first and second signals from the electric signal by referring to a threshold voltage, the first and second signals being complementary signals; and offset compensation circuit generating a first difference signal based on a difference between the first and second signals, comparing the first difference signal with a first reference signal and outputting, as the threshold voltage, a resultant error signal to the AGC circuit, the threshold voltage being varied so that it is located in the center of an amplitude of the electric signal so that an offset of the AGC circuit can be compensated for.

A further object of the present invention is to provide a preamplifier comprising:

a first transistor amplifying an input signal;

a second transistor amplifying an output of the first transistor;

a clamp circuit that includes a resistance element and a third transistor connected in parallel and is provided between an emitter of the second transistor and a base of the first transistor; and a feedback circuit that is connected to the emitter of the second transistor and applies a variation in an emitter voltage of the second transistor to a base of the third transistor.

Yet another object of the present invention is to provide a preamplifier comprising:

a first transistor amplifying an input signal;

a second transistor amplifying an output of the first transistor;

a clamp circuit that includes a resistance element and a third transistor connected in parallel and is provided between an emitter of the second transistor and a base of the first transistor; and an output buffer circuit having a configuration identical to that of another output buffer circuit connected to an input terminal of a following differential amplifier and applying an output signal from the second transistor to another input terminal of the differential amplifier.

BRIEF DESCRIPTION OF THE DRAWINGS

Other objects, features and advantages of the present invention will become more apparent from the following detailed description when read in conjunction with the accompanying drawings, in which:

FIG. 7 is a waveform diagram showing the operation of the equalizing amplifier shown in FIG. 6;

FIG. 11 is a waveform diagram showing the operation of an offset compensation circuit shown in FIG. 10;

FIG. 13 is a waveform diagram showing the operation of a pulse-width compensation circuit shown in FIG. 10;

FIG. 47 is a block diagram of another configuration of the light amplifier according to the present invention;

DESCRIPTION OF THE PREFERRED EMBODIMENTS

Figure 6:
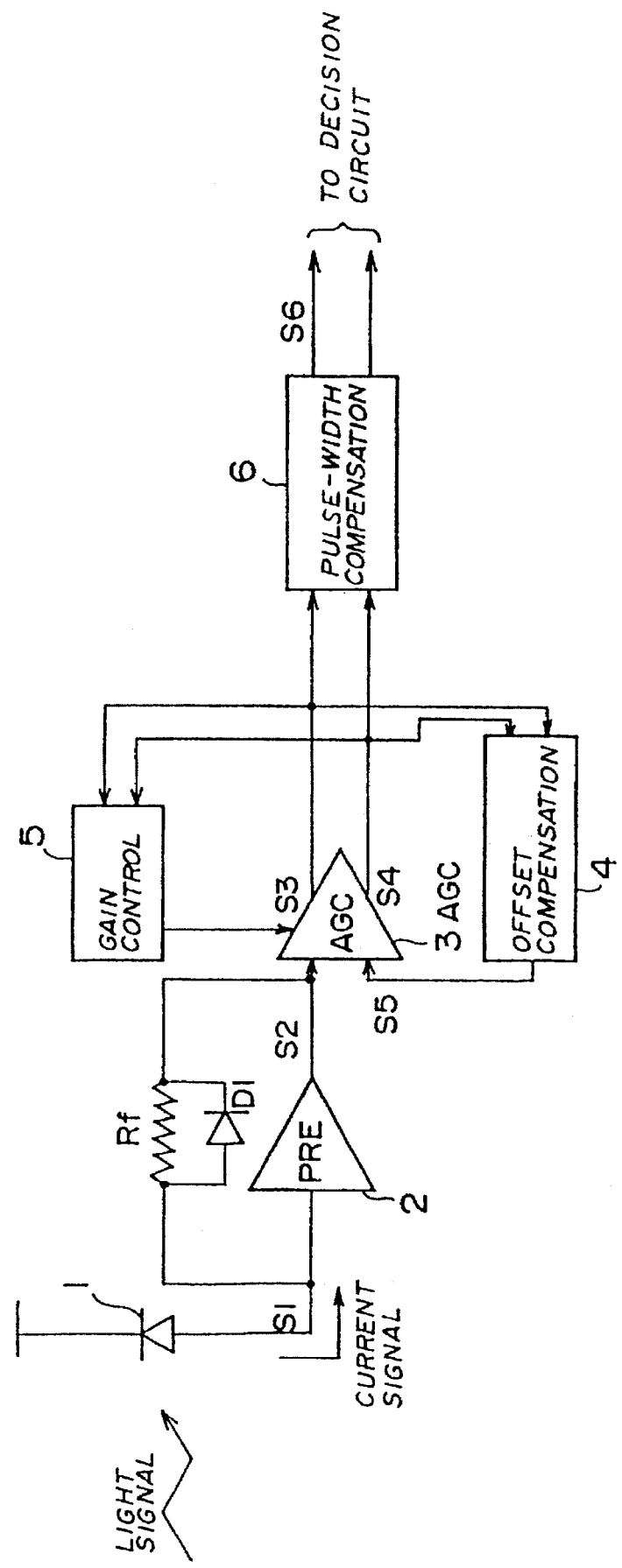
FIG. 6 is a block diagram of an equalizing amplifier according to an embodiment of the present invention.

FIG. 6 is a block diagram of a light receiver including an equalizing amplifier according to an embodiment of the present invention. A light receiving element 1 converts a light input signal into a current signal S1. A preamplifier 2 amplifies the current signal S1 and outputs an amplified signal S2. A feedback circuit, which is made up of the feedback resistor Rf and diode D1, is connected between the input and output terminals of the preamplifier 2. An AGC (Automatic Gain Control) circuit 3 generates a non-inverted signal S3 and an inverted signal S4 from the output signal S2 of the preamplifier 2. The signals S3 and S4 have a regulated constant amplitude. An offset compensation circuit 4 receives the non-inverted signal S3 and the inverted signal S4, and detects an error with respect to a reference voltage regarding one of the two signals S3 and S4. Then the circuit 4 outputs the error to the AGC circuit 3 as the reference signal S5. A gain control circuit 5 receives the non-inverted signal S3 and the inverted signal S4, and detects an error with respect to a reference voltage regarding the other one of the signals S3 and S4. Then, the circuit 5 outputs the error to the AGC circuit 3 as a gain control signal. A pulse-width compensating circuit 6 receives the non-inverted signal S3 and the inverted signal S4, and compensates for errors of the pulse widths due to the extracted fundamental wave components. The AGC circuit 3, the offset compensation circuit 4 and the gain control circuit 5 form an equalizing amplifier.

The operation of the equalizing amplifier shown in FIG. 6 will now be described with reference to a waveform diagram of FIG. 7.

The preamplifier 2 with the feedback resistor Rf and the diode D1 converts the current signal S1 derived from the light input signal by the light receiving element 1 into the voltage signal S2. The output signal S2 of the preamplifier 2 is amplified to a given amplitude by means of the AGC circuit 3. The offset compensation circuit 4 receives the non-inverted signal S3 and the inverted signal S4 from the AGC circuit 3, and detects an error with respect to the reference voltage regarding one of the received signals. The error is applied to the AGC circuit 3 as the threshold voltage S5. Hence, the threshold voltage S5 functions to set, for example, the low level of one of the non-inverted signal S3 and the inverted signal S4 to the reference voltage, and the feedback control is performed so that the threshold voltage is located at the center of the amplitude of the input signal S2.

Figure 5:
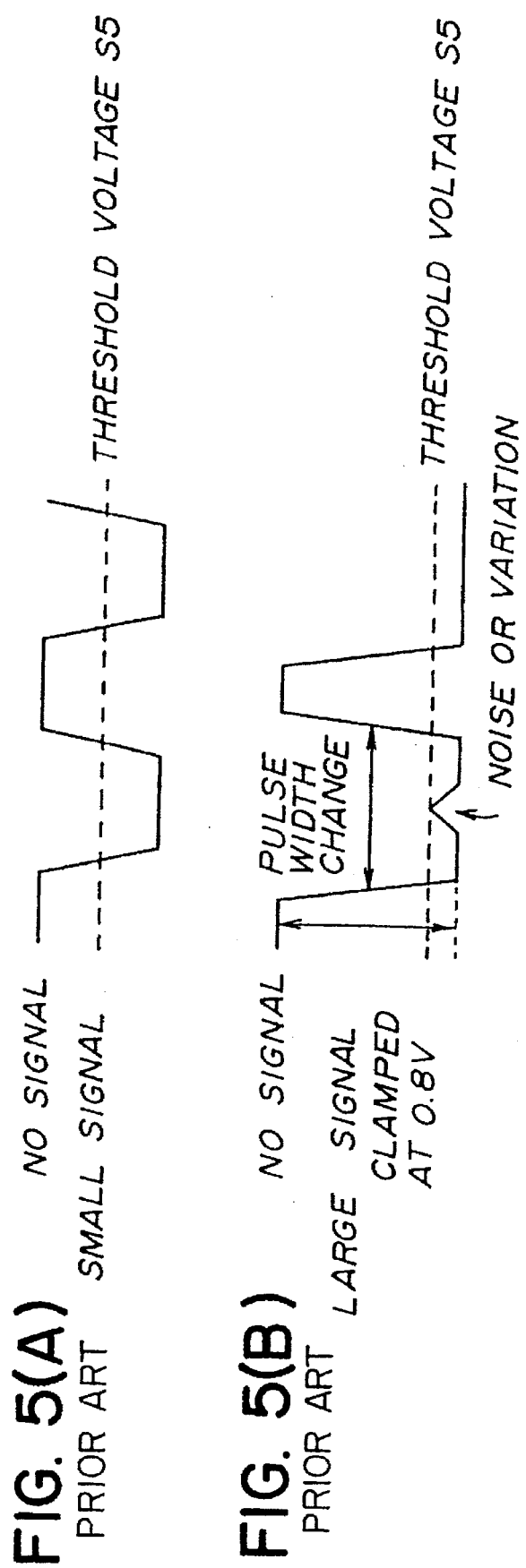
FIG. 5, which has parts (A) and (B), is a waveform diagram of a limiter shown in FIG. 1.

If the level of the light input signal changes abruptly, the waveform of the output signal S2 of the preamplifier 2 is as shown in part (B) of FIG. 7 similar to that shown in part (B) of FIG. 5, and the waveform of the output signal of the AGC circuit is as shown in part (C) of FIG. 7 in which only the waveform of the non-inverted signal S3 is illustrated. The threshold voltage S5 is controlled so that it is maintained at the center value of the amplitude and thereby the DC offset voltage can be compensated for, as indicated by the broken line shown in part (B) of FIG. 7. Hence, it becomes possible to prevent, from being affected by noise or variations in the input signal as shown in part (B) of FIG. 5, the waveform of the output signal of the AGC circuit 3, which amplifies the signal so that the threshold voltage S5 is located in the center of the amplitude.

The gain control circuit 5 detects an error with respect to the reference voltage regarding the other one of the signals S3 and S4 (not used in the offset compensation circuit 4), and outputs a control signal which controls the gain of the AGC circuit 3.

Figure 1:
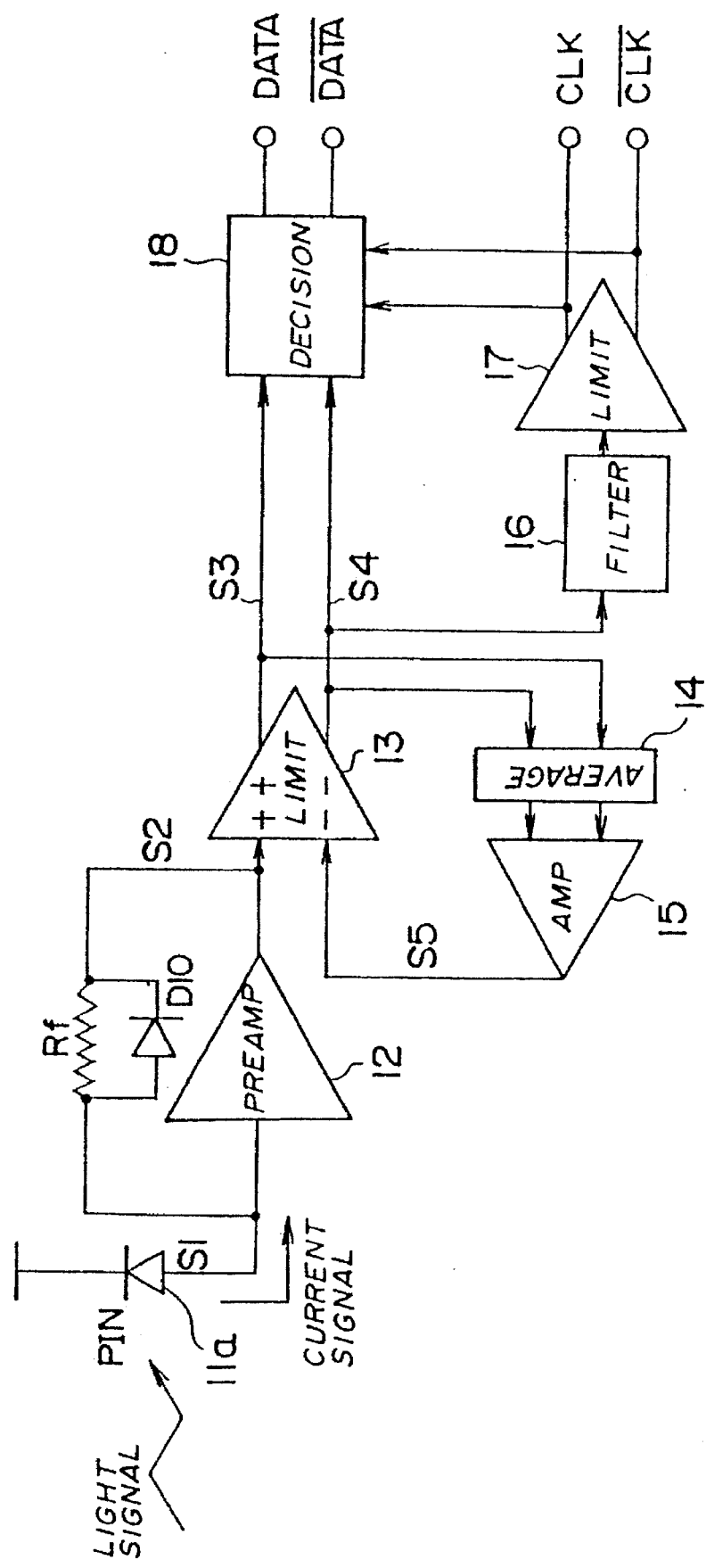
FIG. 1 is a block diagram of a conventional light receiver.
Figure 2:
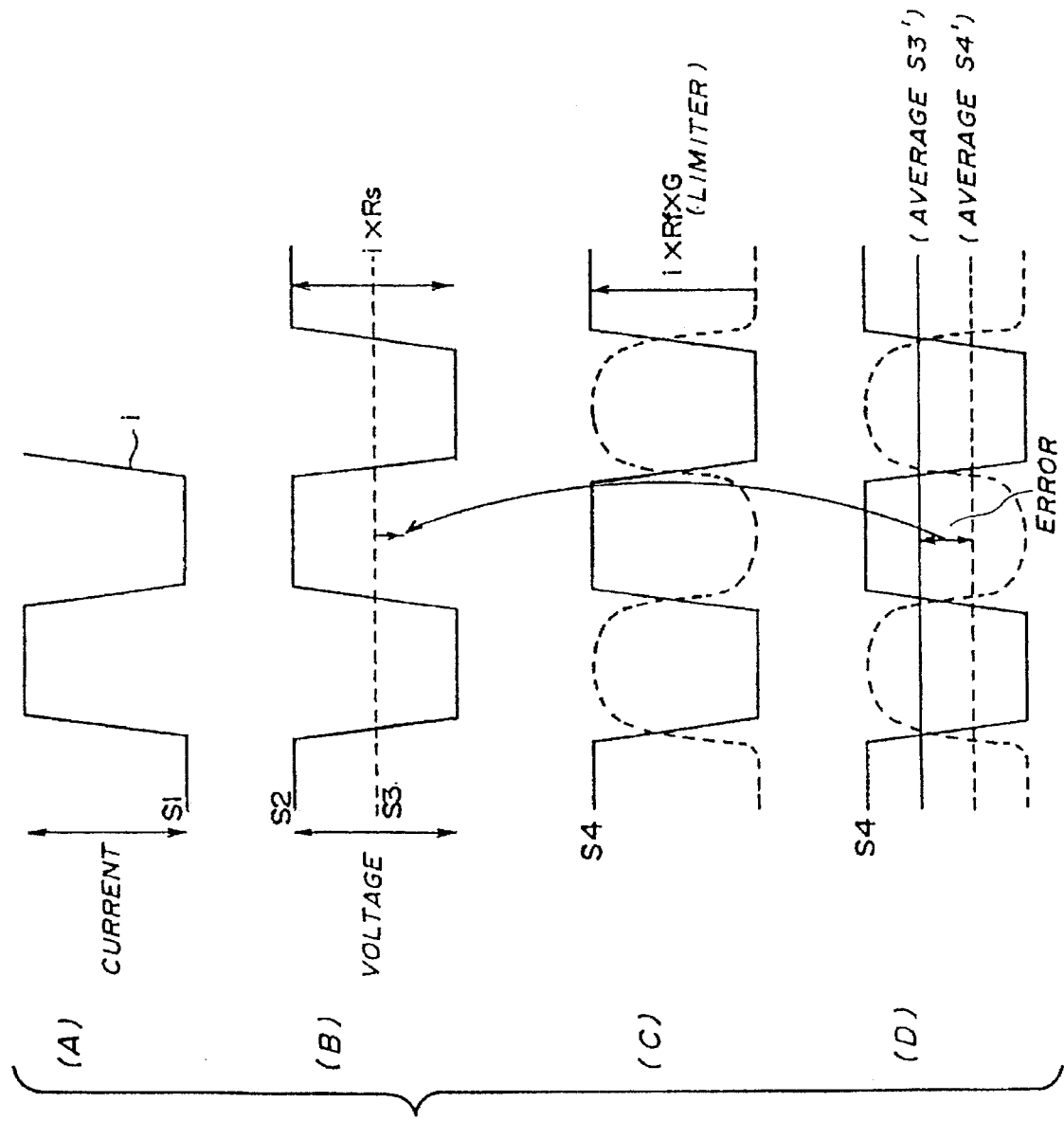
FIG. 2, which has parts (A) through (D), is a waveform diagram of the operation of the light receiver shown in FIG. 1.

The pulse-width compensation circuit 6 extracts the fundamental wave from each of the output signals of the AGC circuit 3 as shown in part (D) of FIG. 7, and regenerates a pulse-width compensated waveform S6 having a mark/space ratio of 1/2 from the extracted fundamental wave, as shown in part (E) of FIG. 7. The decision circuit of the following stage (see FIG. 1) can thus correctly make the logical decision on the signal S6.

Figure 8:
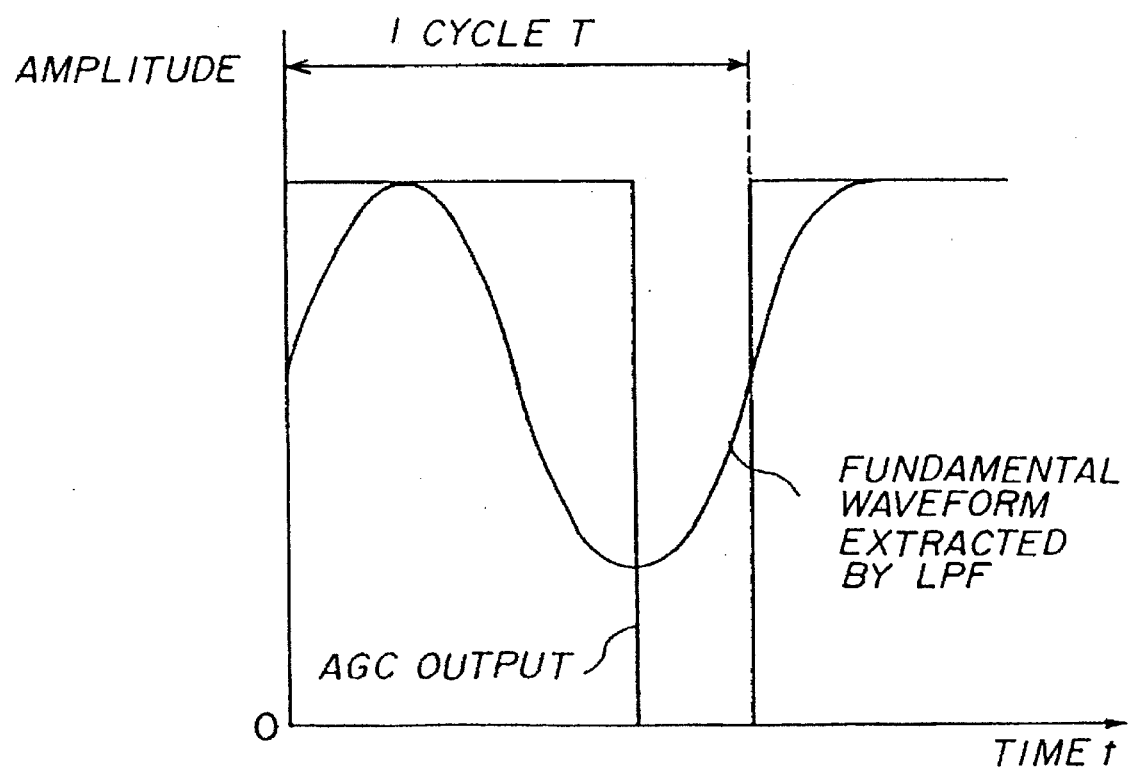
FIG. 8 is a waveform diagram showing input and output waveforms of a pulse-width compensation circuit shown in FIG. 6.

FIG. 8 is a waveform diagram showing the operation of the pulse-width compensation circuit 6. The fundamental wave is extracted from each of the output signals of the AGC circuit 3 by, for example, a low-pass filter, and correct pulses having a mark/space ratio of 1/2 can be obtained.

Figure 9:
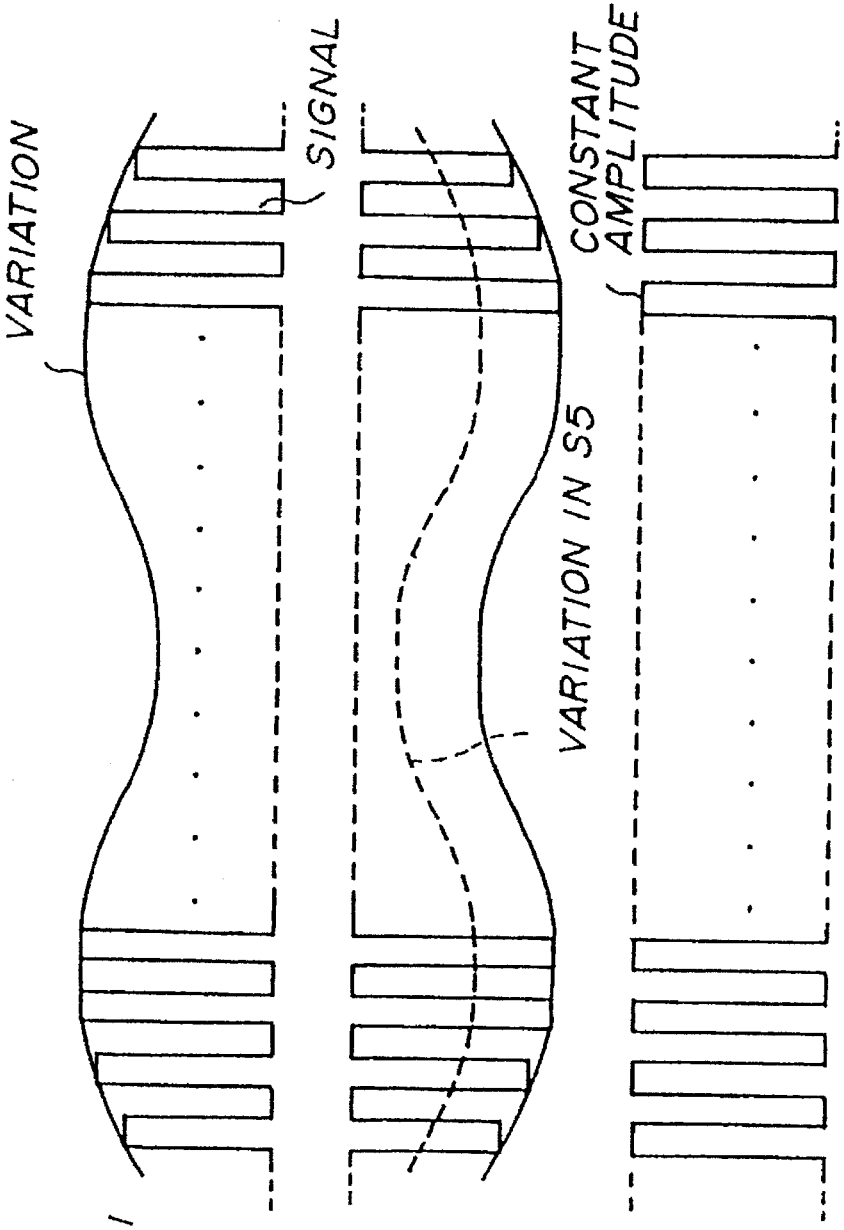
FIG. 9 is a waveform diagram showing an operation of the equalizing amplifier shown in FIG. 6 observed when the level of the input signal applied thereto changes abruptly.

FIG. 9 is a waveform diagram of signals observed when the power of the light input signal changes abruptly. In order to cope with an abrupt variation in the light input waveform S1 as shown in part (A) of FIG. 9, the response speeds of the offset compensation circuit 4 and the gain control circuit 5 are set faster than the speed of this variation. Further, the response speed of the offset compensation circuit 4 is set faster than that of the gain control circuit 5. With the above setting, the output waveform S2 of the preamplifier 2 varies in response to the light input waveform S1, as shown in part (B) of FIG. 9. In this case, even if the threshold voltage S5 changes similarly, the waveforms of the output signals S3 and S4 of the AGC circuit 3 can be controlled so that these signals always have a constant amplitude, as shown in part (C) of FIG. 9.

It will be noted that the dynamic range of the conventional preamplifier mainly depends on variation in the pulse width, while variations in the pulse width can be absorbed at the following stage and thus the preamplifier has a greater dynamic range according to the embodiment being considered.

Figure 10:
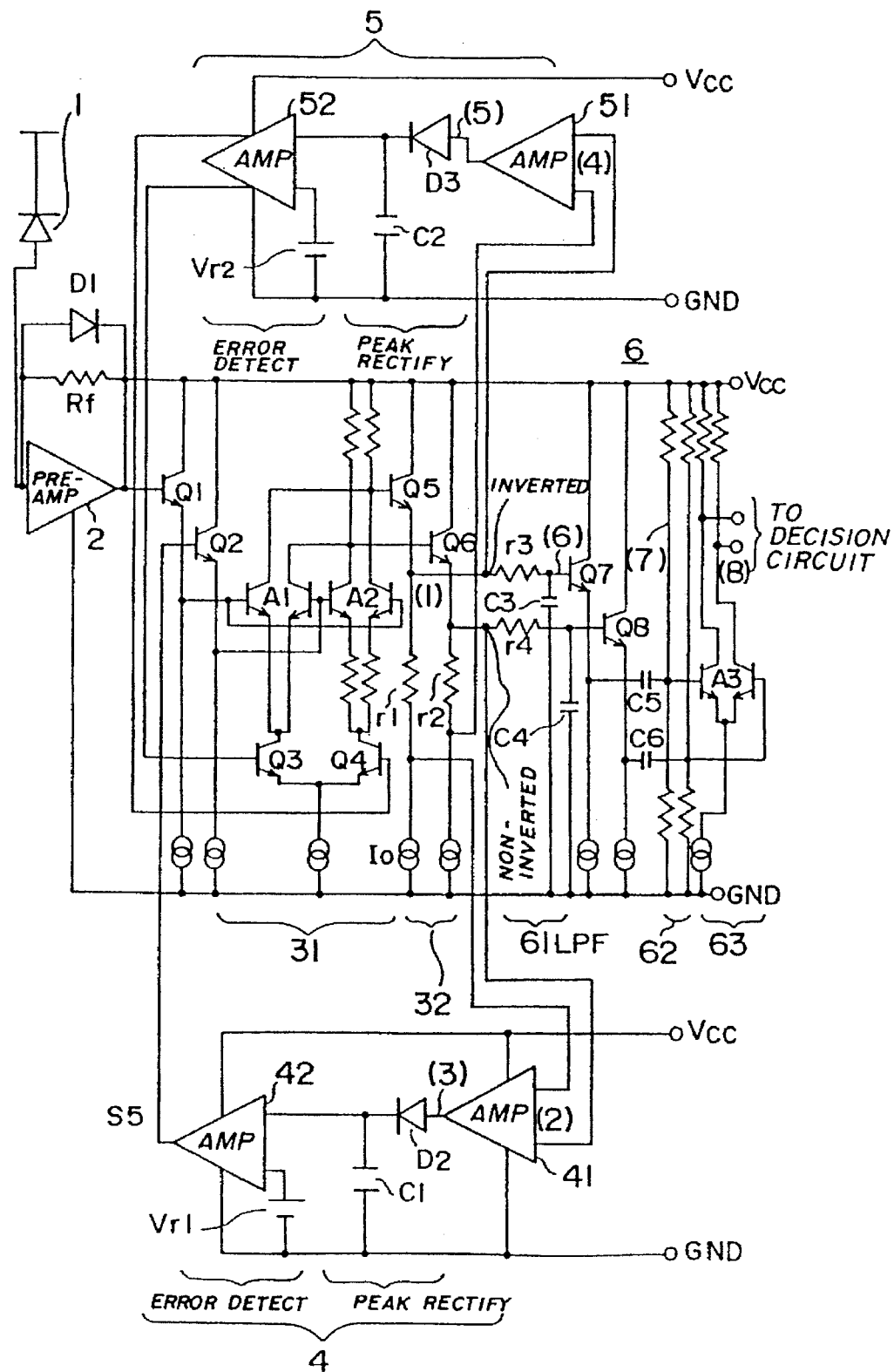
FIG. 10 is a circuit diagram of the equalizing amplifier shown in FIG. 6.

FIG. 10 is a circuit diagram of the equalizing amplifier shown in FIG. 6. The equalizing amplifier shown in FIG. 10 is made up of an AGC amplifier 31 and a level shift circuit 32. The AGC amplifier 31 is made up of transistors Q1 and Q2 functioning as buffers, a differential amplifier A1 having a certain gain, a differential amplifier A2 having a gain of zero, and transistors Q3 and Q4 in which the ratio of currents flowing in the transistors Q3 and Q4 can be changed by controlling the differential amplifiers A1 and A2. The level shift circuit 32 is made up of transistors Q5 and Q6, which are connected to the differential amplifier A1 and function as buffers, and level-shift resistors r1 and r2.

The offset compensation circuit 4 is made up of an amplifier 41, a diode D2, a capacitor C1 and an amplifier 42. The amplifier 41 receives, as input signals (2), the non-inverted signal and the inverted signal which are output from the level shift circuit 32. The diode D2 and the capacitor C1 perform a peak-rectifying operation on an output signal (3) of the amplifier 41 (one of the two output signals of the amplifier 41). The amplifier 42 compares a peak-rectified signal with a reference voltage Vr1, and applies the resultant threshold voltage S5 to the transistor Q2 of the AGC amplifier 31.

The gain control circuit 5 is made up of an amplifier 51, a diode D3, a capacitor C2 and an amplifier 52. The amplifier 51 receives, as input signals (4), the inverted signal and the level-shifted non-inverted signal from the level shift circuit 32. The diode D3 and the capacitor C2 perform a peak-rectifying operation on an output signal (5) of the amplifier 51 (one of the two output signals of the amplifier 51). The amplifier 52 compares a peak-rectified signal with a reference voltage Vr2, and applies an error signal to the transistors Q3 and Q4 of the AGC amplifier 31 in the form of a non-inverted signal and its inverted version, respectively.

The pulse-width compensation circuit 6 is made up of a low-pass filter (LPF) 61, a bias circuit 62 and a limiter 63. The low-pass filter 61 is made up of a resistor r3 and a capacitor C3, which function to allow low-frequency components of the inverted signal from the transistor Q5 to pass therethrough, as well as a resistor r4 and a capacitor C4, which function to allow low-frequency components of the non-inverted signal from the transistor Q6. Between the low-pass filter 61 and the bias circuit 62, there are provided the bias circuit 62 including resistors for dividing a power supply voltage Vcc and generating a resultant bias voltage. Transistors Q7 and Q8 functioning as buffers, and capacitors C5 and C6 used to extract dc components only. The limiter 63 has a differential amplifier A3, and amplifies the non-inverted signal and the inverted signal applied to the bases of transistor of the amplifier A3. The amplified signals are then output to a decision circuit of the following stage (not shown for the sake of simplicity).

A description will now be given, with reference to FIGS. 11, 12 and 13, of the operation of the circuit shown in FIG. 10.

First of all, the operation of the offset compensation circuit 4 will be described with reference to FIG. 11. The waveforms (1) of the signals output from the AGC amplifier 31 via the emitters of the transistors Q5 and Q6 shown in part (A) of FIG. 11 are processed in the following way based on the resistors r1 and r2 of the level shift circuit 32 and respective constant-current sources (Io). The non-inverted signal (indicated by the solid line in part (A) of FIG. 11) out of the input signals (2) of the amplifier 41 is applied to the emitter of the transistor Q6 without any modification. The inverted signal indicated by the broken line in part (A) of FIG. 11 is subjected to a level shift equal to R×Io because the inverted signal flows in the resistor r1. It will be noted that R denotes the resistance value of the resistor r1. Hence, as shown in part (B) of FIG. 11, the level shift circuit 32 outputs the non-inverted signal and the level-shifted inverted signal so that the zero levels of these signals coincide with each other.

The two signals shown in part (B) of FIG. 11 are amplified by the amplifier 41, and a difference signal (3) (indicated by the broken line * shown in part (C) of FIG. 11) is applied to the diode D2. The difference signal indicated by the broken line * is enlarged in the vicinity of the reference voltage Vr1. The solid line ** shown in part (C) of FIG. 11 also indicates a difference signal, which is not used in the offset compensating circuit 4 and is thus shown within "[ ]".

The difference signal (3) thus output by the amplifier 41 is peak-rectified by means of the diode D2 and the capacitor C1, and a peak-detection output (indicated by the solid line in part (C) of FIG. 11) of the inverted signal (indicated by the dotted line in FIG. 11) is generated. The amplifier 42 of the offset compensation circuit 4 compares the peak-detection output with the reference voltage Vr1, and then outputs, as the threshold voltage S5, the resultant error to the base of the transistor Q2 of the AGC amplifier 31.

Figure 12A:
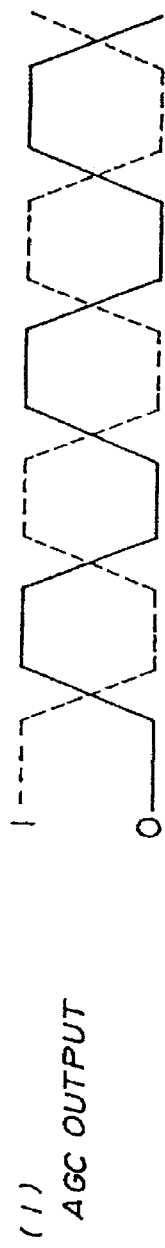
FIG. 12 is a waveform diagram showing the operation of a gain control circuit shown in FIG. 10.
Figure 12B:
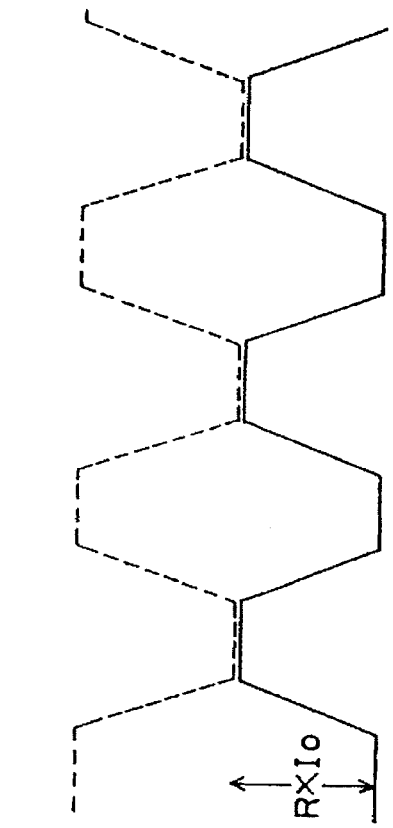
Figure 12C:
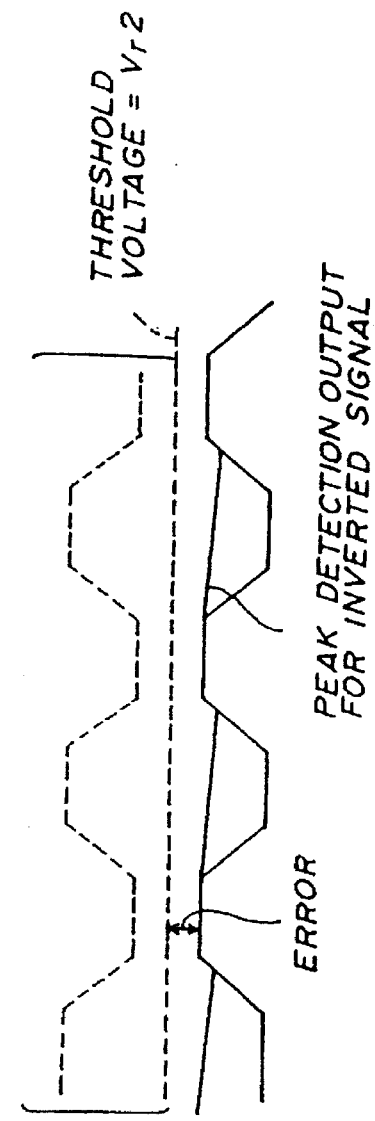

FIG. 12 is a waveform diagram showing the operation of the gain control circuit 5 shown in FIG. 10. The operation of the gain control circuit 5 is similar to that of the offset compensation circuit 4 except for the following matters. The gain control circuit 5 does not apply the inverted signal to the amplifier 51, but instead applies the signal (4) obtained by level-shifting the non-inverted signal by R×Io, as shown in parts (A) and (B) of FIG. 12. In the operation shown in FIG. 12, the gain control circuit 5 is controlled so that the "1" levels of the level-shifted non-inverted signal and the inverted signal coincide with each other.

Hence, the difference signal (5) of the amplifier 51 in the gain control circuit 5 is peak-rectified and is compared with the reference voltage Vr2 in the amplifier 52. Resultant error voltage signals are applied to the transistors Q3 and Q4 of the AGC amplifier 31 in the form of the non-inverted signal and its inverted version, respectively. The ratio of the currents flowing in the transistors Q3 and Q4 is changed by the error signal from the amplifier 52 and the threshold voltage S5 from the amplifier 42. Hence, the amplifier A1 having a certain gain and the amplifier A2 having no substantive gain are suitably selected so that an optimal gain can be obtained.

FIG. 13 is a waveform diagram showing the operation of the pulse-width compensation circuit 6 shown in FIG. 10. Referring to part (A) of FIG. 13, it will now be assumed that the non-inverted signal and the inverted signal from the level shift circuit 32 are received at a high level, and the clamped signal waveforms obtained by the diode D1 of the preamplifier 2 are deformed. The low-pass filter 61 receiving the AGC output waveforms functions to round data waveforms, as shown in part (B) of FIG. 13. The rounded analog signals output by the low-pass filter 61 are applied to the transistors Q7 and Q8 and the capacitors C5 and C6 (capacitive coupling), which eliminate the dc components. The signals passing through the capacitors C5 and C6 are applied to the bias circuit 62, which performs the biasing operation and thus outputs sine-wave signals (7) having an equal average value, as shown in part (C) of FIG. 13. The signal (7) thus obtained is made to pass through the limiter 63, which generates a normal pulse signal (8) having a mark/space ratio of 1/2, as shown in part (D) of FIG. 13.

Figure 14:
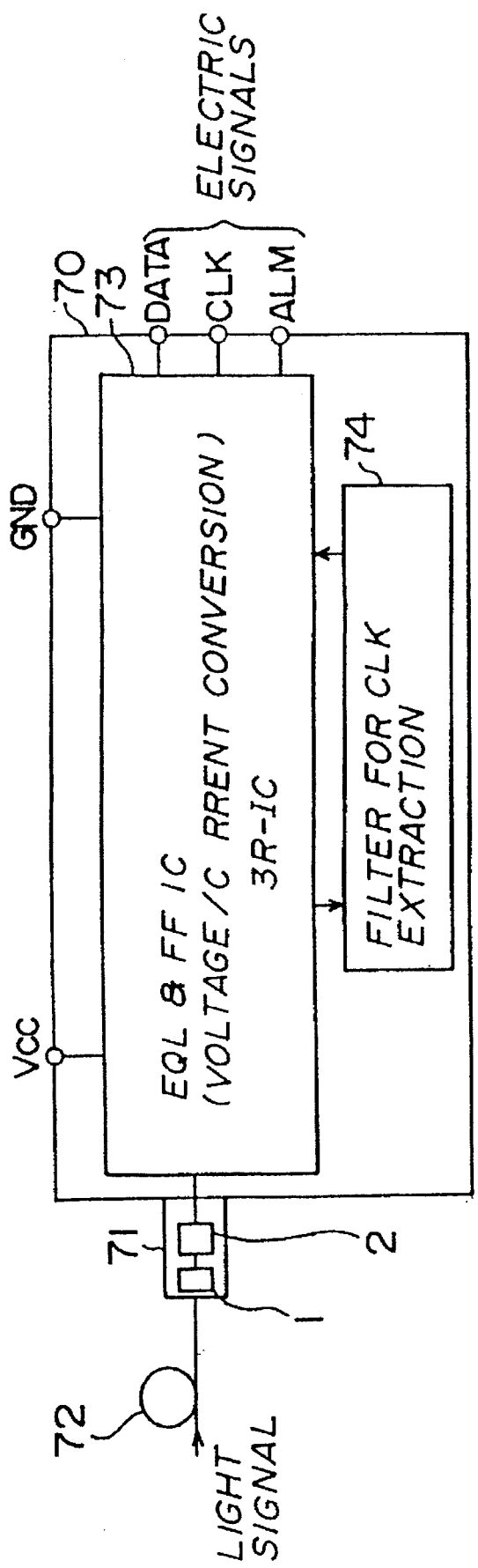
FIG. 14 is a block diagram of the structure of a module on which the equalizing amplifier shown in FIG. 10 is mounted.

FIG. 14 shows how to mount the embodiment of the present invention shown in FIG. 10. In FIG. 14, parts that are the same as those shown in the previously described figures are given the same reference numbers as previously. A module 70 has a base on which there are provided an equalizing amplifier (EQL)/decision (FF) IC 73 (hereinafter simply referred to as a 3R-IC 73), and a narrow band-pass filter element 74 for extracting a clock signal (CLK). The band-pass filter element 74 is externally provided with respect to the 3R-IC 73. The 3R-IC 73 and the band-pass filter element 74 implement so-called 3R functions (Reshaping, Regeneration and Retiming). The light receiving element 1 and the preamplifier 2 accommodated in the same package are provided at the front stage of the module 70. The light receiving element 1 is connected to an optical fiber cable 72, and receives the light signal transmitted over the cable 72. The light receiving element 1 and the preamplifier 2 may be mounted on the base on which the module 70 is mounted, and may be integrally formed together with the 3R-IC 73 and the band-pass filter element 74, so that a module including these parts can be formed.

The module 70 has a power supply terminal Vcc, a ground terminal GND, a data terminal DATA, a clock signal terminal CLK, and an alarm terminal ALM, these terminals being connected to respective associated circuits or devices. The band-pass filter element 74 can be formed with, for example, a surface acoustic wave device (SAW device) or a microchip filter (MCF).

Figure 15:
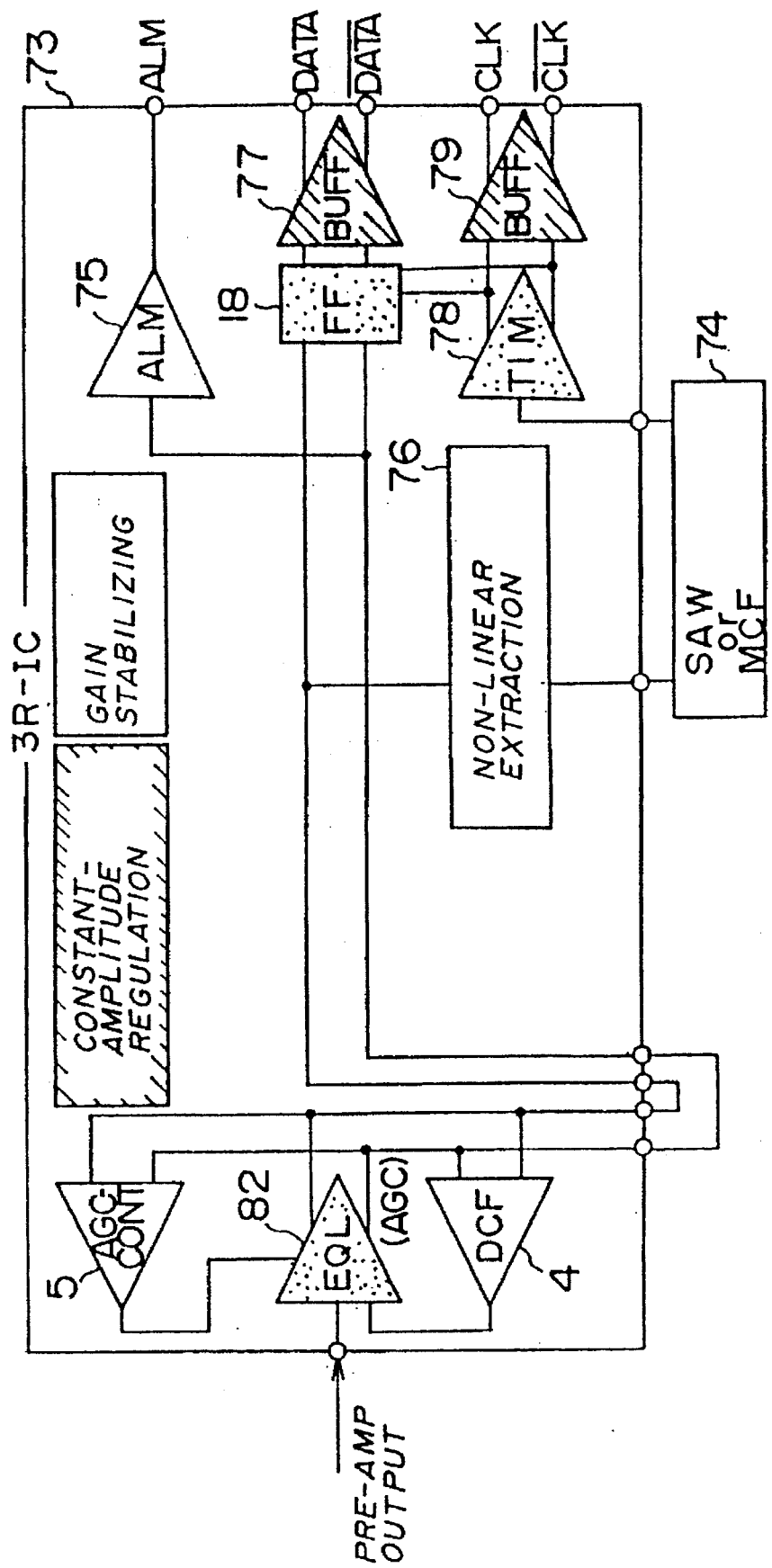
FIG. 15 is a block diagram of an inner structure of an IC (3R-IC) including an equalizing amplifier/decision circuit shown in FIG. 14.

FIG. 15 is a diagram of the inner structure of the 3R-IC 73. In FIG. 15, parts that are the same as those shown in the previously described figures are given the same reference numbers as previously. The light input signal transmitted over the optical fiber cable 1 is converted into the corresponding electric signal by the light receiving element 1. The resultant current signal is converted, by the preamplifier 2, into the voltage signal having a level which can be decided by the decision circuit 18. This voltage signal is applied to an equalizer (EQL) 82. The equalizer 82 corresponds to the AGC amplifier 3 and the pulse-width compensation circuit 6 shown in FIG. 6, and is made up of the AGC amplifier 31, the level shift circuit 32, the low-pass filter 61, the bias circuit 62 and the limiter 63 shown in FIG. 10. In FIG. 10, for the sake of convenience, the offset compensation circuit (DCF) 4 and the gain control circuit (AGC-CONT) 5 are illustrated so that these circuits receive the output signals of the equalizer 82. However, in actuality, these circuits are provided as shown in FIGS. 6 and 10.

A non-linear circuit 76 detects the rise edge and fall edge of the output waveform of the equalizer 82, and generates a signal including a component having a rate equal to twice the transmission bit rate. The above signal is applied to the band-pass filter element 74 having a narrow bandwidth. The band-pass filter element 74 extracts only the component having the rate equal to the twice the transmission rate. A timing generator (TIM) 78 produces complementary clock signals CLK and/CLK ("/" corresponds to "-" (bar) shown in FIG. 15) from the above component. These clock signals are applied to the decision circuit 18 and a buffer 79. The decision circuit 18 includes flip-flops (FF), and decides the output signals of the equalizer 82 in synchronism with the clock signals from the timing generator 78. Complementary data signals DATA and /DATA are thus reproduced by the decision circuit 18 and are output to the outside of the module 70 (a logic circuit of the next stage, for example) via a buffer 77. The clock signals CLK and /CLK generated by the timing generator 78 can be output to the outside of the module 70 via a buffer 79. The alarm circuit 75 monitors the output signals of the equalizer 82, and generates an alarm signal ALM if a predetermined abnormal state is detected. For example, the alarm signal ALM is output to the outside of the module 70 if the signals having a level exceeding a predetermined level are output from the equalizer 82.

In FIG. 15, hatched blocks, that is, the buffers 77 and 79 are preferably equipped with a constant-amplitude regulating circuit. Also, blocks with dots, namely the equalizer 82, the decision circuit 18 and the timing generator 78 are preferably equipped with a constant-gain regulating circuit.

It is possible to select an arbitrary value of the power supply voltage applied to the module shown in FIG. 9. When the circuit configuration shown in FIG. 5 is employed, it is possible to employ a power supply voltage equal to 5 V, which is widely employed. If a power supply voltage value lower than 5 V, for example, 3 V or a value close to it is used, it is preferable that a circuit configuration which will be described below be used instead of the circuit configuration shown in FIG. 10.

First of all, a circuit configuration of the preamplifier operable with a low power supply voltage lower than 5 V will be described.

Figure 3:
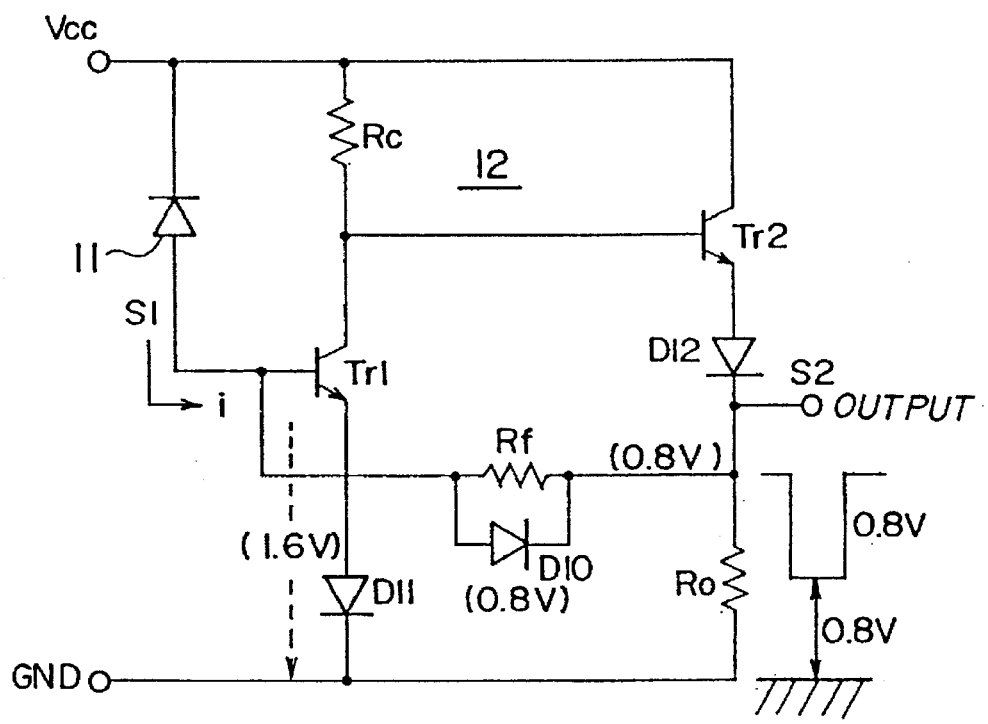
FIG. 3 is a circuit diagram of a preamplifier shown in FIG. 1.
Figure 4:
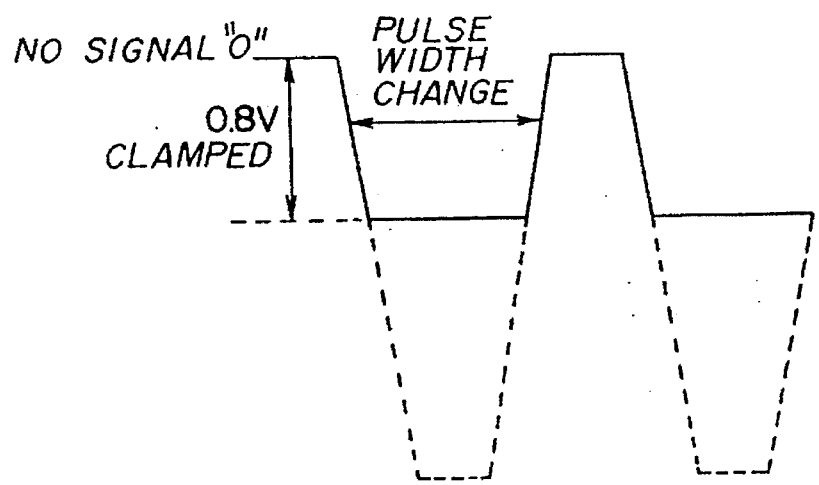
FIG. 4 is a waveform diagram showing an operation of the preamplifier observed when a light input signal having a large amplitude is received.

If the preamplifier 2 has the circuit shown in FIG. 3, it needs a power supply voltage of at least 3.2 V in a case where the forward voltage drop of the diode D11, the base-emitter voltage of the transistor Tr1 and the base-corrector voltages of the transistors Tr1 and Tr2 are respectively equal to 0.8 V. Hence, a low power supply voltage of, for example, 3 V is insufficient to operate the preamplifier 2.

Figure 16:
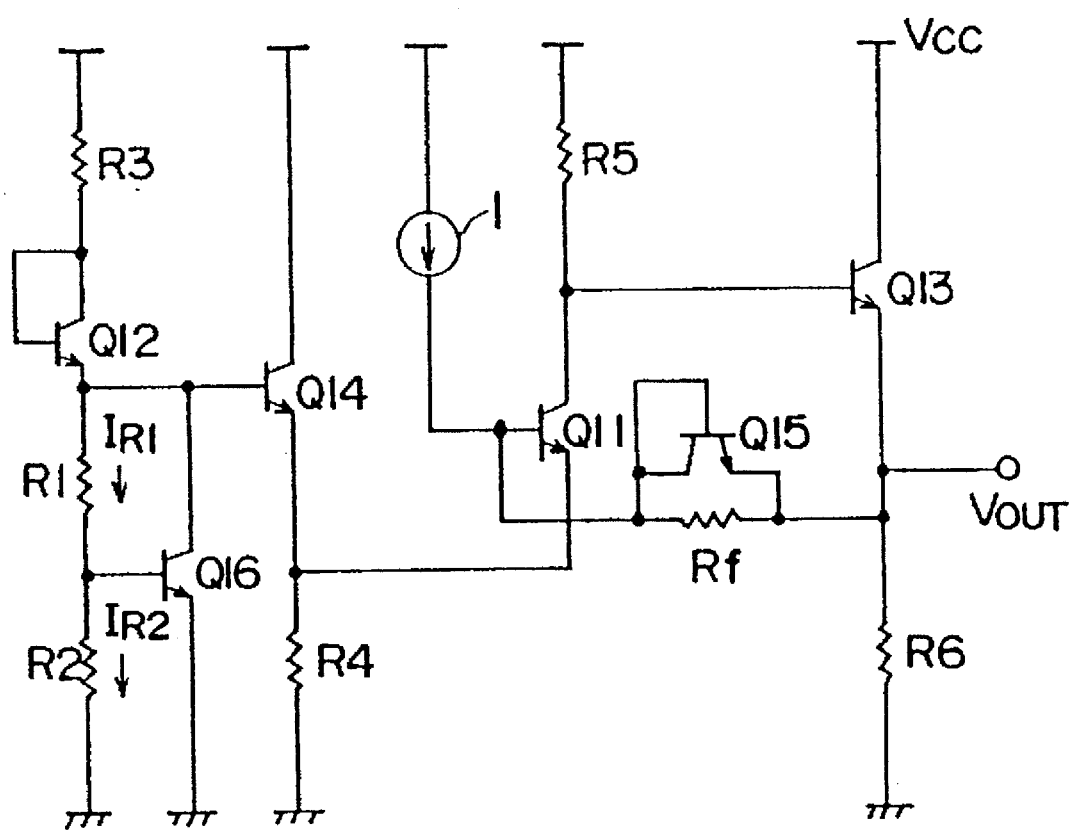
FIG. 16 is a circuit diagram of a preamplifier shown in FIGS. 6, 10 and 14.

FIG. 16 is a circuit diagram of a preferred configuration of the preamplifier 2 capable of operating with a low power supply voltage. The circuit shown in FIG. 16 does not have the diodes D11 and D12 shown in FIG. 3, and the emitter voltage of a transistor corresponding to the transistor Tr1 shown in FIG. 3 is not fixed but is variable. The circuit shown in FIG. 16 includes transistors Q11–Q16, resistors R1–R6 and a constant-current source.

The base-emitter voltage $V_{BEQ16}$ of the transistor Q16 is written as follows:

$$R2 \times I_{R2} = V_{BEQ16} \qquad (1)$$

where $I_{R2}$ denotes a current flowing in the resistor R2.

The collector voltage $V_{CQ16}$ of the transistor Q16 is expressed as follows:

$$V_{CQ16} = R1 \times I_{R1} + R2 \times I_{R2} \qquad (2)$$

where $I_{R1}$ denotes a current flowing in the resistor R1. Assuming that $I_{R1} = I_{R2}$, equation (3) can be obtained:

$$V_{CQ16} = (R1+R2)I_{R2} \qquad (3)$$

By referring to equation (1), equation (3) can be rewritten as:

$$V_{CQ16} = V_{BEQ16}(R1+R2)/R2 \qquad (4)$$

Since $V_{CQ16} = V_{BQ14}$, the following can be obtained:

$$V_{EQ14} = V_{CQ16} = V_{BQ14} - V_{BEQ14} = V_{BEQ16} \times (R1+R2)/R2 - V_{BEQ14} \qquad (5)$$

Since $V_{BE} = V_{BEQ16} = V_{BEQ14}$ and $V_{EQ14} = V_{EQ11}$, equation (5) can be rearranged as follows:

$$V_{EQ11} = V_{EQ14} = V_{BE}\{(R1+R2)/R2 - 1\} \qquad (6)$$

Hence, the emitter voltage $V_{EQ11}$ of the transistor Q11 can be arbitrarily determined on the basis of the ratio of the resistor R1 to the resistor R2 with respect to the base-emitter voltage $V_{BE}$ of the transistor.

If a large current flows from the light receiving element 1, the emitter voltage of the transistor Q13 becomes equal to the ground level due to the voltage drop developing across the feedback resistor Rf. Hence, no current flows in the transistor Q13 and a normal operation cannot be performed. In order to avoid this problem, a diode Q15 (formed by diode-connected transistor Q15) is connected to the feedback resistor Rf in parallel. The diode Q15 functions to perform a clamping operation when the voltage drop developing across the feedback resistor Rf is equal to 0.8 V ($=V_{BEQ15}$). Hence, an improved dynamic range can be obtained.

Further, the preamplifier 2 shown in FIG. 16 is taken into consideration the following.

The base voltage $V_{BQ11}$ of the transistor Q11 is higher than its emitter voltage $V_{EQ11}$ by the base-emitter voltage $V_{BEQ11}$, and is thus written as follows:

$$V_{BQ11} = V_{EQ11} + V_{BEQ11} \qquad (7)$$

The emitter voltage VEQ13 of the transistor Q13 is lower than the base voltage $V_{BQ11}$ of the transistor Q11 by the base-emitter voltage $V_{BEQ15}$ of the diode Q15 (clamp voltage) in the clamped state, as shown by equation (8) below:

$$V_{EQ13} = V_{BQ11} - V_{BEQ15} \qquad (8)$$

Taking into account the equations (7) and (8), the emitter voltage $V_{EQ13}$ can be written as follows:

$$V_{EQ13} = V_{EQ11} + V_{BEQ11} - V_{BEQ15} \qquad (9)$$

The voltage $V_{EQ11}$ need to have an appropriate value equal to or lower than 0.8 V, and the clamping voltage need to have an appropriate value lower than 0.8 V in order to improve the dynamic range.

Figure 17:
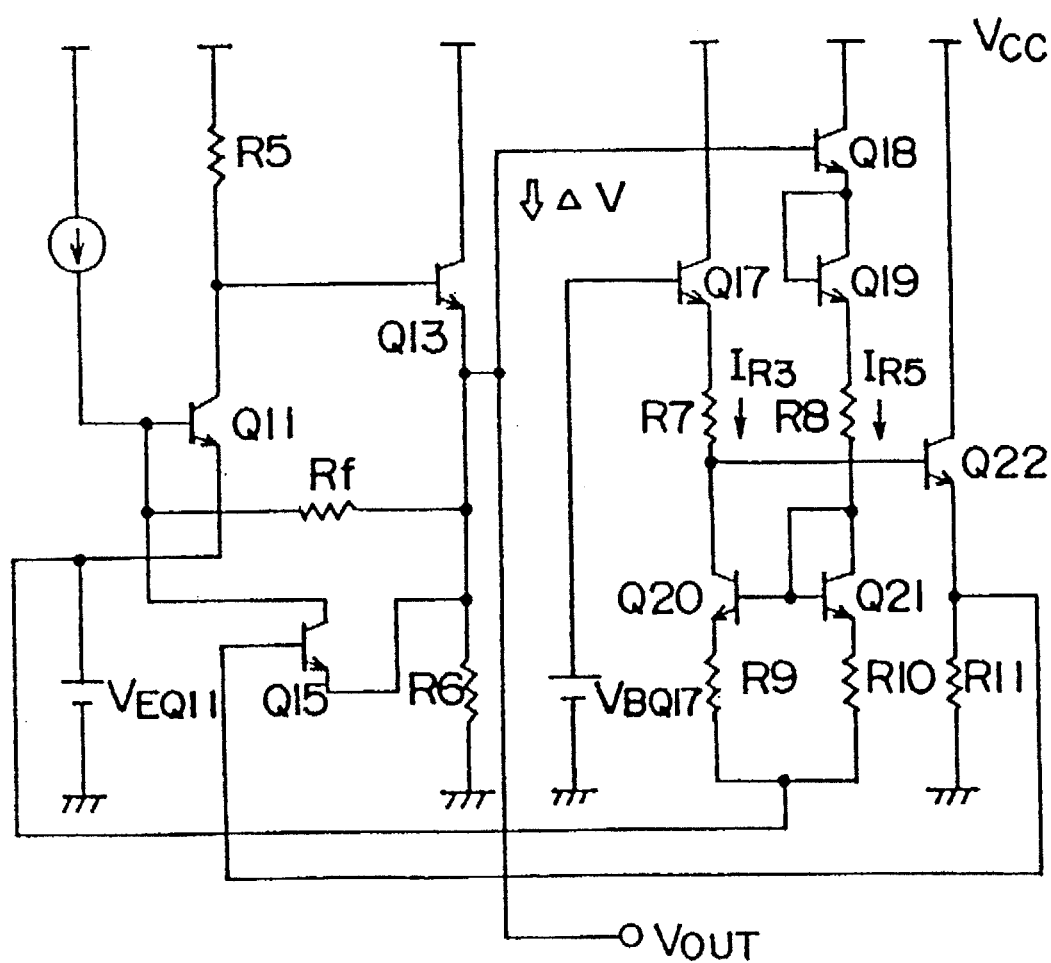
FIG. 17 is a circuit diagram of another configuration of the preamplifier shown in FIGS. 6, 10 and 14.
Figure 18A:
FIG. 18 is a waveform diagram showing the operation of the preamplifier shown in FIG. 17.
Figure 18B:
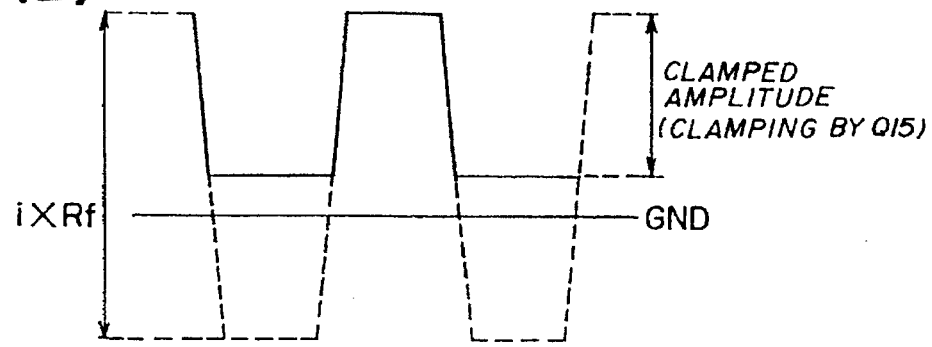
Figure 18C:
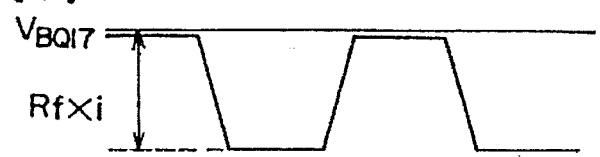
Figure 18D:
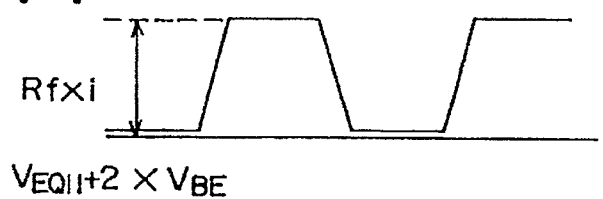
Figure 18E:
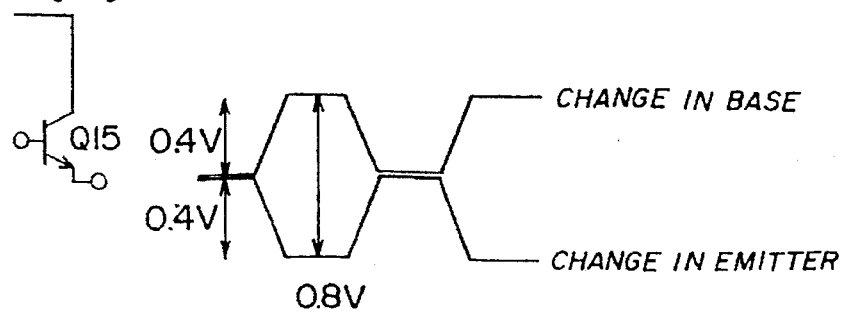

With the above in mind, the transistor Q15 performing the clamping operation is connected as shown in FIG. 17, in which the base voltage $V_{BQ15}$ of the transistor Q15 is controlled so that an arbitrary clamping voltage can be determined.

It will now be assumed that a variation $\Delta V$ in the base voltage $V_{BQ18}$ of the transistor Q18 is caused by the voltage drop developing across the feedback resistor Rf by the current flowing in the light receiving element Rf. The actual base voltage $V_{BQ18}'$ obtained at that time can be expressed as follows:

$$V_{BQ18}' = V_{BQ18} - \Delta V \qquad (10)$$

Further, the following equations (11) and (12) can be obtained:

$$V_{R5} = (V_{BQ18}' - V_{EQ11} - 3V_{BE})/(R8+R10) \qquad (11)$$

$$V_{BQ22} = V_{BQ17} - V_{BE} - I_{R3} \cdot R7 \qquad (12)$$

where $I_{R3}$ and $I_{R5}$ respectively denote the currents flowing in the resistors R7 and R8, and $V_{BE}$ denotes the base-emitter voltages of the transistors Q17, Q18, Q19, Q20, Q21 and Q22. Due to the function of a current-mirror circuit formed by the transistors Q20 and Q21, $I_{R3} = I_{R5}$, and hence equation (12) is changed as follows:

$$V_{BQ22} = V_{BQ17} - V_{BE} - I_{R3} = V_{BQ17} - V_{BE} - (V_{BQ18}' - V_{EQ11} - 3V_{BE})/(R8+R9)R7 \qquad (13)$$

where R9=R10. When the resistance values are determined so that R9+R8=R7, equation (13) can be rewritten as follows:

$$V_{BQ22} = V_{EQ17} - V_{BE} - (V_{BQ18}' - V_{EQ11} - 3V_{BE}) = 2V_{BE} - V_{EQ17} - V_{BQ18}' + V_{EQ11} \qquad (14)$$

The base voltage of the transistor Q15 is controlled by the emitter-follower of the transistor Q22, and is expressed as follows:

$$V_{BQ15} = V_{BE} + V_{EQ11} + (V_{BQ17} - V_{BQ18}) + \Delta V \qquad (16)$$

The voltages regarding the transistor Q15 that are obtained in the dc bias state have the following relationship:

$$V_{CQ15} = V_{BQ15} = V_{EQ15} = V_{EQ11} + V_{BE} \qquad (17)$$

where $V_{BQ17} = V_{BQ18}$.

The following equation shows the relationship among the voltages regarding the transistor Q15 that are obtained in a state in which there is a voltage variation $\Delta V$:

$$V_{CQ15} = V_{EQ11} + V_{BE} \qquad (18)$$

where $V_{BQ17} = V_{BQ18}$.

Referring to equation (16), the following equations can be obtained:

$$V_{BQ15} = V_{EQ11} + V_{BE} + \Delta V \qquad (19)$$

$$V_{EQ15} = V_{EQ11} + V_{BE} - \Delta V \qquad (20)$$

The base-emitter voltage $V_{BEQ15}$ of the transistor Q15 in the above state is written as follows by using the equations (19) and (20):

$$V_{BEQ15}=V_{BE15}-V_{EQ15}=2\Delta V \tag{21}$$

In equation (21), the transistor Q15 can operate with $V_{BEQ15}$ equal to 0.8 V, and the clamping operation is performed when $\Delta V=0.4$ V. The variation $\Delta V$ can be arbitrarily selected due to the voltage difference between $V_{BQ17}$ and $V_{BQ18}$.

FIG. 18 is a waveform diagram showing the operation of the preamplifier shown in FIG. 17. As shown in part (B) of FIG. 18, the emitter voltage of the transistor Q13 is changed in response to the output current from the light receiving element 1 shown in part (A) of FIG. 18. The transistor Q15 clamps the voltage developing across the feedback resistor Rf at 0.8 V. The emitter potential of the transistor Q13 obtained at this time exceeds the ground potential. When the signal shown in part (B) of FIG. 18 is input to the transistor Q18, the output waveform thereof is as shown in part (c) of FIG. 18. Due to a variation in the output waveform, the current flowing in the transistors Q18, Q19 and Q21 is decreased. This change appears in the current-mirror circuit Q20, and the base potential of the transistor Q22 is increased as shown in part (D) of FIG. 18.

The above change is input to the base of the transistor Q15 via the emitter-follower transistor Q22. Hence, the base potential of the transistor Q15 becomes equal to $V_{EQ11}+V_{BE}+\Delta V$. Hence, the change of the emitter potential of the transistor Q15 becomes identical to that of the base potential thereof. For example, if the emitter potential of the transistor Q15 is decreased by 0.4 V, the base potential thereof is simultaneously increased by 0.4 V, as shown in part (E) of FIG. 18. Hence, it becomes possible to reduce the change of the emitter potential to 0.8 V or lower.

Figure 19:
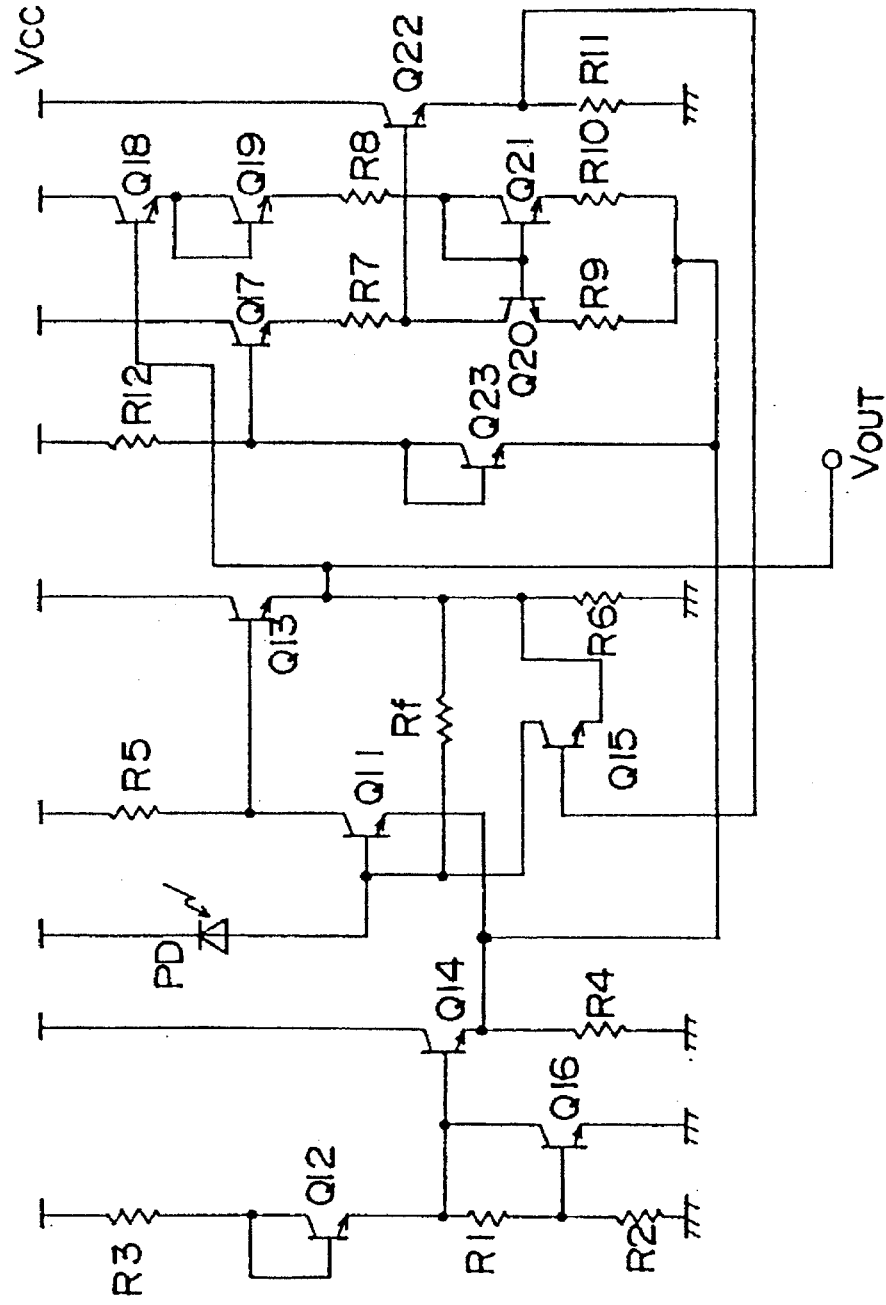
FIG. 19 is a circuit diagram of yet another configuration of the preamplifier shown in FIGS. 6, 10 and 14.

FIG. 19 shows a circuit configuration in which the dc bias sources $V_{EQ11}$ and $V_{BQ17}$ shown in FIG. 17 are formed by transistor circuits. The dc bias source $V_{EQ11}$ is formed by a circuit including the transistors Q14 and Q16 shown in FIG. 16. The dc bias source $V_{BQ17}$ is formed by a transistor Q23 and a resistor R12. In the circuit shown in FIG. 19, the following relationships must be met in order to obtain (1) a dc voltage $V_{EQ11}$ of 0.4 V and (2) a clamping voltage $\Delta V$ of 0.4 V. Regarding the above condition (1), when $V_{EQ11}=0.4$ V and $V_{BE11}=0.8$ V in the aforementioned equation (6), then $$0.4=0.8\{(R1+R2)/R2-1\}R2=2\times R1 R1:R2=1:2 \tag{22}$$

Hence, when equation (20) is met, the above condition (1) is satisfied. The above condition (2) is met whet $V_{BQ17}$ is equal to $V_{BQ18}$.

Figure 20:
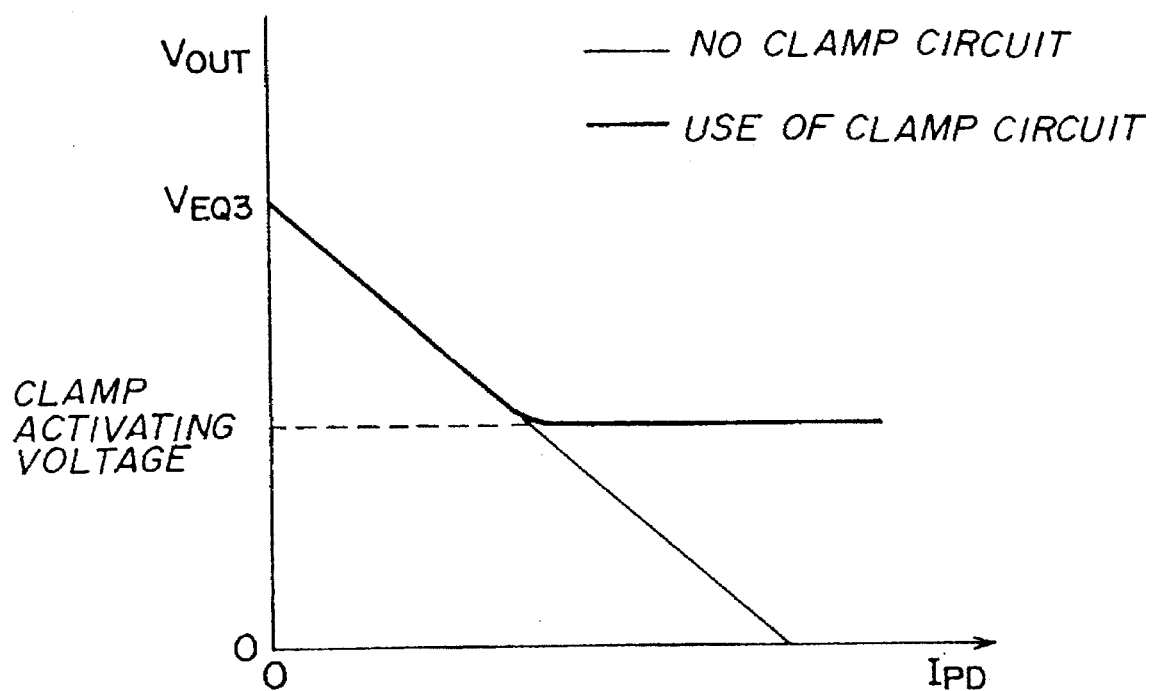
FIG. 20 is a graph of the characteristic of the preamplifier shown in FIG. 19.

FIG. 20 is a graph of the relationship between the current $I_{PD}$ flowing in the light receiving element 1 and the output voltage $V_{OUT}$ of the preamplifier 2 used in the circuit configuration shown in FIG. 19. Before the output voltage $V_{OUT}$ becomes equal to the clamping voltage, a linear characteristic resulting from the feedback resistor Rf can be obtained. At the time of the clamping operation, the transistor Q15 is operated, and a diode characteristic can be obtained between the base and emitter of the transistor Q15. It can be seen from the graph of FIG. 20 that the above clamping operation provides an improved dynamic range.

A description will now be given of a circuit configuration of the AGC circuit 3 suitably designed to operate under a power supply voltage of, for example, 3 V.

Figure 21:
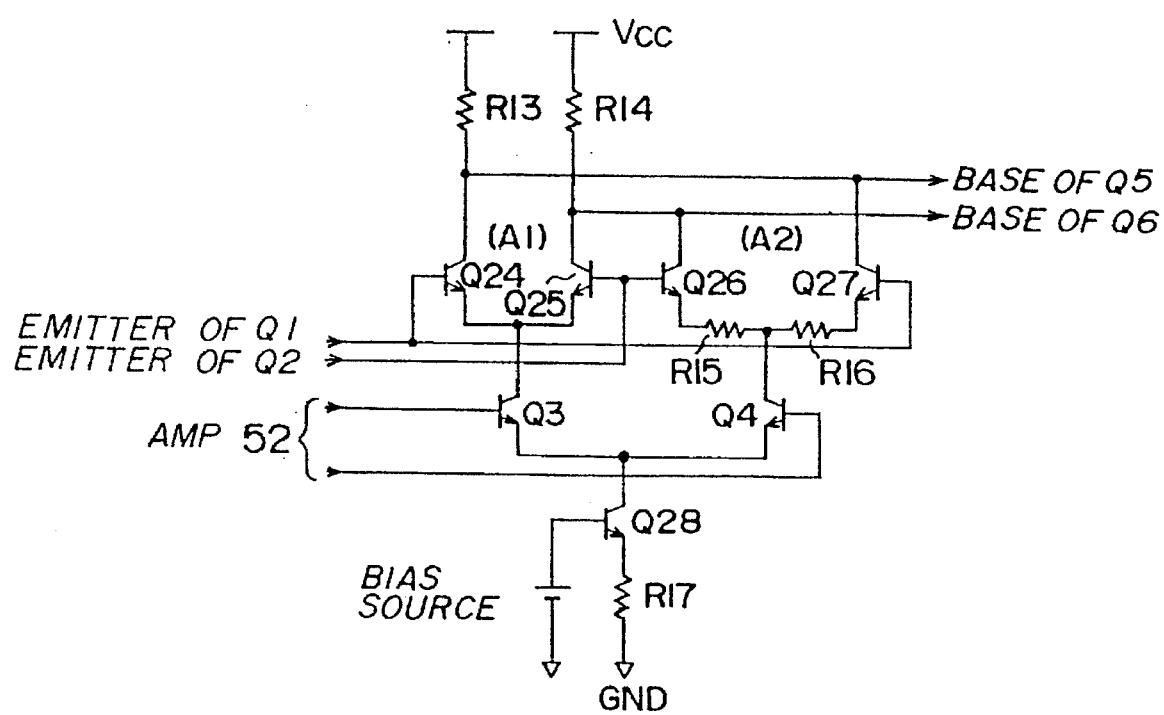
FIG. 21 is a circuit diagram of an AGC circuit shown in FIGS. 6, 10 and 14.

FIG. 21 is a circuit diagram of the AGC amplifier 31 shown in FIG. 10. The differential amplifier A1 includes transistors Q24 and Q25, and the differential amplifier A2 includes transistors Q26 and Q27. The collectors of the transistors Q24 and Q25 are connected to the power supply line Vcc via resistors R13 and R14, respectively. The resistors R13 and R14 have an identical resistance value. The emitters of the transistors Q26 and Q27 are connected to the collector of the transistor Q4 via resistors R15 and R16, respectively. The resistors R15 and R16 have an identical resistance value. The constant-current source connected to the transistors Q3 and Q4 shown in FIG. 10 includes a transistor Q28 and a resistor R17.

As shown in FIG. 21, three transistors are connected between the ground and the power supply Vcc via the resistors R13 and R14. Hence, the circuit does not operate when the power supply voltage Vcc is equal to 3 V in the case where the base-emitter voltages of the above transistors are 0.8 V.

Figure 22:
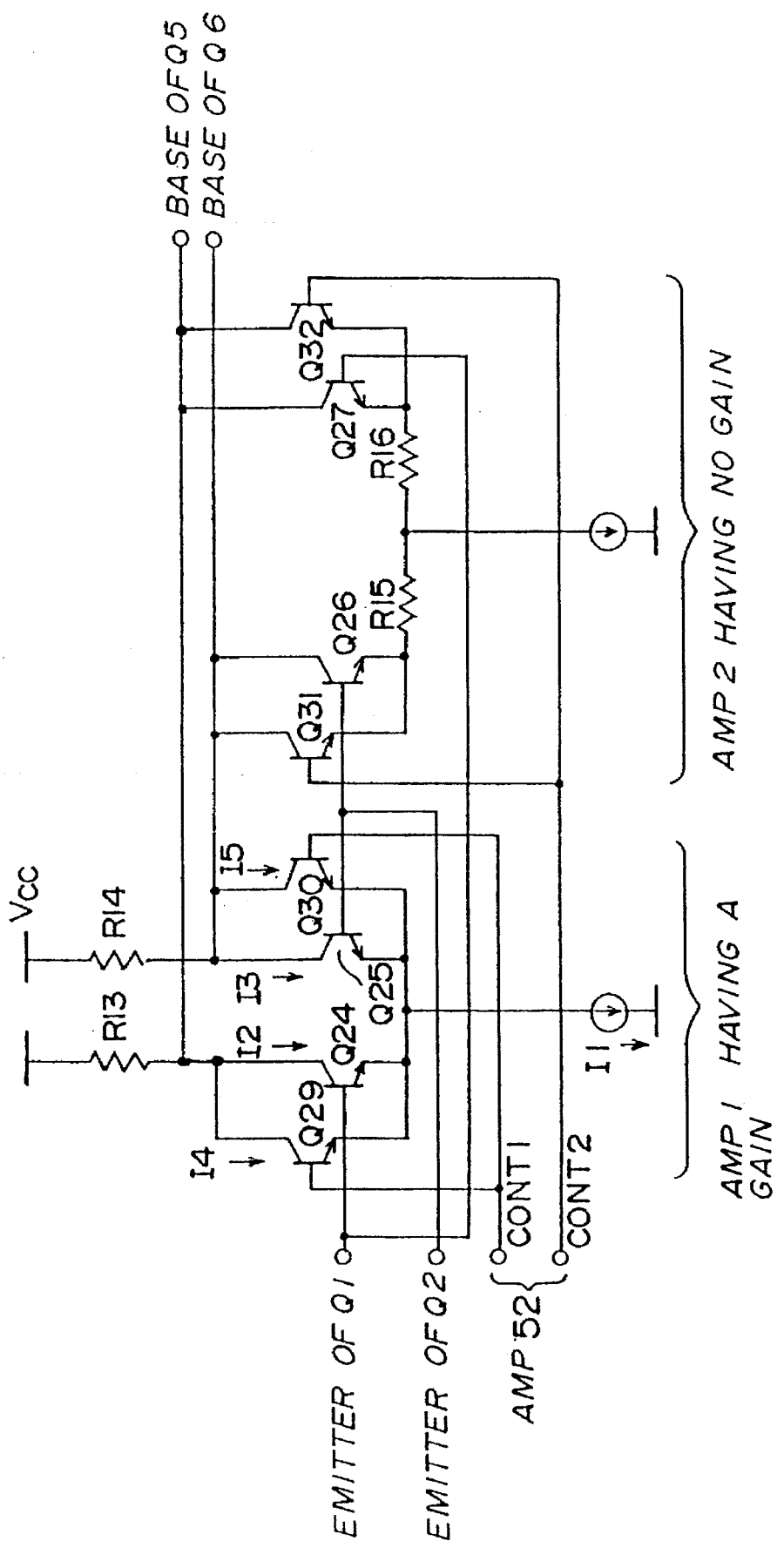
FIG. 22 is a circuit diagram of another configuration of the AGC amplifier shown in FIGS. 6, 10 and 14.

FIG. 22 is a circuit diagram of the AGC amplifier 31 having a circuit configuration operable with a low power supply voltage Vcc of approximately 3 V. In FIG. 22, parts that are the same as those shown in the previously described figures are given the same reference numbers as previously. Transistors Q29 and Q30 are provided in parallel with an amplifier AMP1 which has a gain and includes the transistors Q24 and Q25. Similarly, transistors Q31 and Q32 are provided in parallel with an amplifier AMP2 which does not have a substantive gain and includes the transistors Q26 and Q27. The bases of the transistors Q29 and Q30 are connected to one of the output terminals of the amplifier 52 (FIG. 10), and the bases of the transistors Q31 and Q32 are connected to the other output terminal of the amplifier 52. The emitters of the transistors Q29 and Q30 are connected in common to the emitters of the transistors Q24 and Q25. Similarly, the emitters of the transistors Q31 and Q32 are connected in common to the emitters of the transistors Q26 and Q27.

Further, the collectors of the transistors Q29 and Q32 are connected to the collector resistor R13, and the collectors of the transistors Q30 and Q31 are connected to the collector resistor R14. The transistors Q29 through Q32 are controlled by the gain control circuit 5 (FIG. 10), and controls the gain of the AGC amplifier. The transistors Q29 and Q30 forming the gain control circuit have the same emitter and collector potentials as those of the transistors Q24 and Q25 for amplifying the signal amplitude. Similarly, the transistors Q31 and Q32 forming the gain control circuit have the same emitter and collector potentials as those of the transistors Q26 and Q27 for amplifying the signal amplitude. Hence, as compared with the circuit shown in FIG. 21, only two transistor stages are provided between the Vcc line and the ground. As a result, the circuit shown in FIG. 22 can be operated under the power supply voltage which is approximately 0.8 V lower than that needed to operate the circuit shown in FIG. 21. For example, the AGC amplifier shown in FIG. 22 can operate with Vcc=3 V.

As described above, the collector resistors R13 and R14 are commonly used by the differential amplifiers AMP1 and AMP2. When a difference $\Delta$ between the base potentials occurs in each of the differential amplifiers AMP1 and AMP2, the currents flowing in the transistors thereof are varied, and a difference between the outputs of each of the differential amplifiers becomes equal to $\Delta \times G$ where G is the gains of the differential amplifiers. This can be expressed as follows:

$$I2=Is\times\exp(q\times\Delta V/k\times T) \tag{23}$$

where I2 is the current flowing in the transistor Q24, Is is a reverse-saturation current of the transistor Q24, q is the charge of electron, k is the Boltzmann constant, and T is the absolute temperature.

Figure 23:
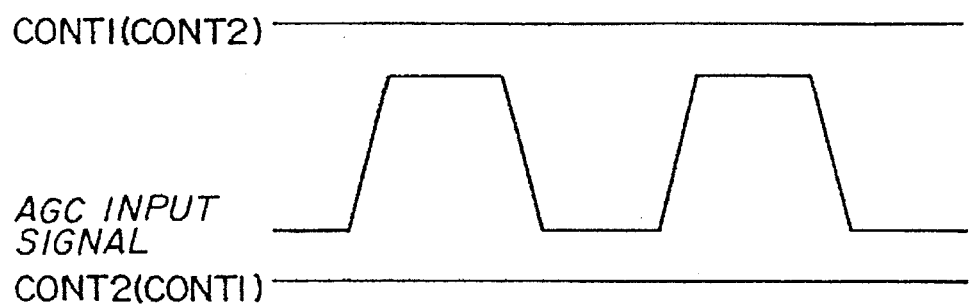
FIG. 23 is a waveform diagram showing the operation of the AGC circuit shown in FIG. 22.

It will now be assumed that a signal shown in FIG. 23 is input to the AGC amplifier shown in FIG. 22. When a control voltage CONT1 supplied from the amplifier 52 is equal to or less than the top peak of the signal amplitude and a control voltage CONT2 supplied therefrom is equal to or greater than the bottom peak thereof (or vice versa), the currents I4 and I5 shown in FIG. 22 do not flow, and the transistors Q24 and Q25 of the differential amplifier AMP1 can correctly perform the differential amplifying operation (the gain thereof is increased). At this time, if the bottom peak of the signal amplitude is equal to or greater than 4 kT/q, the currents I4 and I5 do not flow. In this case, the transistors Q31 and Q32 are ON. When the control voltage CONT1 is greater than the top peak of the signal amplitude and the control voltage CONT2 is less than the bottom peak thereof, the currents I4 and I5 flow. Then, the currents I2 and I3 shown in FIG. 22 do not flow even when the signal input is applied to the differential amplifier AMP1 (the gain thereof is decreased). In the above way, the gain of the AGC amplifier can be controlled by controlling the control voltages CONT1 and CONT2.

In the circuit configuration shown in FIG. 22, two constant-current sources are separately given to the differential amplifiers AMP1 and AMP2, respectively. Hence, currents always flow in the differential amplifiers AMP1 and AMP2, and the AGC function is active irrespective of whether the AGC amplifier is in the state in which the maximum or minimum gain is provided. In the circuit configuration shown in FIG. 21, a single constant-current source is provided in common to the two differential amplifiers. Hence, if the current flowing in the amplifier A2, more particularly, the emitter resistor R15 or R16 is increased, the minimum gain Av of the AGC amplifier is reduced as shown below:

$$Av=Rc/(R_E+r_e) \qquad (23')$$

where Rc is the resistance value of the collector resistor R13 or R14, $R_E$ is the resistance value of the emitter resistor R15 or R16, and $r_e$ is the resistance value of the inner resistor of the transistor Q26 or Q27.

Next, a description will now be given of a configuration of the offset compensation circuit 4 different from that shown in FIG. 10.

Figure 24:
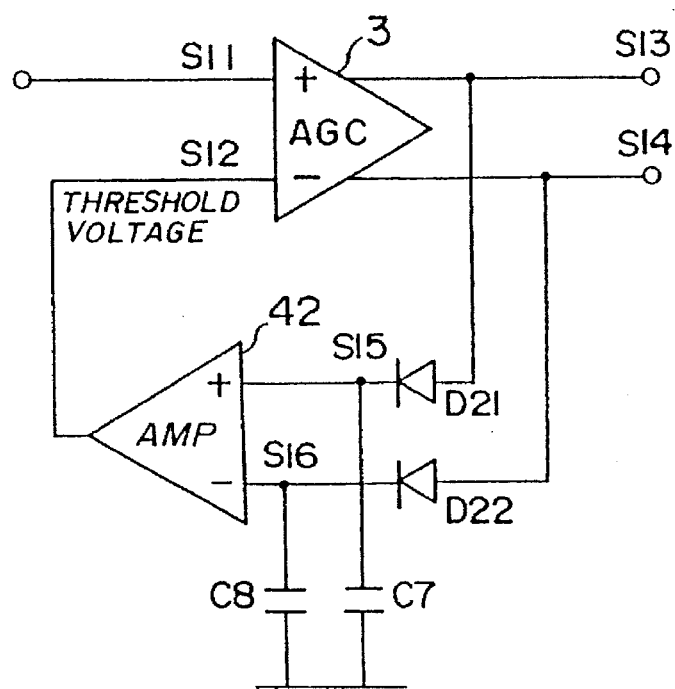
FIG. 24 is a block diagram of another configuration of the offset compensation circuit shown in FIG. 10.

FIG. 24 is a block diagram of an alternative configuration of the offset compensation circuit 4. In FIG. 24, parts that are the same as those shown in the previously described figures are given the same reference numbers as previously. The configuration shown in FIG. 24 is not intended to dealing with a low power supply voltage (that is, it can be operated by a power supply voltage of either 5 V or 3 V). However, for the sake of convenience, the configuration shown in FIG. 24 will be described here.

The offset compensation circuit shown in FIG. 24 performs the peak rectifying operation on both the non-inverted output signal and the inverted output signal of the AGC circuit 3 without any level-shifting and performs a control operation so that the difference between the high-level voltages of the two rectified signals becomes zero and hence the threshold voltage becomes equal to the center value of the input signal amplitude. The non-inverted signal of the AGC circuit 3 is applied to the non-inverting input terminal of the operational amplifier 42 via a diode D21, and the inverted signal thereof is applied to the inverting input terminal of the amplifier 42 via a diode D22. The diode D21 and a capacitor C7 perform the peak rectifying operation on the non-inverted signal, and the diode D22 and a capacitor C8 perform the peak rectifying operation on the inverted signal. The amplifier 42 provides the AGC circuit 3 with, as the threshold voltage, the difference between the two peak-rectified voltage values. In the above way, the feedback control is performed so that the difference between the two peak-rectified voltage values is zero.

Figure 25A:
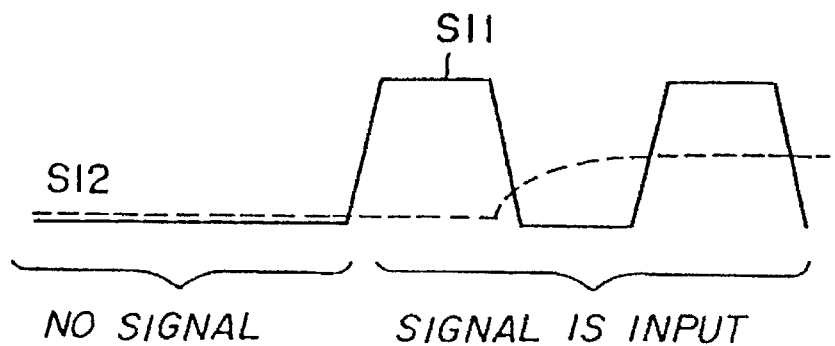
FIG. 25 is a waveform diagram showing the operation of the offset compensation circuit shown in FIG. 24.
Figure 25B:
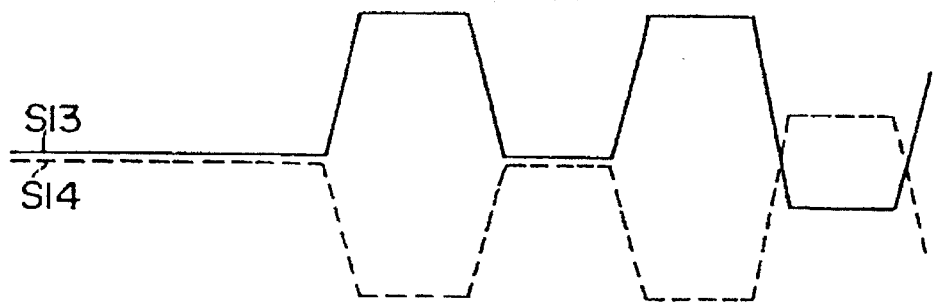
Figure 25C:
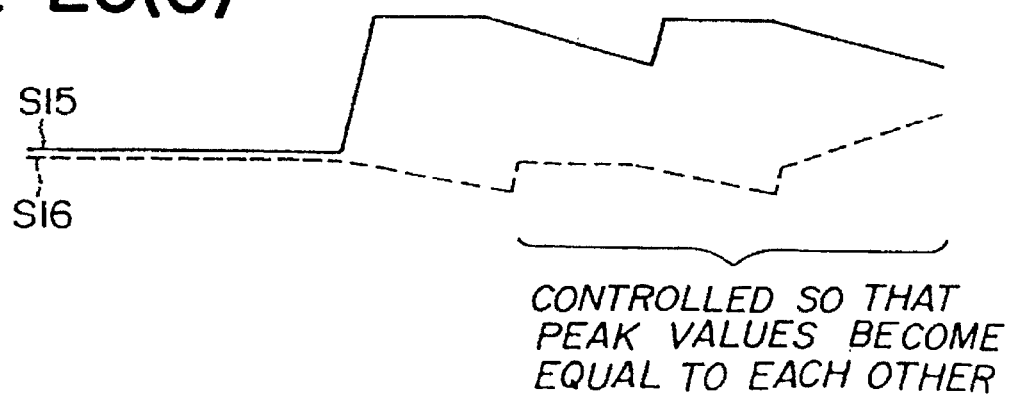

FIG. 25 is a waveform diagram showing the operation of the offset compensation circuit shown in FIG. 24. At the time of receiving no signal, the input signal S11 and the threshold voltage S12 are at the same level. When the input signal is received, the non-inverted output signal S13 of the AGC circuit 3 and the inverted output signal S14 thereof are varied as shown in part (B) of FIG. 25. The peak-rectified voltage S15 obtained by the peak rectifying operation on the non-inverted signal applied to the non-inverting input terminal of the operational amplifier 42 is varied as indicated by the solid line shown in part (C) of FIG. 25. The peak-rectified voltage S16 obtained by the peak rectifying operation on the inverted signal applied to the inverting input terminal of the operational amplifier 42 is varied as indicated by the broken line shown in part (C) of FIG. 25. The amplifier 42 feeds back, as the threshold voltage S12, the difference between the peak-rectified voltages S15 and S16 to the AGC circuit 3. Hence, the feedback control is carried out so that the peak-rectified voltages S15 and S16 coincide with each other, and the threshold voltage S12 goes toward the center of the amplitude of the input signal S11. Finally, the feedback control is settled in the state in which the threshold voltage coincides with the center value of the input signal and the voltages S13 and S14 are alternating signals such that the peak values thereof become equal to each other. In the above way, the offset of the AGC circuit 3 can be compensated for.

Figure 26:
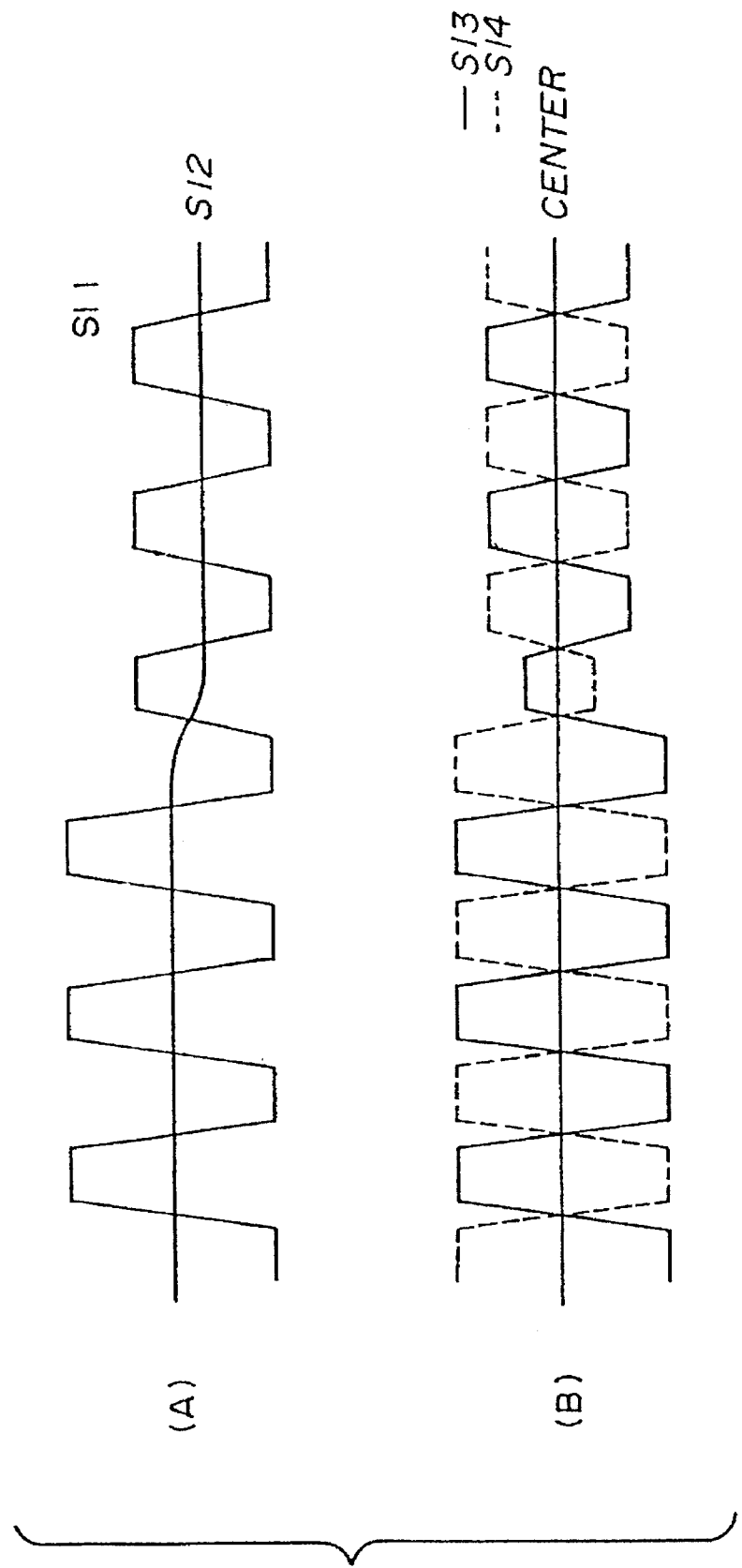
FIG. 26 is another waveform diagram showing the operation of the offset compensation circuit shown in FIG. 24.

FIG. 26 is a waveform diagram showing signal variations observed for a longer period than that shown in FIG. 25. The threshold voltage S12 is controlled so that it coincides with the center of the amplitude of the input signal S11.

A description will now be given of the structure of the decision circuit 18 shown in FIG. 15.

Figure 27:
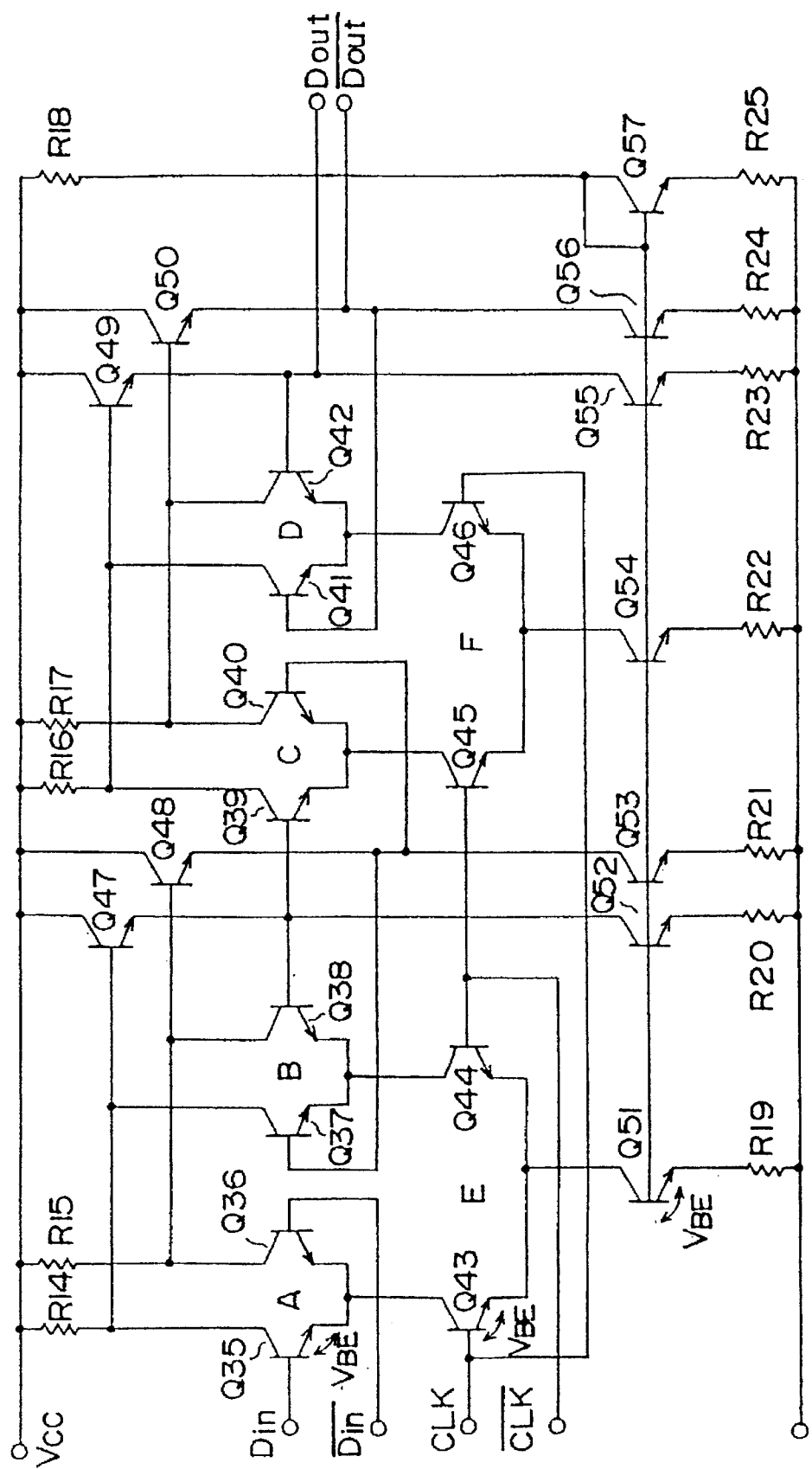
FIG. 27 is a circuit diagram of a decision circuit shown in FIG. 15.

FIG. 27 is a circuit diagram of a first structure of the decision circuit 18. This structure is suitable for a case where the power supply voltage Vcc equal to or close to 5 V is provided. The decision circuit shown in FIG. 27 includes a master/slave type flip-flop (FF). More particularly, the decision circuit 18 includes differential amplifiers A through F having transistors Q35 through Q46, differential amplifiers E and F controlling the differential amplifiers A–F, and current-source transistors Q51 and Q54 driving the differential amplifiers E and F, respectively. Further, there are provided transistors Q47 and Q48, which feed back the output signals of the differential amplifiers A and B to the differential amplifier C in the emitter-follower formation. Further, the decision circuit 18 includes current-source transistors Q52 and Q53, which drive the transistors Q47 and Q48, respectively. Further, there are provided transistors Q49 and Q50, which feed back the output signals of the differential amplifiers C and D to the differential amplifier D in the emitter-follower formation. Further, the decision circuit 18 includes transistors Q55 and Q56, which drive the transistors Q49 and Q50, respectively. Resistors R14 through R25 are connected as shown in FIG. 27. The clock signals CLK and /CLK are output by the timing generator 78 shown in FIG. 15.

Figure 28:
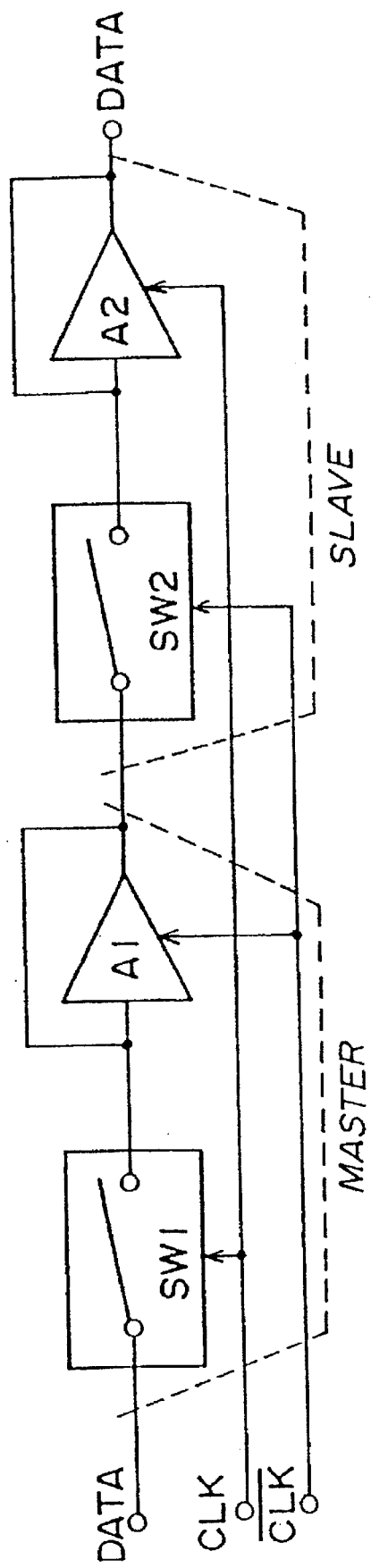
FIG. 28 is a block diagram of the decision circuit shown in FIG. 27.
Figure 38:
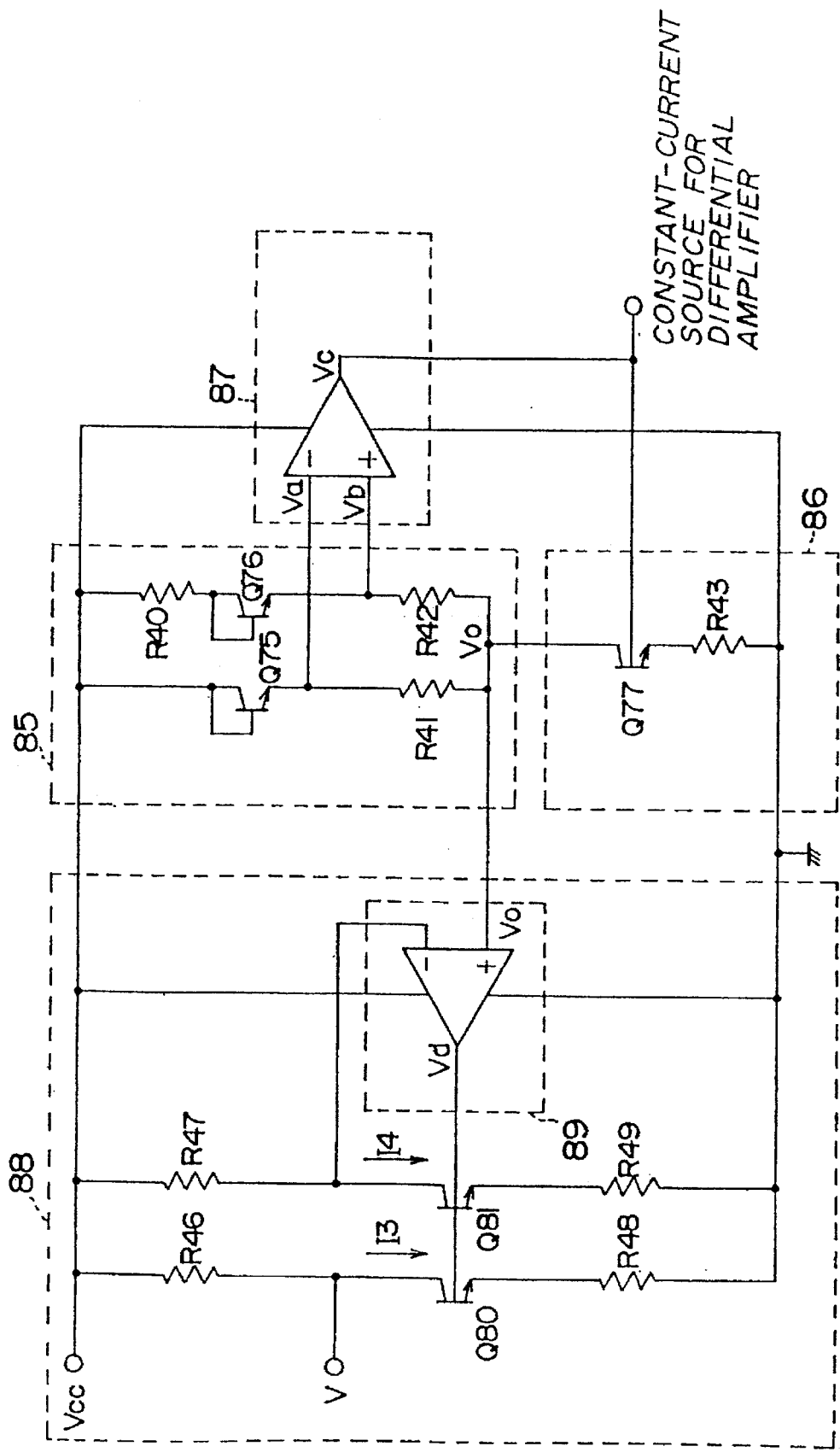
FIG. 38 is a circuit diagram of a constant-voltage source circuit utilizing the configuration shown in FIG. 37.

FIG. 28 is an equivalent circuit diagram of the configuration shown in FIG. 27. A voltage-controlled switch SW1 shown in FIG. 28 corresponds to the differential amplifier A shown in FIG. 27, and a voltage-controlled feedback amplifier A1 corresponds to the differential amplifier B and the transistor Q44. The switch SW1 and the amplifier A1 form a master part of the flip-flop. A voltage-controlled switch SW2 corresponds to the differential amplifier C and the transistor Q45 shown in FIG. 27, and a voltage-controlled feedback amplifier A2 corresponds to the differential amplifier D and the transistor Q46. The switch SW2 and the amplifier A2 form a slave part of the flip-flop. In FIG. 38, DATA corresponds to Din and /Din shown in FIG. 27.

Figure 29:
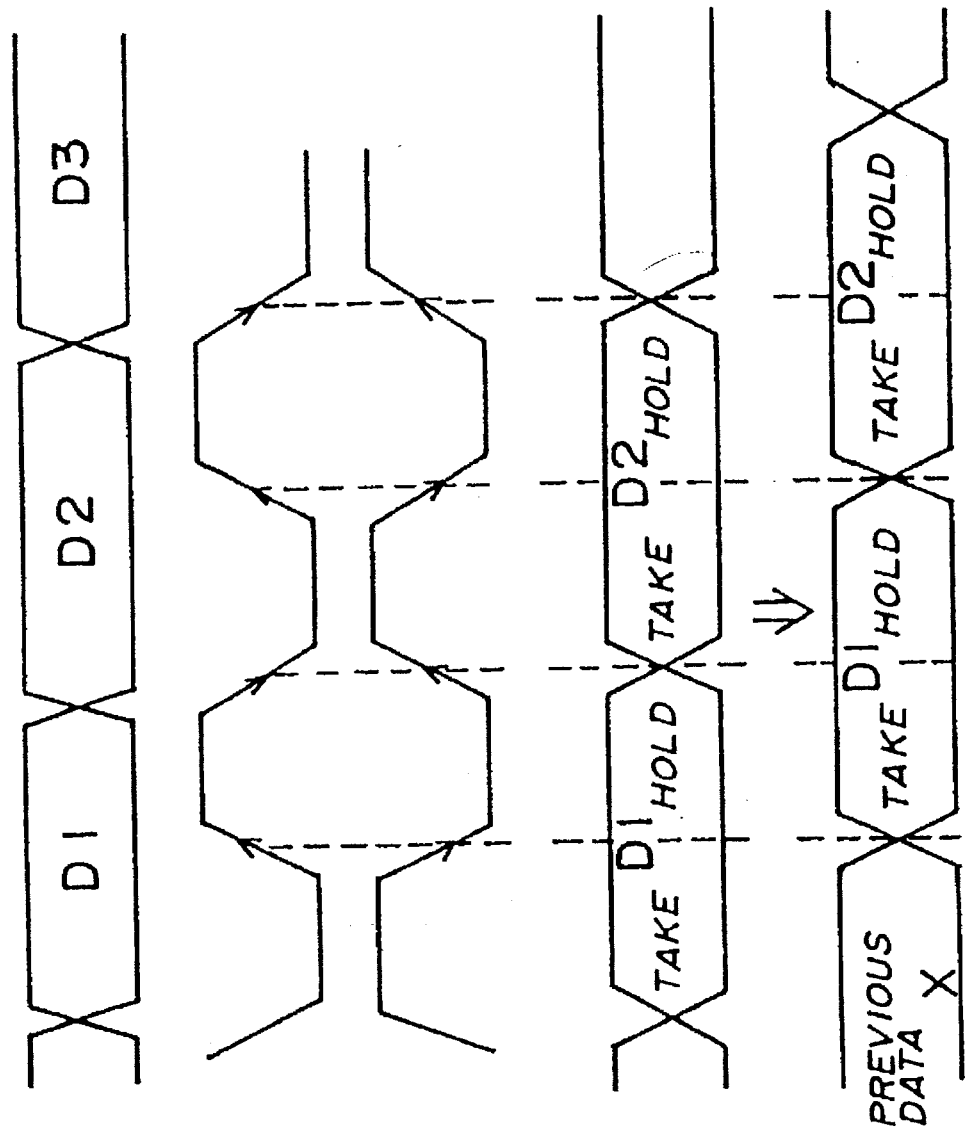
FIG. 29 is a waveform diagram showing the operation of the decision circuit shown in FIG. 28.

FIG. 29 is a waveform diagram of the equivalent circuit shown in FIG. 28. The state of data is changed in response to the rising edge of the clock signal /CLK in the master-part circuit, and is changed in response to the rising edge of the clock signal CLK. The switch SW1 is turned ON when the clock signal CLK switches to the high level, and takes the input data. At this time, the clock signal /CLK is at the low level, and hence the switch SW2 is OFF. Thus, the switch SW2 does not take the input data. When the clock signal CLK switches to the low level, the switch SW1 is turned ON and the amplifier A1 is turned ON. Then, the input data taken by the switch SW1 is latched. At this time, the switch SW2 takes the input data latched in the amplifier A1. When the clock signal CLK switches to the high level, the amplifier A2 is turned ON, and the input data taken by the switch SW2 is latched. Simultaneously, the switch SW1 of the master part takes the next input data.

In the above way, the decision operation is carried out by taking and latching the input data in synchronism with the regenerated clock signals CLK and /CLK.

The circuit shown in FIG. 27 has three stages of transistors between the power supply line Vcc and the ground, and hence does not operate sufficiently when receiving a low power supply voltage equal to or close to 3 V. For example, a voltage of 2.4 V is needed when taking into account only the base-emitter voltages of the transistors. When an output amplitude of approximately 0.2 V is needed, the transistors may be forward biased across the bases and collectors thereof, and application of the dc bias may become very difficult.

Figure 30:
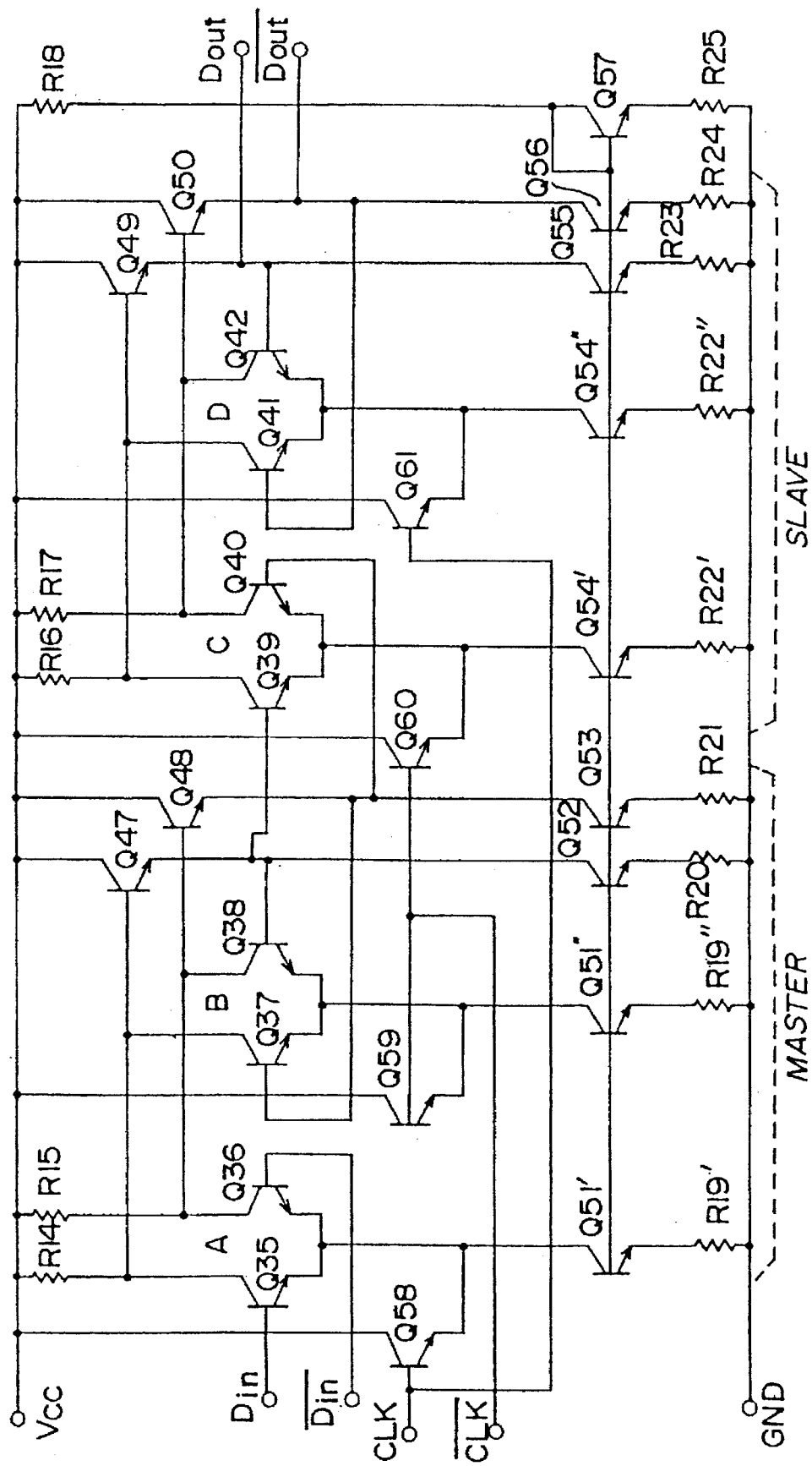
FIG. 30 is a circuit diagram of another configuration of the decision circuit shown in FIG. 15.
Figure 31A:
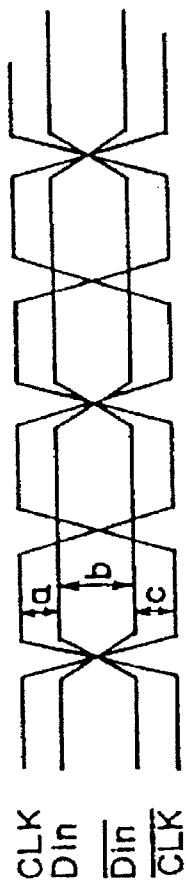
FIG. 31 is a waveform diagram showing the operation of the decision circuit shown in FIG. 30.
Figure 31B:
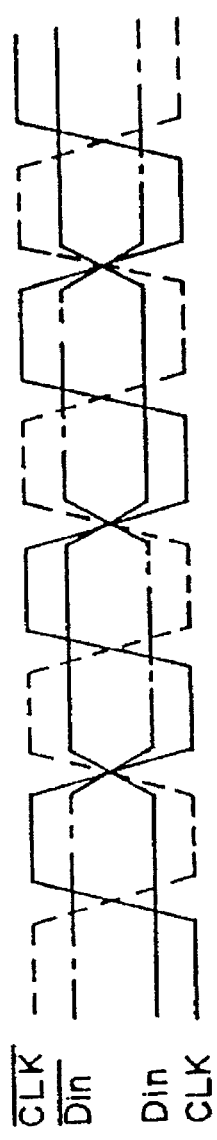
Figure 31C:
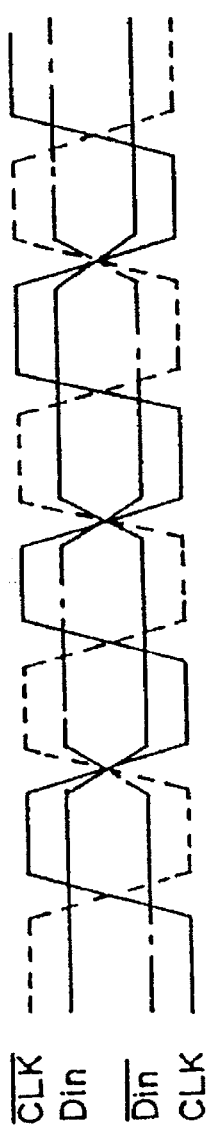
Figure 31D:
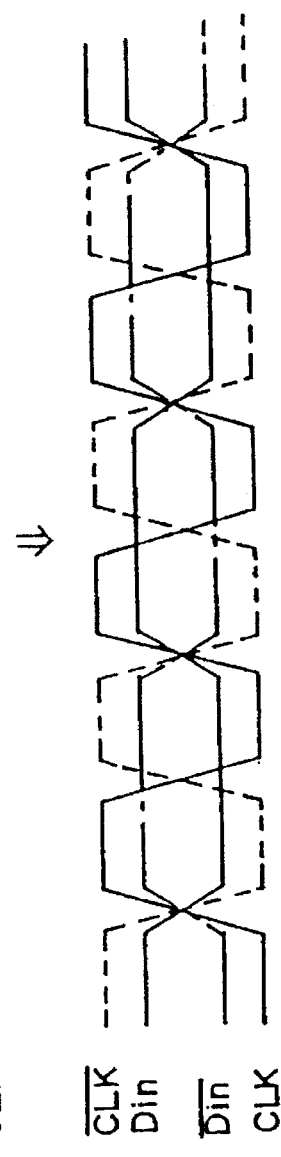

FIG. 30 is a circuit diagram of the decision circuit 18 having a configuration operable even with a low power supply voltage of approximately 3 V. In FIG. 30, parts that are the same as those shown in FIG. 27 are given the same reference numbers as previously. The circuit shown in FIG. 30 is characterized in that transistors Q58–Q61 receiving the clock signals CLK and /CLK are provided in parallel with the differential amplifiers A through D, respectively. With this structure, two stages of transistors are connected between the power supply line Vcc and the ground, and the circuit shown in FIG. 30 can be operated by a lower power supply voltage than that applied to the circuit shown in FIG. 27.

The transistors Q58 and Q61 receive the clock signal CLK, and the transistors Q59 and Q60 receive the clock signal /CLK. The connector of the transistor Q58 is connected to the power supply line Vcc, and the emitter thereof is connected to the emitters of the transistors Q35 and Q36 of the differential amplifier A. The other transistors Q59–Q61 are provided in the same way as the transistor Q58. Individual current sources (transistors Q51', Q51", Q54 and Q54") are provided with respect to the differential amplifiers A, B, C and D.

FIG. 31 is a waveform diagram showing the operation of the decision circuit shown in FIG. 30. More particularly, part (A) of FIG. 31 shows the input amplitude condition, and part (B) thereof shows data signals Din and /Din applied to the decision circuit as well as the clock signals CLK and /CLK generated by the timing generator 78 shown in FIG. 15. Further, part (C) of FIG. 31 is a timing chart of the output of the master-part circuit (the input of the slave-part circuit), and part (D) thereof is a timing chart of the output of the slave-part circuit.

Referring to part (A) of FIG. 31, the input amplitude condition to be met is such that amplitudes a and b are equal to or greater than 4 kT/q (k is the Boltzmann constant, T is the absolute temperature and q is the charge of electron) and an amplitude is equal to or greater than the offset of the decision circuit.

It will now be assumed that the data and clock signal are input as shown in part (B) of FIG. 31. When the clock signal CLK is at the low level, the transistor Q58 is OFF, and the differential amplifier A can take the data. At this time, since the clock signal /CLK is at a high-level higher than the peak of the data amplitude, the transistor Q59 is ON and the differential amplifier B is OFF. Hence, the current flowing in the transistor Q59 is equal to the current flowing in the transistor Q51". That is, variations in the collector potentials of the transistors Q57 and Q58 do not appear. Since the transistor Q61 is OFF when the clock signal CLK is at the low level, the differential amplifier D can latch the data from the differential amplifier C. At this time, the clock signal /CLK is at a high-level higher than the peak of the data amplitude. Hence, the differential amplifier C is OFF and does not take any data from the master part.

When the clock signal CLK is at the high level, the transistors Q58 and Q61 are ON, and the transistors Q59 and Q60 are OFF. At this time, the differential amplifier B latches the data and the differential amplifier C takes the data in the differential amplifier B. In this case, the transistors Q58 and Q61 are ON and thus the differential amplifiers A and D do not operate, so that the differential amplifiers B and C are not affected by the differential amplifiers A and D.

As described above, the master-part circuit takes input data when the clock signal CLK is at the low level, and latches the taken data when the clock signal CLK is at the high level. The slave-part circuit takes data from the master part when the clock signal /CLK is at the low level, and latches the taken data when the clock signal /CLK is at the high level.

Figure 32:
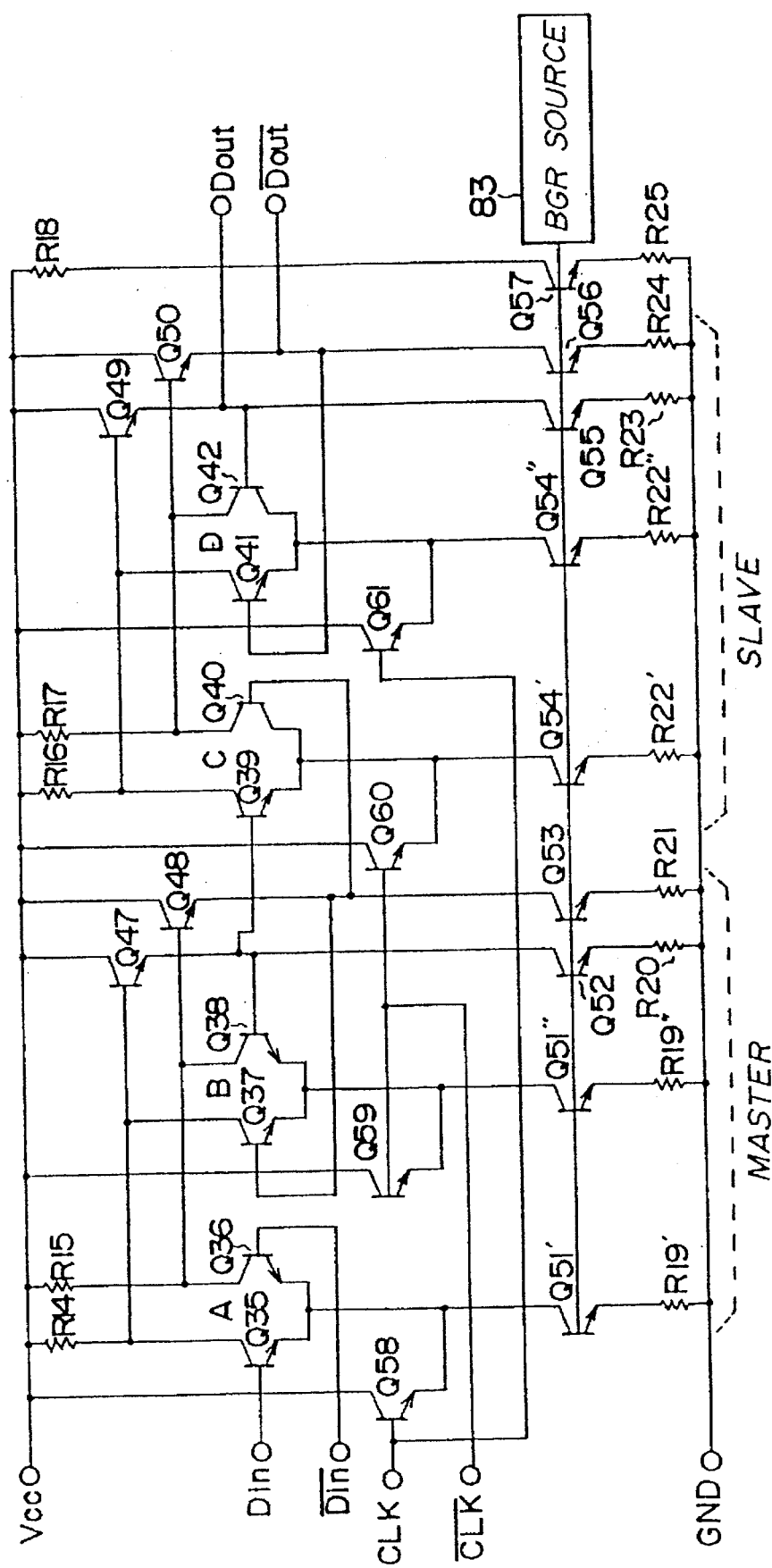
FIG. 32 is a circuit diagram of a variation of the decision circuit shown in FIG. 30.

In the circuit shown in FIG. 31, the base bias voltage of the constant-current source is applied from the collector of the diode-connected transistor Q57. Alternatively, as shown in FIG. 32, a known band gap reference (BGR) power source 83 can be used to provide the base bias voltage. The BGR power source 83 has a low temperature coefficient, and is capable of generating a bias voltage from a low power source voltage.

A description will now be given of the structure of the buffers 77 and 79 shown in FIG. 15.

Figure 33:
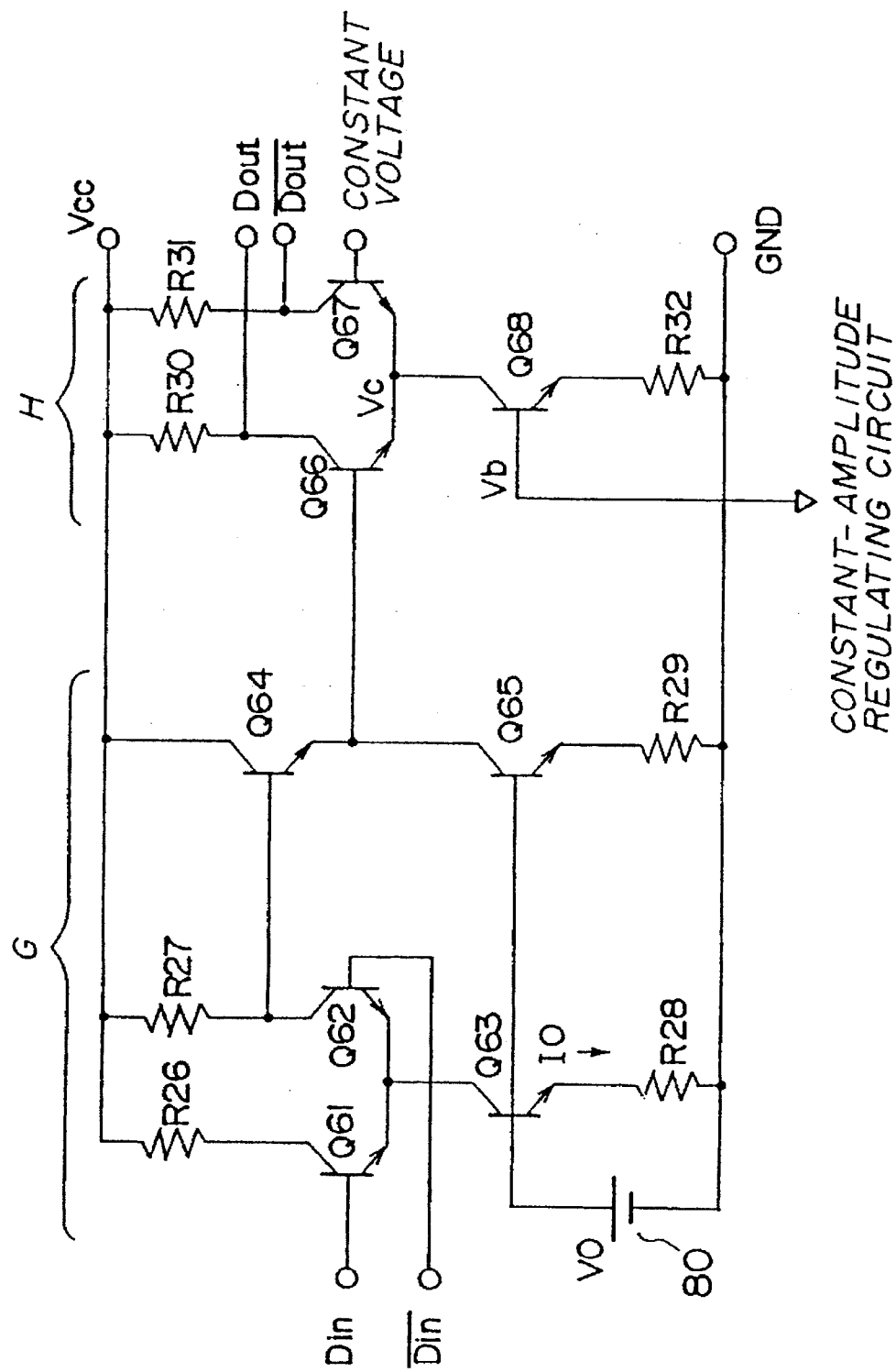
FIG. 33 is a circuit diagram of a buffer shown in FIG. 15.

FIG. 33 is a circuit diagram of an essential part of a circuit normally used to form a buffer such as the buffer 77 or 79. The buffer shown in FIG. 33 includes differential amplifiers G and H. The differential amplifier G includes transistors Q61 through Q65, resistors R26 through R29, and a bias source 80. The differential amplifier H includes transistors Q66 through Q68, and resistors R30–R32. The base of the transistor Q68 of the differential amplifier H is connected to an output of a constant-amplitude regulation circuit, which compensates for errors of the output amplitude due to variations in the power supply voltage and temperatures as well as deviations of the performance of constituent parts and makes the output amplitude of the differential amplifier H constant. The constant-amplitude regulation circuit is used in conventional circuits, and a detailed description thereof will be omitted here.

The differential amplifier G is connected at the front stage of the differential amplifier H, and the collector voltage Vc of the transistor Q68 is expressed by the following equation:

$$Vc=Vcc-(Rc \times I0/2+V_{BEQ64}+V_{BEQ66}) \quad (24)$$

where R is the resistance value of each of the resistors R26 and R27, I0 denotes the current flowing in the transistor Q63, $V_{BEQ64}$ denotes the base-emitter voltage of the transistor Q64, and $V_{BEQ66}$ denotes the base-emitter voltage of the transistor Q66. The above parameters Vcc, Rc, I0, $V_{BEQ64}$ and $V_{BEQ66}$ depend on variations in the power supply voltage and temperature as well as deviations of the performance of the constituent parts, and hence the collector voltage of the transistor Q68 cannot be constant. Particularly, if the circuit shown in FIG. 33 is driven by a power supply voltage lower than 5 V, then Vc<Vb due to the operating condition of the current source transistor Q68 of the differential amplifier Vc. In this case, the transistor of the current source is forward biased across the base and collector thereof, and hence the current source does not operate correctly.

Figure 34:
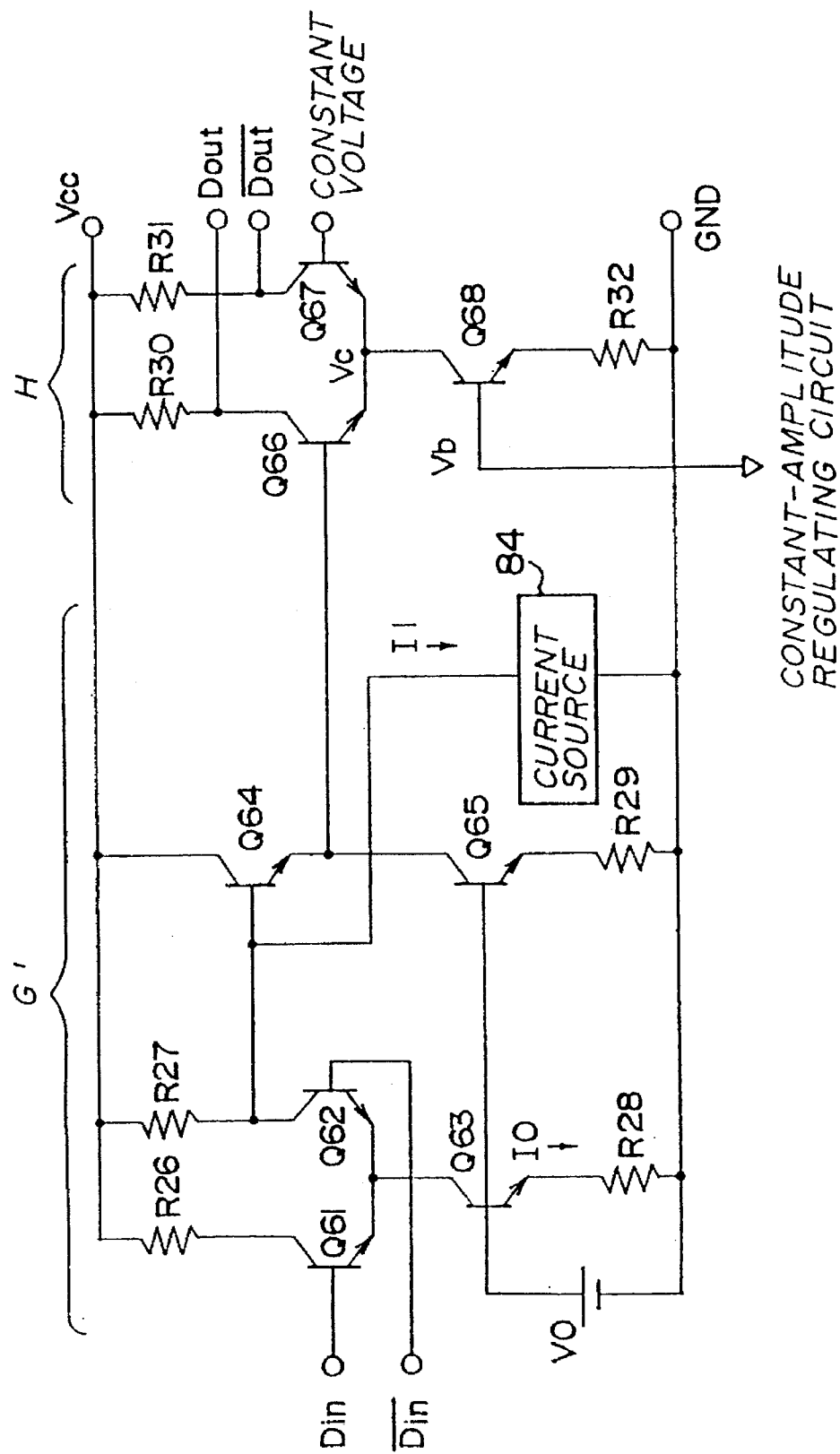
FIG. 34 is a circuit diagram of another configuration of the buffer shown in FIG. 15.

FIG. 34 shows a circuit designed to overcome the above problem. In FIG. 34, parts that are the same as those shown in FIG. 33 are given the same reference numbers as those previously used. In the circuit configuration shown in FIG. 34, a current I1 computed so that the collector voltage Vc of the transistor Q68 is constant is added to the current I0. The computed current I1 is generated by the current source 84 provided with respect to the differential amplifier G'.

The collector voltage Vc of the transistor Q68 is written as follows:

$$Vc=Vcc-\{Rc \times (I0/2+I1)+V_{BEQ64}+V_{BEQ66}\} \quad (25)$$

In order to avoid the influence of a variation in the temperature as well as deviations of the performance of the constituent parts and to suppress the influence of a variation in the power supply voltage, the collector voltage Vc is determined so that it can be defined by an arbitrary constant to be multiplied by the power supply voltage as follows:

$$Vc=Ko \times Vcc=Vcc-\{Rc \times (I0/2+I1)+V_{BEQ64}+V_{BEQ66}\} \quad (26)$$

where Ko is an arbitrary constant. By rewriting equation (26), the current I1 can be represented as follows:

$$I1=-(1/Rc) \times \{(Rc/2) \times I0+(Ko-1) \times Vcc+V_{BEQ64}+V_{BEQ66}\} \quad (27)$$

That is, by defining the current I1 defined by equation (27), the collector voltage Vc of the transistor Q68 of the differential amplifier H can be maintained at the constant value (a voltage value suppressed by Ko times regarding a variation in the power supply voltage), and thus the base-collector voltage of the transistor Q68 can be increased (for example, about 0.5 V). The controlling of the current I1 corresponds to controlling the output voltage of the differential amplifier G', that is, the output voltage developing across the load resistor.

Figure 35:
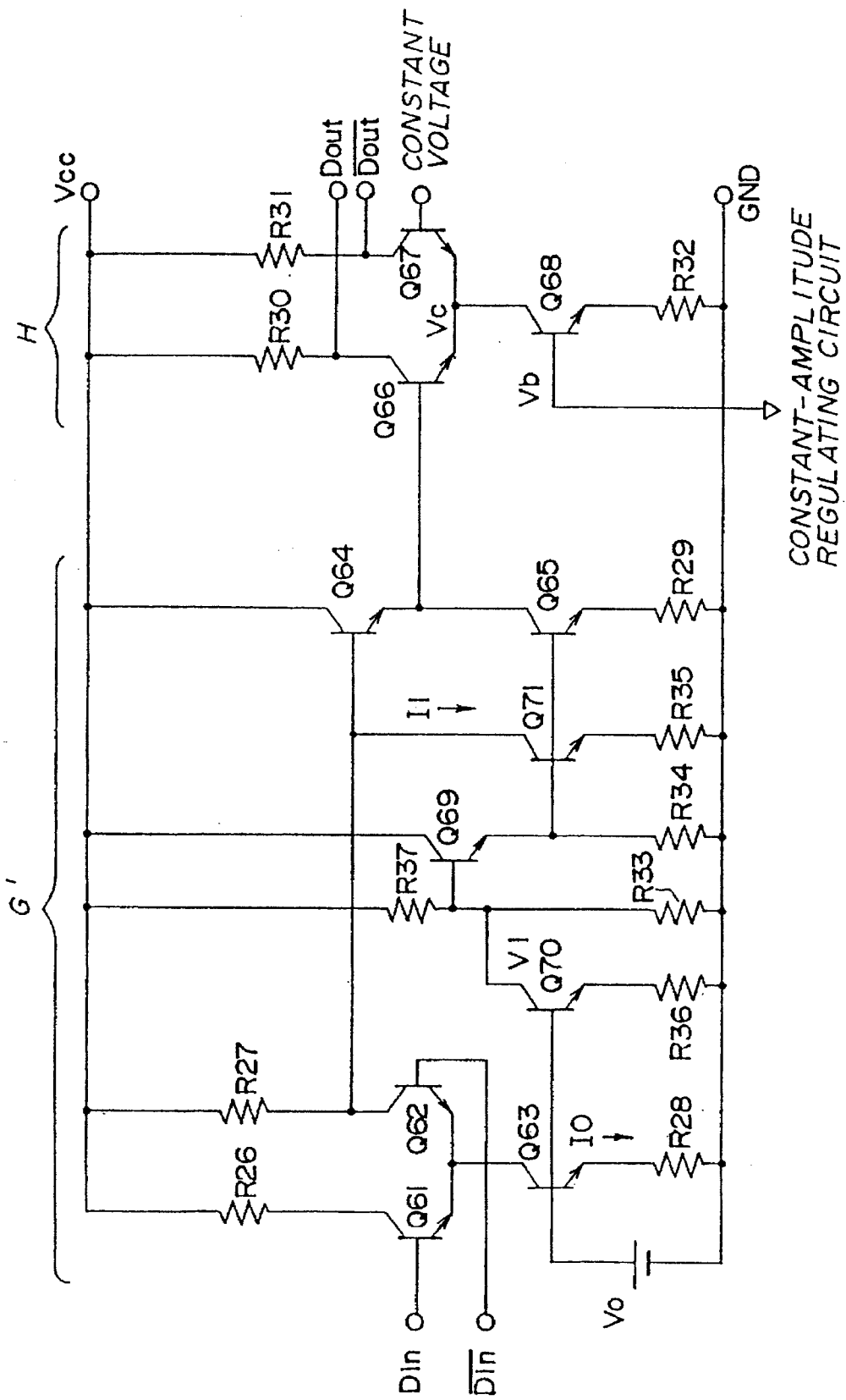
FIG. 35 is a circuit diagram showing the details of the configuration shown in FIG. 34.

FIG. 35 shows a circuit of the buffer including the detailed structure of the current source 84 shown in FIG. 34. In FIG. 35, parts that are the same as those shown in FIG. 34 are given the same reference numbers as previously. The current source 84 includes transistors Q69 through Q71, and resistors R33 through R36. The resistance values of the resistors R29 and R35 are set equal to each other.

The current I1 flowing in the transistor Q71 shown in FIG. 35 is expressed as follows:

$$I1 = (V1-V_{BEQ69}-V_{BEQ71})/r35 \quad (28)$$
$$V1 = \{R2/(R1+R2)\}Vcc - \{(R1 \times R2)/(R1+R2)\} \times I0$$
$$I1 = -(1/R35) \times [\{(R1 \times R2)/(R1+R2)\} \times I0 - \{R2/(R1+R2)\} \times Vcc+V_{BEQ69}+V_{BEQ71}$$

From the equations (27) and (28), if the following conditions are met:

1) Rc=R35(=R29)
2) Rc/2=(R1×R2)/(R1+R2)
3) Ko=1-{R2/(R1+R2)}
4) $V_{BEQ64}=V_{BEQ71}$
5) $V_{BEQ66}=V_{BEQ69}$ then the current I1 defined by equation (27) can be obtained. The current flowing in the transistor Q64 is equal to that flowing in the transistor Q71, so that $V_{BEQ64}=V_{BEQ71}$. Further, since the currents flowing in the transistors Q66 and Q69 are equal to each other, then $V_{BEQ66}=V_{BEQ69}$.

Hence, by selecting the resistance values of the resistors R37 and R33 so that the above conditions are met, the collector voltage Vc of the transistor Q68 is $$Vc=Ko \times Vcc$$

and is thus at a constant voltage without being influenced at all by a temperature variation and deviations of the performance of the structural parts, and the variation of the collector voltage due to a variation in the power supply voltage can be suppressed by Ko times.

Figure 36:
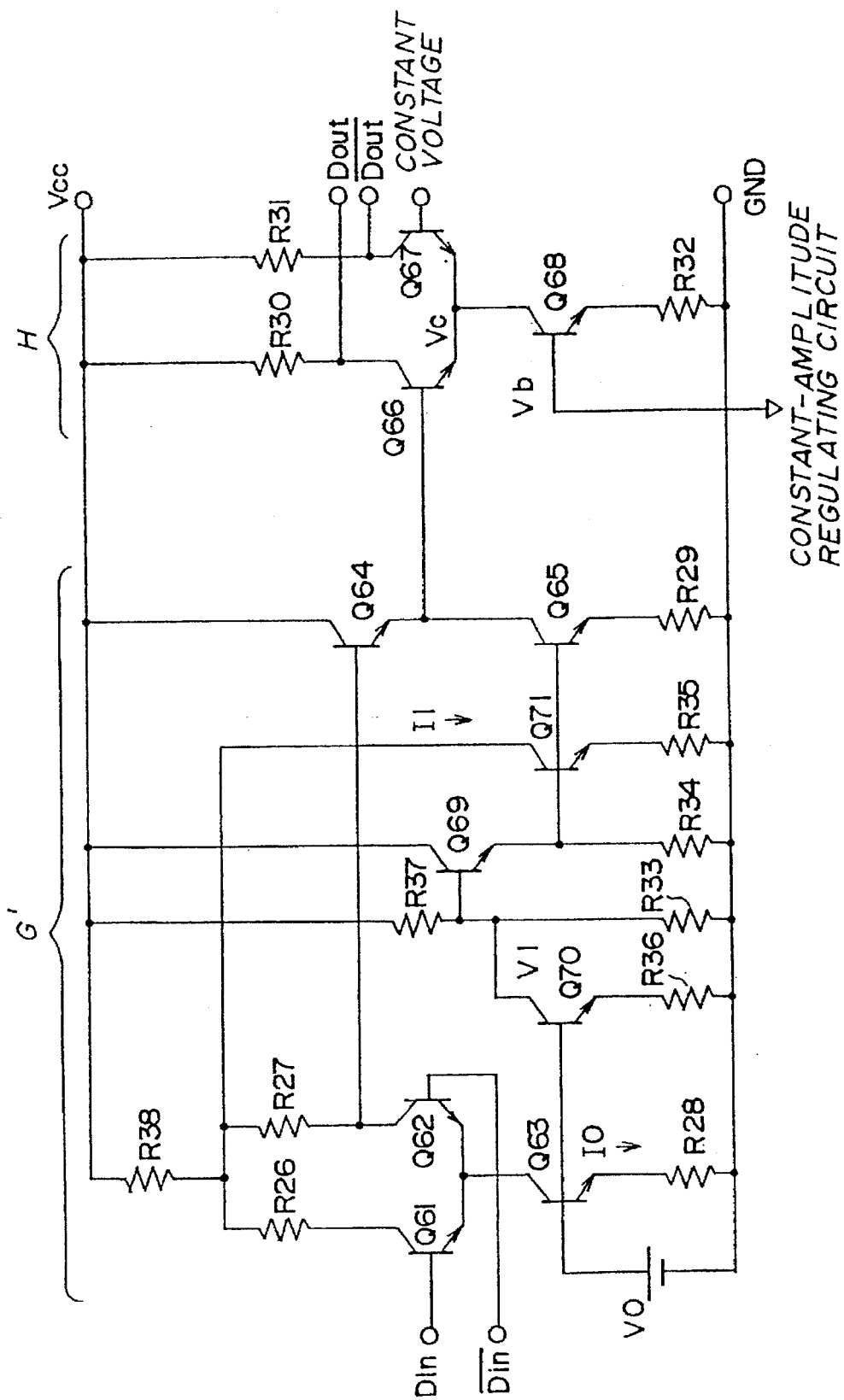
FIG. 36 is a circuit diagram of yet another configuration of the buffer shown in FIG. 15.

FIG. 36 shows the buffer having a circuit configuration designed while taking into account not only stabilize of the collector voltage Vc but also improve the high-frequency characteristic. In FIG. 36, parts that are the same as those shown in the previously described figures are given the same reference numbers as previously. The circuit shown in FIG. 36 differs from that shown in FIG. 35 in that a resistor R38 is provided as shown in FIG. 35. More particularly, the resistor R38 is connected between the power supply line Vcc and the collector resistors R26 and R27 of the transistors Q61 and Q62.

The same computation as has been described in connection with equation (25) defines the collector voltage Vc of the transistor Q68 of the differential amplifier H as follows:

$$Vc=Vcc-\{Rcc \times (I0+I1)+Rc \times I0/2+V_{BEQ64}+V_{BEQ66}\} \quad (29)$$

where Rcc is the resistance value of the resistor R38.

When making the collector voltage Vc depend on an arbitrary constant to be multiplied by the power supply voltage, then the following equation is defined:

$$Vc=Ko \times Vcc=Vcc-\{Rcc \times (I0+I1)+Rc \times I0/2+V_{BEQ64}+V_{BEQ66} \quad (30)$$

$$I1=-(1/Rcc) \times \{\{Rc/2) \times Rcc)\} \times I0+(Ko-1) \times Vcc+V_{BEQ64}+V_{BEQ66} \quad (31)$$

When applying the current I1 defined by equation (31), the collector voltage Vc of the transistor Q68 can be fixed to a constant value.

The current I1 flowing in the transistor Q71 can be computed as follows:

$$I1 = (V1 - V_{BEQ69} - V_{BEQ71})/R35 \quad (32)$$

$$V1 = \{R2/(R1+R2)\} \times Vcc -$$
$$(R1 \times R2)/(R1+R2) \times I0$$

$$I1 = -(1/R35) \times [\{(R1 \times R2)/(R1+R2)\} \times I0 -$$
$$\{R2/(R1+R2)\} \times Vcc + V_{BEQ69} + V_{BEQ71}$$

From the equations (31) and (32),
1) Rcc=R35 (=R29)
2) Rc/2+Rcc=R1×R2/(R1+R2)
3) Ko=1−R2/(R1+R2)
4) $V_{BEQ64} = V_{BEQ71}$
5) $V_{BEQ66} = V_{BEQ69}$ By setting the resistance values of the resistors R37 and R38 so that the above conditions are met, the collector voltage Vc of the transistor Q38 is:

$$Vc = Ko \times Vcc$$

and is thus at the constant voltage without being influenced at all by a temperature variation and deviations of the performance of the structural parts, and the variation of the collector voltage due to a variation in the power supply voltage can be suppressed by Ko times.

A description will now be given of the equalizer 82, the decision circuit 18 and a current-source circuit for stabilizing the gain of a differential amplifier provided in the timing generator 78 shown in FIG. 15 (the above current-source circuit will be referred to as a gain-stabilizing current-source circuit).

Figure 37:
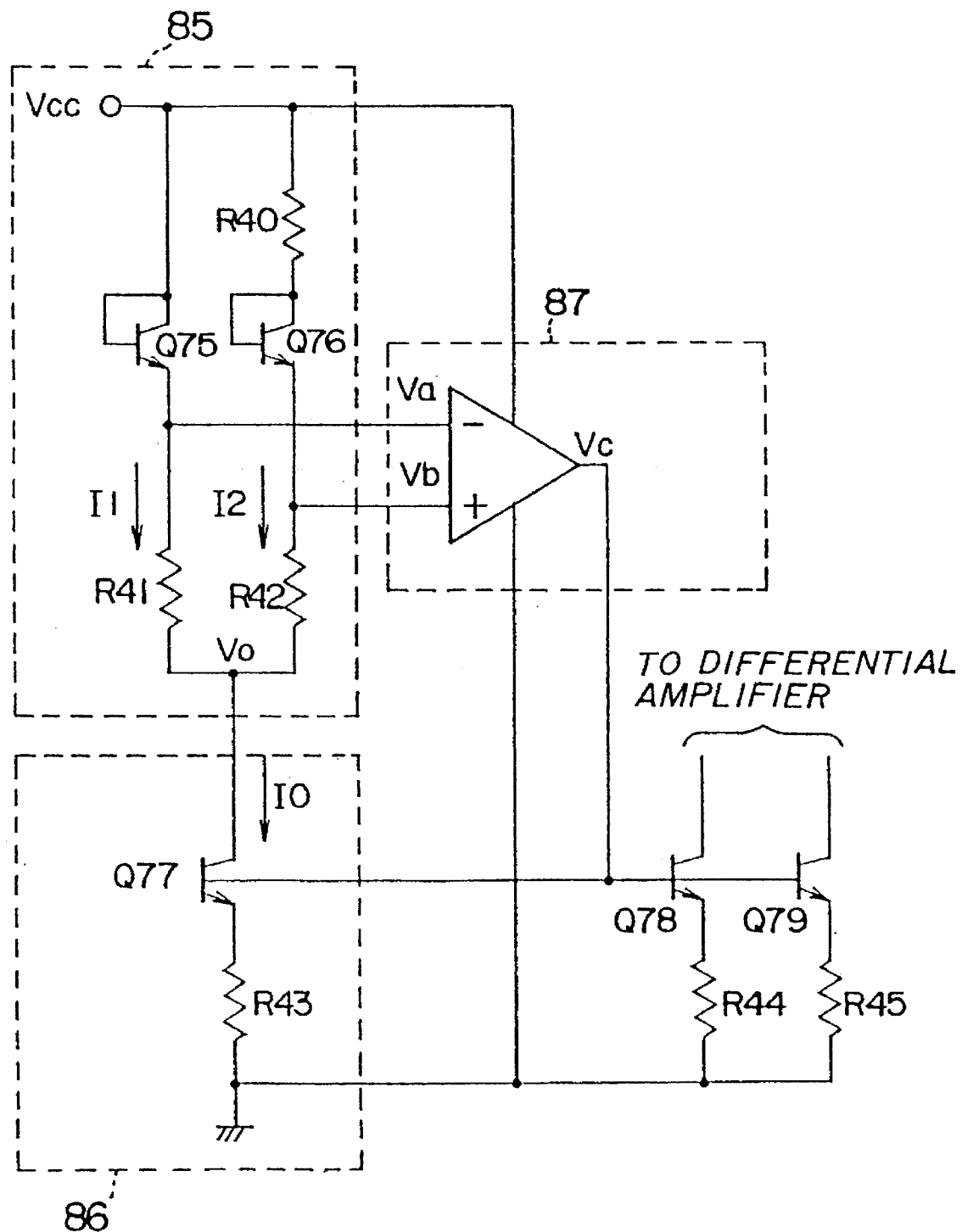
FIG. 37 is a circuit diagram of a circuit which controls constant-current sources associated with the equalizer, the decision circuit and the timing generator shown in FIG. 15.

FIG. 37 is a circuit diagram of an example of the configuration of the gain-stabilizing current-source circuit. The circuit shown in FIG. 37 includes a reference circuit 85, a constant-current source 86, an operational amplifier 87, and constant-current source transistors Q78 and Q79. The collectors of the transistors Q78 and Q79 are connected to the emitters of transistors forming a differential amplifier. The operational amplifier compares the reference voltages Va and Vb output by the reference circuit 85, and performs a feedback control of the base voltage of the transistor Q77 of the constant-current source 86 so that the difference Vc between the reference voltages Va and Vb becomes zero. The output voltage Vc of the operational amplifier 87 is applied to the base of a transistor forming a constant-current source for a differential amplifier (not shown). For example, the output voltage Vc is applied to the base of the transistor Q28 shown in FIG. 21. Since the current I0 is regulated at a constant level, the current flowing in the transistor Q28 is regulated at a constant level.

The reference circuit 85 includes transistors Q75 and Q76 connected so as to function as diodes, and resistors R40 through R42. The constant-current source circuit 86 includes the above-mentioned transistor Q77 and a resistor R43.

The gain-stabilizing current-source circuit shown in FIG. 37 will be described below.

Assuming now that the gain of the operational amplifier 87 is indefinite, the reference voltages Va and Vb are equal to each other. Hence, the currents I1 and I2 respectively flowing in the transistors Q75 and Q76 are expressed as I1×R41=I2×R42, that is:

$$I1/I2 = R42/R41 \quad (33)$$

Further, the following equation is satisfied:

$$V_{BEQ75} = V_{BEQ76} + I2 \times R40 \quad (34)$$

The difference $\Delta V_{BE}$ between the diode voltages $V_{BEQ75} - V_{BEQ76}$ ($\Delta V_{BE} = V_{BEQ75} - V_{BEQ76}$) is written as follows:

$$\Delta V_{BE} = h \times \ln(I1/Is1) - h \times \ln(I2/Is2)$$
$$= h \times \ln(I1 \times Is2)/(Is1 \times I2) = I2 \times R40$$
$$h = k \times T/q$$

where k is the Boltzmann constant, T is the absolute temperature, q is a charge of electron, Is1 is the reverse saturated current of the transistor Q75, and Is2 is the reverse saturated current of the transistor Q76.

In a case where the circuit shown in FIG. 37 is integrally formed, a relative error is very small, so that it is possible to assume that Is1=Is2. In this case, the following equation is obtained:

$$\Delta V_{BE} = h \times \ln(I1/I2) \quad (35)$$

From equations (33)–(35), the currents I1 and I2 can be expressed as follows:

$$I2 = \Delta V_{BE}/R40 = h/R40 \times \ln(R42/R41) \quad (36)$$

$$I1 = (R42 \times h)/(R41 \times R40) \times \ln(R42/R41) \quad (37)$$

$$I0 = Ko \times h/R40 \quad (38)$$

where $$Ko = (R42/R41 + 1) \times \ln(R42/R41)$$

Hence, when using the current I0 as the constant-current source for the differential amplifier, the gain of the differential amplifier is as follows:

$$Av = Rc \times I0/(2 \times h) = Ko \times Rc/2 \times R40 \quad (39)$$

where Rc is the collector resistor of the transistor of the differential amplifier connected to the transistor Q78 or Q79. As shown in equation (39), the gain Av depends on the resistors and constant, and is thus constant.

When paying attention to the collector voltage Vo of the constant-current source 86 in the circuit shown in FIG. 37, the following is obtained:

$$Vo = Vcc - (R41 \times I1 + V_{BEQ75}) \quad (40)$$

By inserting equation (37) into equation (40), the following equation is obtained:

$$Vo = Vcc - \{(R42 \times h)/(R40) \times \ln(R42/R41)\} + V_{BEQ75} \quad (41)$$

A variation in the collector voltage Vo with respect to a temperature variation, that is, dVo/dT is obtained in the following way:

$$dVo/dT = dVcc/dT - d/dT\{R42/R40 \times kt/q \times \quad (42)$$
$$\ln(R42/R41)\} - dV_{BEQ75}/dT$$
$$= -R42/R40 \times k/q \times \ln(R42/R41) - dV_{BEQ75}/dT$$

By selecting the values of R42/R40 and R42/R41 so that the temperature gradient for the base voltage $V_{BEQ75}$ is canceled, temperature variation in the collector voltage Vo can become zero (dVo/dT=0), and thus a constant-voltage source can be realized.

By using dVo/dT=0, equation (42) can be rewritten as follows:

$$-R42/R40 \times k/q \times \ln(R42/R41) = dV_{BEQ75}/dT \quad (43)$$

By applying equation (43) to equation (39), the following is obtained:

$$Av = -1/2 \times Rc/R40 \times (R42/R41 + 1) \times \qquad (44)$$
$$R40/R42 \times q/k \times dV_{BEQ75}/dT$$
$$= -1/2 \times Rc \times (1/R41 + 1/R42) \times$$
$$q/k \times dV_{BEQ75}/dT$$

As shown in equation (44), the gain Av depends on only the resistors and the constants. It can be seen from the above that the gain of the differential amplifier can be regulated at a constant level and simultaneously a constant-voltage source can be realized.

FIG. 38 is a circuit diagram of a gain-stabilizing current-source circuit equipped with a constant-voltage source circuit based on the above consideration. In FIG. 38, parts that are the same as those shown in FIG. 37 are given the same reference numbers as previously. The gain-stabilizing current-source circuit shown in FIG. 38 includes the reference circuit 85, the constant-current source 86, the operational amplifier 87, and a constant-voltage source circuit 88. The constant-voltage source circuit 88 generates a constant voltage V from the above-mentioned constant voltage Vo. The constant voltage V generated by the constant-voltage source circuit 88 can be applied to an internal circuit which needs a predetermined voltage. That is, the necessary constant voltage can be generated within the device (in the 3R-IC 73 shown in FIG. 15) rather than externally supplying it. The constant-voltage source circuit 88 includes an operational amplifier 89, transistors Q80 and Q81, and resistors R46–R49.

As has been described previously with reference to FIG. 37, the operational amplifier 87 and the constant-current source circuit 86 form the feedback circuit, which maintains the collector voltage Vc of the transistor Q77 at the constant level. The constant voltage Vc is input to the non-inverting terminal of the operational amplifier 89, which compares the constant voltage Vc with the collector voltage of the transistor Q81. The base voltage of the transistors Q80 and Q81 is controlled so that the error voltage between the voltage Vc and the collector voltage of the transistor Q81 becomes zero. In this way, the constant voltage V can be obtained at the collector of the transistor Q80.

The above constant voltage V can be expressed as follows:

$$Vc=Vcc-R46 \times I3=Vcc-R46 \times R49/R48 \times I4 \qquad (45)$$

Assuming now that the gain of the operational amplifier 89 is indefinite, then Vo=Vcc–R47×I4. By inserting this equation to equation (45), the following equation can be obtained:

$$V=Vcc-R46/R47 \times R49/R48 \times (Vcc-Vo)=(1+K) \times Vcc+K \times Vo \qquad (46)$$

It can be seen from equation (46) that the voltage V is constant.

Figure 39:
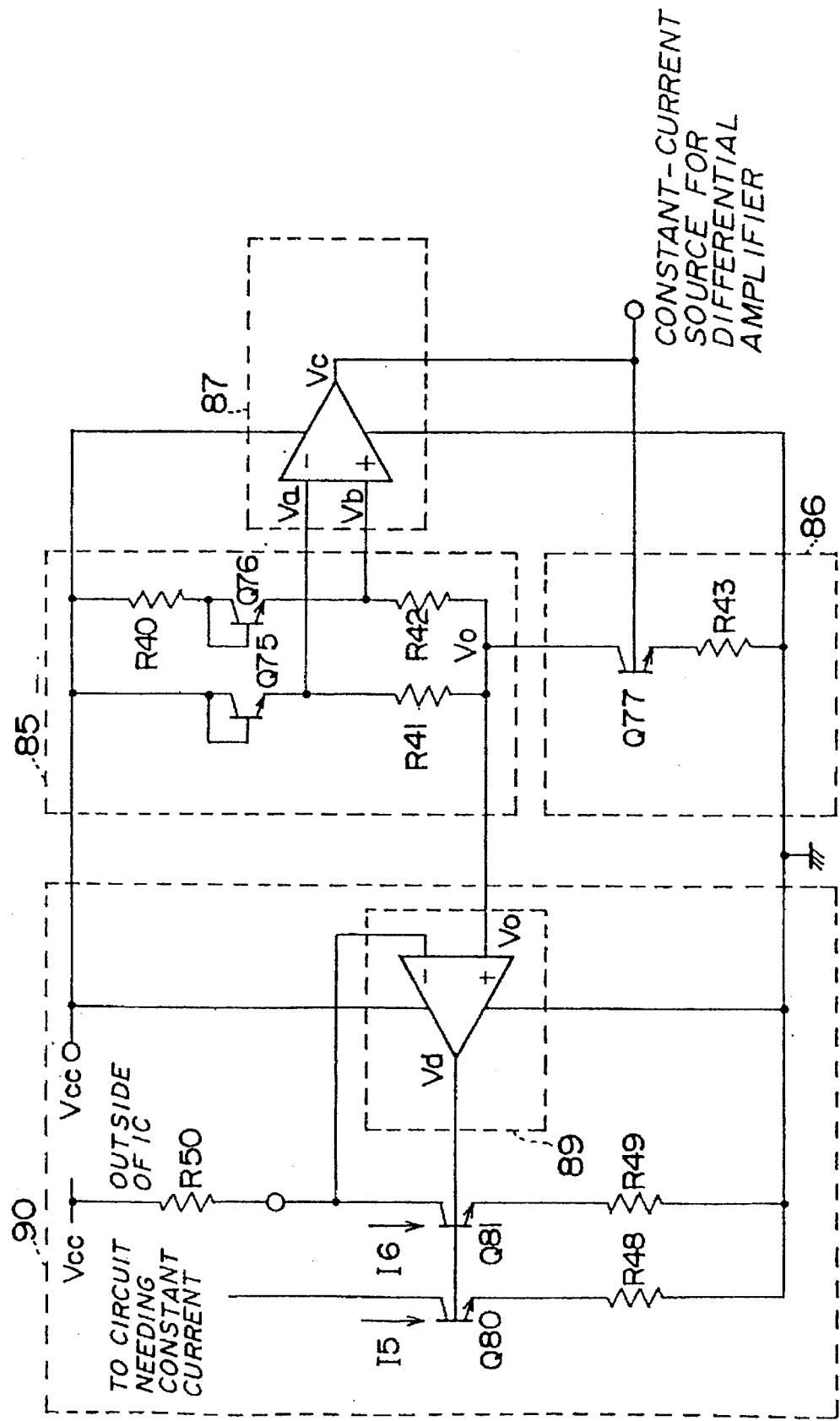
FIG. 39 is a circuit diagram of a constant-current source circuit utilizing the configuration shown in FIG. 37.

FIG. 39 is a circuit diagram of a constant-current source circuit 90 utilizing the reference circuit 85, the constant-current source 86 and the operational amplifier 87. In FIG. 39, parts that are the same as those shown in the previously described figures are given the same reference numerals as previously. The constant-current source circuit 90 generates a constant current I5 utilizing the collector voltage Vo of the transistor Q77, and supplies the constant current I5 to an inner circuit of the device which needs a constant current. That is, it is possible to generate an arbitrary current within the device (the 3R-IC 73 in the device shown in FIG. 15).

The constant-current source circuit 90 includes an operational amplifier 89, transistors Q80 and Q81, and resistors R48 through R50. The resistor R50 is a resistor externally connected to the module 70 (FIG. 14) which accommodates the 3R-IC 73. By changing the resistance value of the resistor R50, it becomes possible to obtain the desired constant current I5. When employing the circuit shown in FIG. 39, the module 70 shown in FIG. 14 is equipped with an external terminal to which the resistor R50 is connected. The resistor R50 may be provided in the module 70.

When the gain of the operational amplifier 89 is indefinite, then Vo=Vcc–R50×I6. If the external resistor R50 has a little variation, the current I6 flowing in the transistor Q81 becomes constant, and the current I5 flowing in the transistor Q80 becomes constant as shown below:

$$I5=R49/R48 \times (Vcc \times Vo)/R50 \qquad (47)$$

Figure 40:
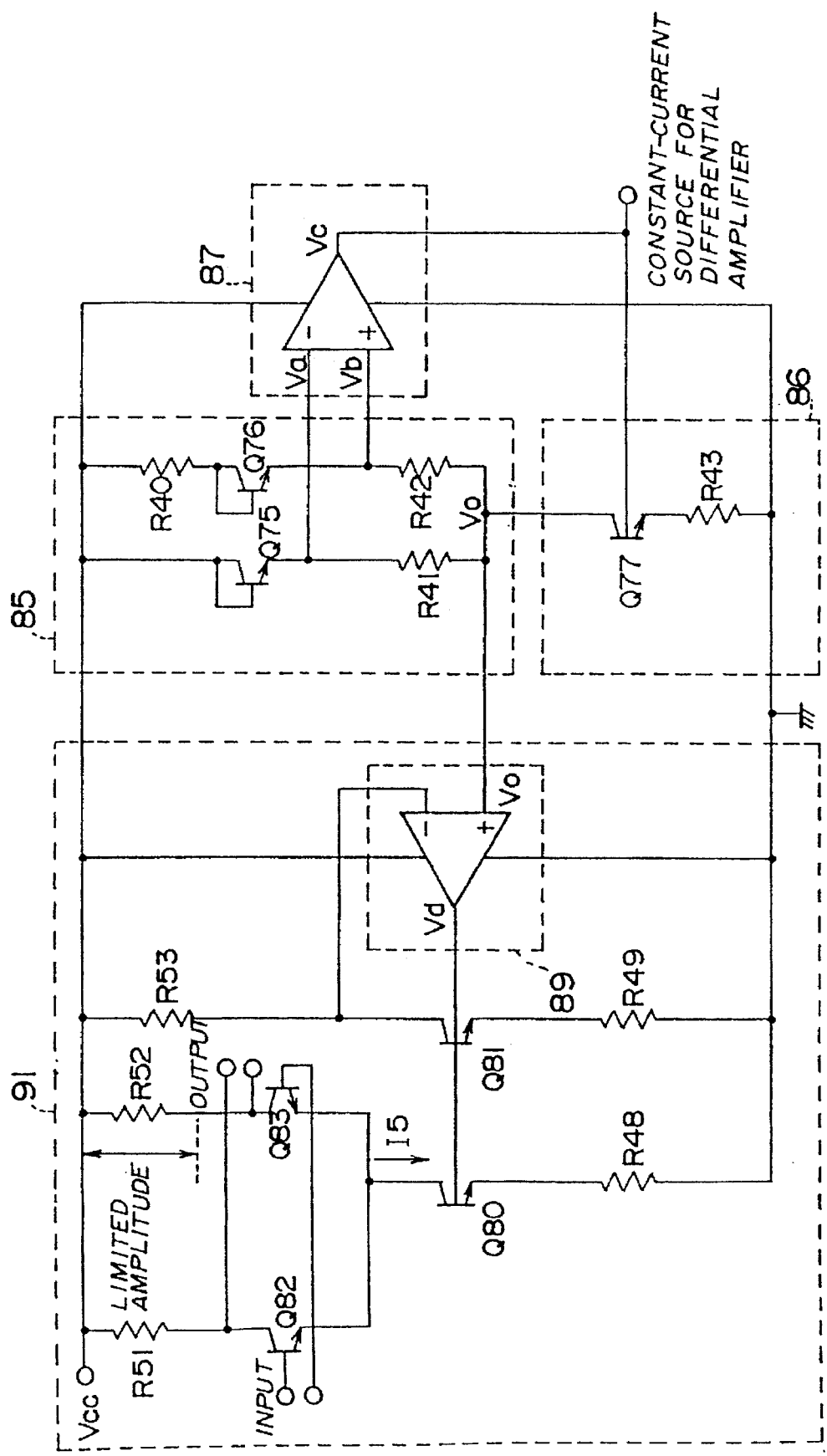
FIG. 40 is a circuit diagram of a configuration that includes a differential amplifier driven by the constant-current source circuit shown in FIG. 39.

FIG. 40 is a circuit diagram of a differential amplifier 91 including the constant-current source circuit shown in FIG. 39. The collector of the transistor Q80 supplying the constant current I5 is connected to the emitters of the transistors Q82 and Q83 forming a differential amplifier. The input signals are applied to the bases of the transistors Q82 and Q83, and the output signals of the differential amplifier are obtained at the collectors of these transistors. Collector resistors R51 and R52 are respectively connected to the collectors of the transistors Q82 and Q83. A resistor R53 corresponds to the resistor R50 shown in FIG. 39, and is provided in the device in FIG. 40.

The amplitudes developing across the resistors R51 and R52 are limited to a certain level. More particularly, when the input signals become equal to or greater than a given level, the output amplitudes are limited to a limited amplitude level. That is, the limited amplitude $A_{LMT}$ is written as follows:

$$A_{LMT}=R52(R41) \times I5=R52/R53 \times R49/R48 \times Vo=K \times Vo \qquad (48)$$

As shown above, the limited amplitude $A_{LMT}$ is constant.

Figure 41:
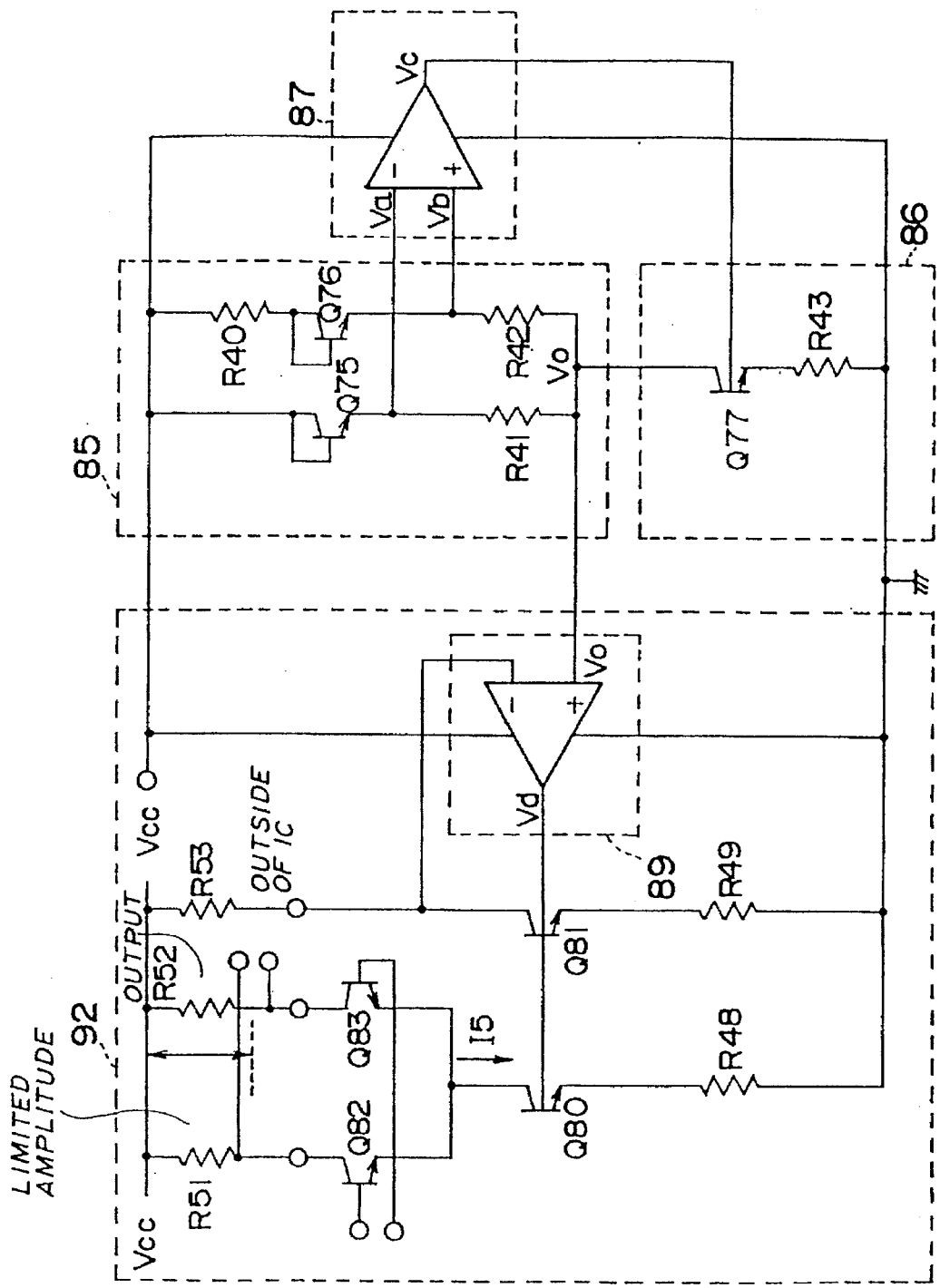
FIG. 41 is a circuit diagram of a variation of the circuit shown in FIG. 40.

FIG. 41 is a circuit diagram of a variation of the circuit shown in FIG. 40. A differential amplifier 92 shown in FIG. 41 is designed so that the resistors R51–R53 are provided outside of the aforementioned 3R-IC 73 and inside or outside of the module 70. By setting the resistors R51 through R53 to arbitrary resistance values, it is possible to externally control the limited amplitude level and the magnitude of the constant current.

Figure 42:
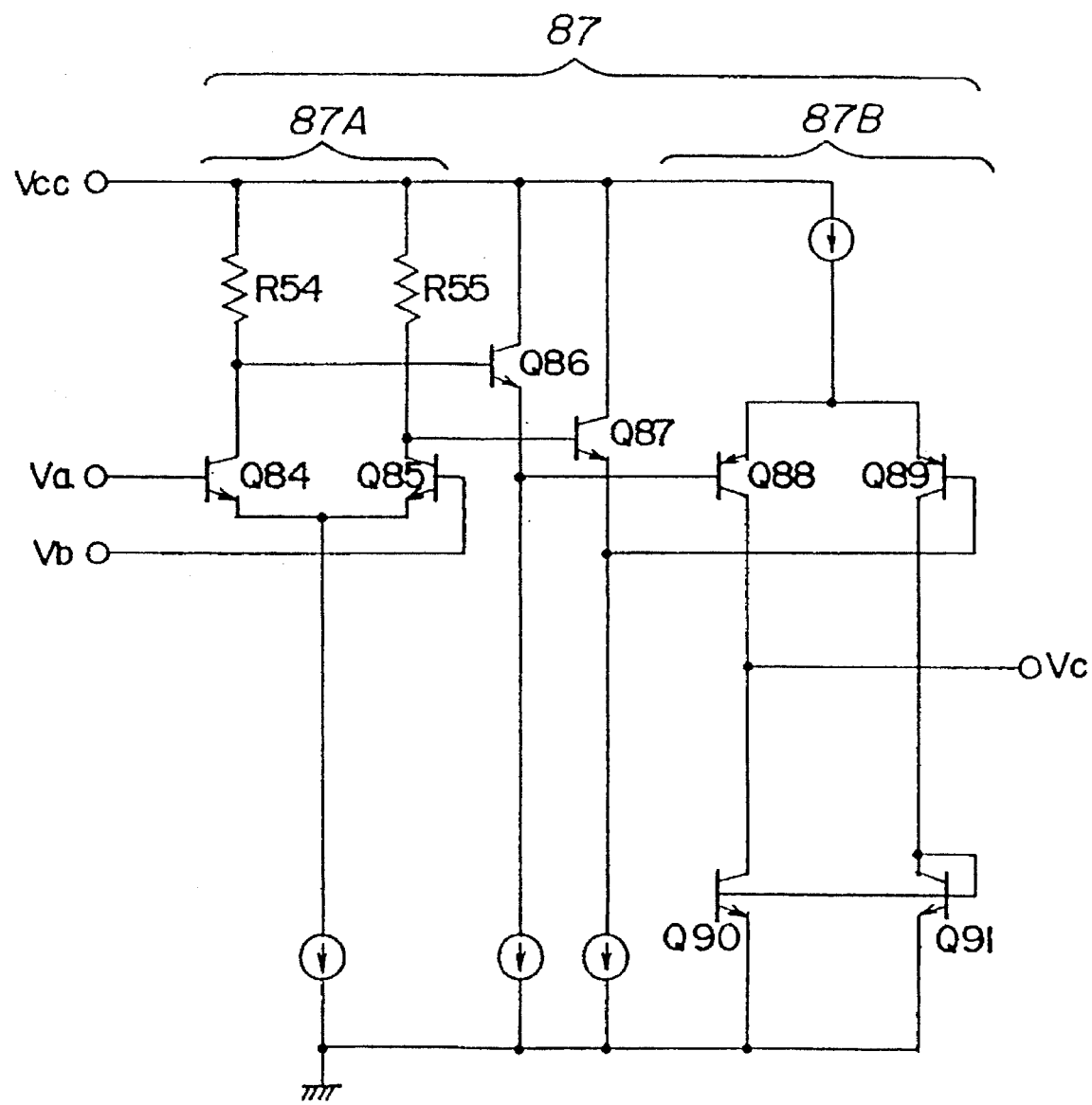
FIG. 42 is a circuit diagram of an operational amplifier shown in FIGS. 37 and 41.

FIG. 42 is a circuit diagram of the aforementioned operational amplifier 87. The operational amplifier 87 includes a differential amplifier 87A, a voltage/current (V/I) converter circuit 87B, and transistors Q86 and Q87 connecting these circuits together. The differential amplifier 87A includes transistors Q84 and Q85, and resistors R54 and R55. The V/I converter circuit 87B includes transistors Q88–Q91. Further, constant-current circuits are provided as shown in FIG. 42. The reference voltages Va and Vb are respectively applied to the bases of the transistors Q84 and Q85, and the output voltages thereof are respectively applied to the bases of the transistors Q86 and Q87 via the emitter-follower circuits of the transistors Q86 and Q87. The constant current Vc is output at the collector of the transistor Q88.

Figure 43:
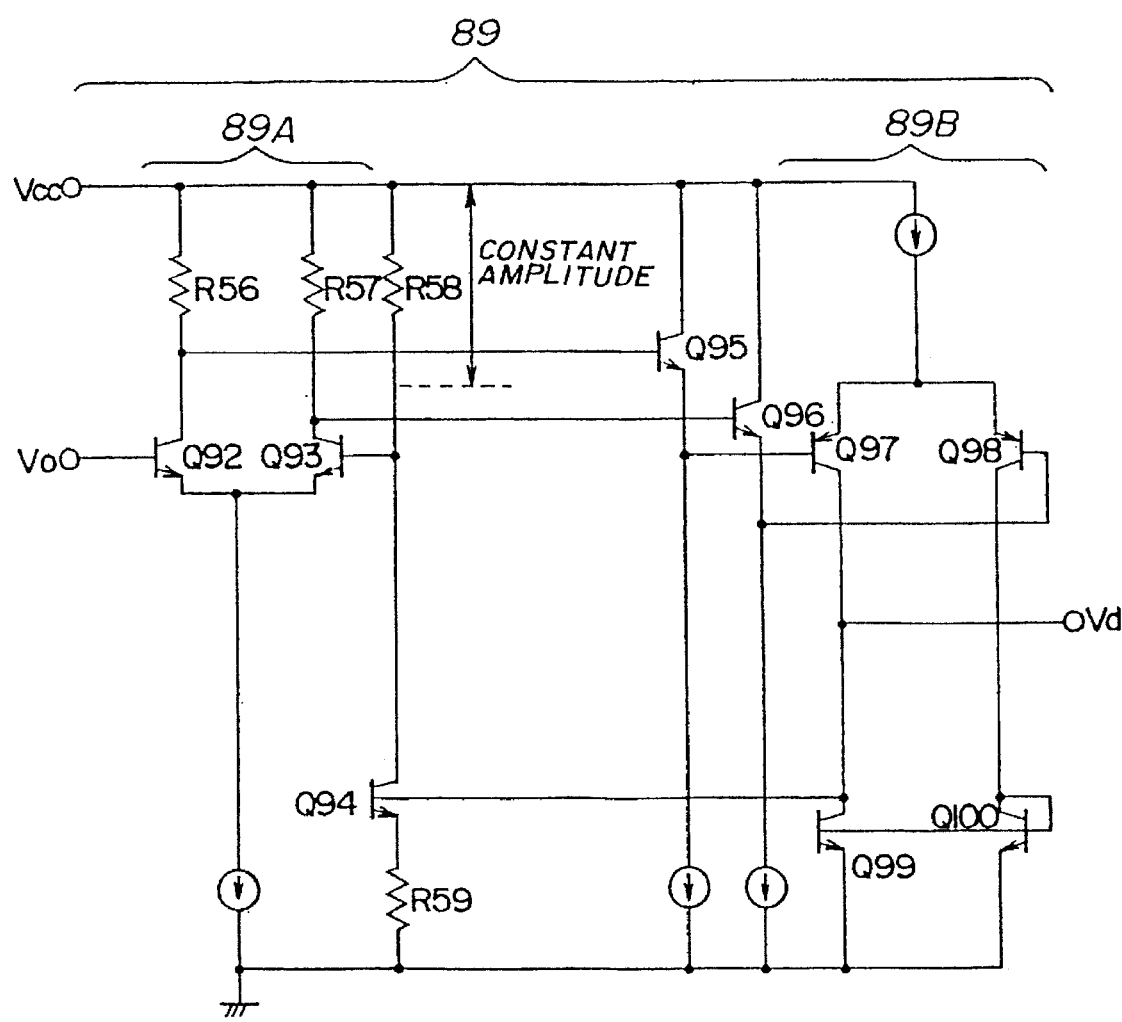
FIG. 43 is a circuit diagram of an operational amplifier shown in FIGS. 38 and 41.

FIG. 43 is a circuit diagram of the aforementioned operational amplifier 89. The operational amplifier 89 includes the differential amplifier 89A, the voltage/current (V/I) converter circuit 87B, transistors Q95 and Q96 connecting these circuits, resistors R58 and R59 applying a constant voltage to the base of a transistor Q93, and a transistor Q94. The differential amplifier 89A includes transistors Q92 and Q93, and resistors R56 through R58. The V/I converter circuit 89B includes transistors Q97 and Q100. Further, constant-current sources are provided as shown in FIG. 43. The constant voltage vo is applied to the base of the transistor Q92, and a constant amplitude defined by the resistor R58 is applied to the transistor Q93. The output voltages of the transistors Q92 and Q93 are applied to the bases of the transistors Q92 and Q93 via the emitter-follower transistors Q95 and Q96, respectively. A constant voltage Vd is output from the collector of the transistor Q88. Since the constant voltage Vd is applied to the base of the transistor Q94, the current flowing therein is constant, and the voltage drop developing across the resistor R58 is constant (a constant amplitude).

A description will now be given of another configuration of the light receiver according to the present invention.

In the light receiver shown in FIG. 6, the threshold voltage S5 is controlled so that it follows a variation in the output signal S2 and is located in the center of the amplitude of the output signal S2 by the DC offset compensation performed by the offset compensation circuit 4, as shown in FIG. 9. The variation following performance of the threshold voltage S5 depends on the capacitance of the capacitor C1 of the offset compensation circuit 4 shown in FIG. 10. The setting of the capacitance of the capacitor C1 (setting of the time constant related to the capacitor C1) will now be described with reference to FIGS. 44A and 44B.

Figure 44A:
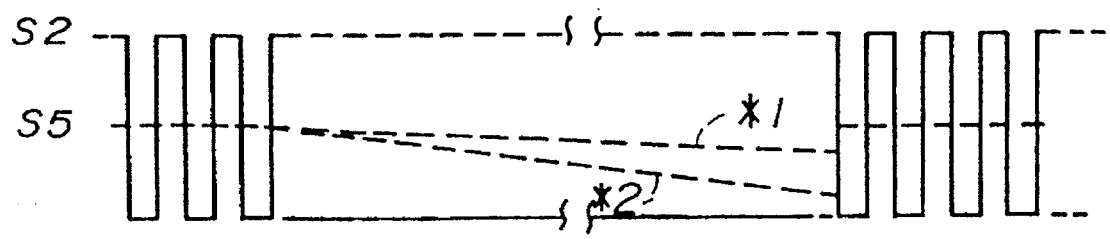
FIGS. 44A and 44B are waveform diagrams for explaining how to determine the capacitance of the capacitor shown in FIG. 10.
Figure 44B:

As described above, the threshold voltage S5 is controlled so that it follows a variation in the output signal S2 and is located in the center of the amplitude of the output signal S2 by the DC offset compensation performed by the offset compensation circuit 4, as shown in FIG. 44B. Hence, it is required that the threshold voltage S5 can vary so that it follows an expected abrupt variation in the output signal S2. Meanwhile, as shown in FIG. 44A, when the output signal S2 of the preamplifier 2 consecutively outputs identical values (zero, for example), the charge stored in the capacitor C1 is discharged, and hence the threshold voltage S5 is decreased. If the threshold voltage S5 has a high responsibility to the output signal S2 of the preamplifier 2, as indicated by *2 shown in FIG. 44A, the threshold voltage S5 is decreased rapidly. In this case, the threshold voltage S5 cannot respond to the next rising edge of the output signal S2 at high speed. Hence, it is required that, as indicated by *1, the threshold voltage S5 be still located at a level close to the center of the amplitude of the signal S2 after a certain period from the beginning of the consecutive identical values.

As described above, the capacitance of the capacitor C1 is determined taking into consideration the varying speed of the output signal S2 and the continuity (period) of the same values thereof.

However, in some cases, the offset compensation circuit 4 shown in FIG. 10 will not sufficiently respond to a variation in the output signal S2 resulting from, for example, an instantaneous noise of a high frequency superimposed on the power supply voltage. Since the output signal S2 of the preamplifier 2 is a fine signal, it is likely to be affected by external noise. This will be described in detail with reference to FIGS. 45, and 46A through 46D.

Figure 45:
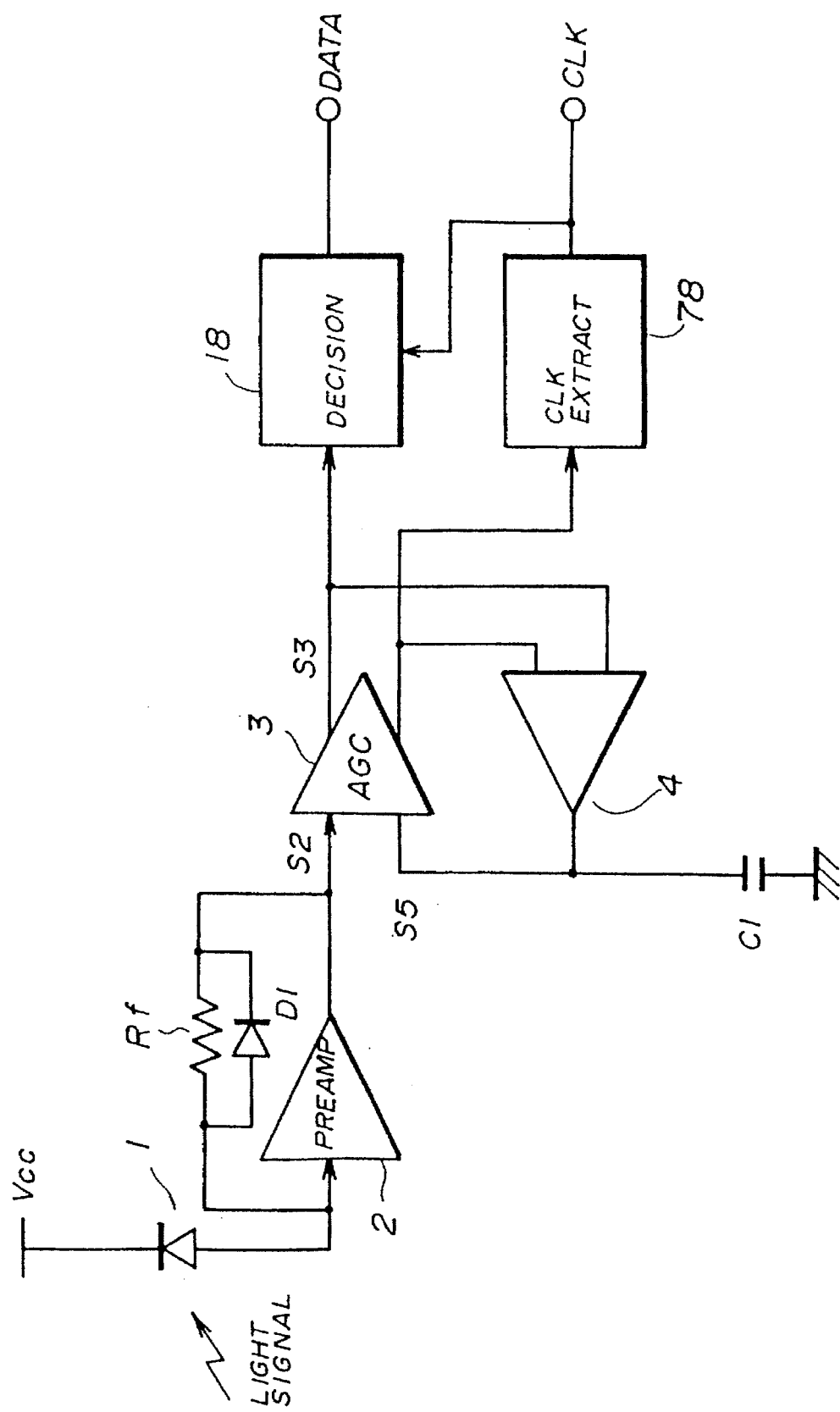
FIG. 45 is a block diagram corresponding to the configuration shown in FIG. 6.

FIG. 45 is a block diagram of the light receiver including the equalizing amplifier according to the aforementioned embodiment of the present invention, which corresponds to the structure shown in FIG. 6. For the sake of convenience, the pulse width compensation circuit 6 shown in FIG. 6 is omitted in FIG. 45, and the decision circuit 18 not shown in FIG. 6 is illustrated in FIG. 45. Further, the capacitor C1 built in the offset compensation circuit 4 shown in FIG. 6 is illustrated separately from the main body of the circuit 4. The clock extracting circuit 78 shown in FIG. 45 corresponds to the timing generator 78 shown in FIG. 15.

Figure 46A:
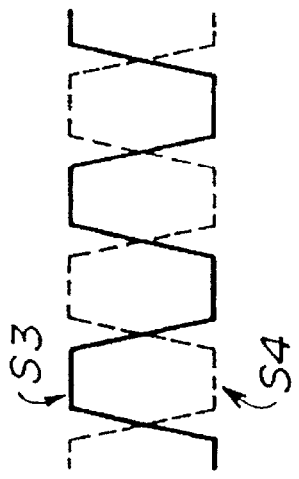
FIGS. 46A, 46B, 46C and 46D are waveform diagrams showing the operation of the light amplifier shown in FIG. 45.
Figure 46B:
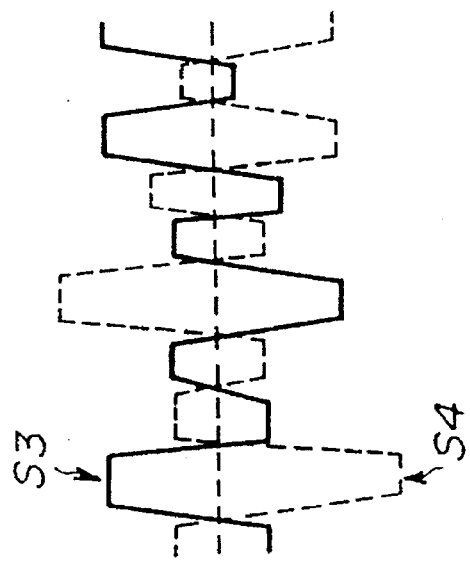
Figure 46C:
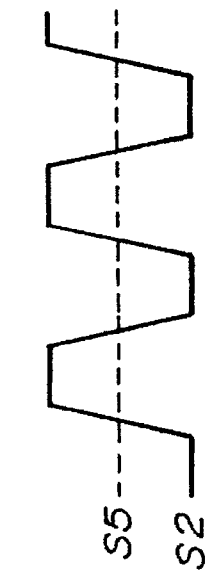
Figure 46D:
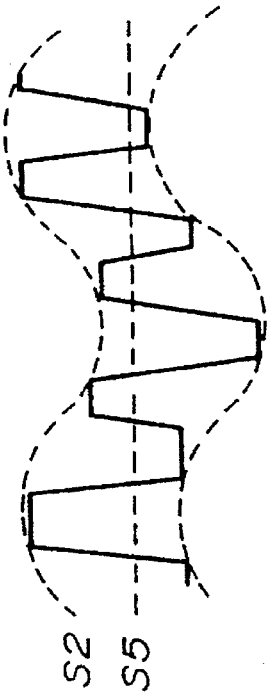

When there is no amplitude variation in the output signal S2 of the preamplifier and no external nose such as power supply noise as shown in FIG. 46A, the non-inverted output signal S3 and invertered output signal S4 of the AGC circuit 3 are as shown in FIG. 46B. If there is an amplitude variation in the output signal S2, the output signals S3 and S4 are as shown in FIG. 44B. If the amplitude of the output signal S2 is varied abruptly, the offset compensation circuit 4 having the capacitor C1 designed as has been described previously cannot compensate for the DC offset of the AGC circuit 3 because the above abrupt variation in the output signal S2 is out of the compensation allowing range. Hence, as shown in FIG. 46C, the threshold voltage S5 cannot follow a variation in the output signal S2. Hence, the output signals S3 and S4 of the AGC circuit 3 are varied as shown in FIG. 46D, and are not correctly discriminated in the decision circuit 18.

FIG. 47 is a block diagram of a light receiver configured taking into account the above. In FIG. 47, parts that are the same as those shown in the previously described figures are given the same reference numbers as previously. The light receiver shown in FIG. 47 is characterized in that an output buffer 121 is provided at the output of the preamplifier 2, and an output buffer 122 having the same configuration as that of the output buffer 121 is provided at the output of the offset compensation circuit 4. When external noise such as noise superimposed on the power supply voltage occurs, the output signal S2 of the output buffer 121 is varied due to such external noise, and similarly the output signal S5 of the output buffer 122 is varied. Since the output buffers 121 and 122 have the same circuit configuration, the output signals S2 and S5 are varied in the same way. That is, the variations in the output signals S2 and S5 are in phase.

Figure 48A:
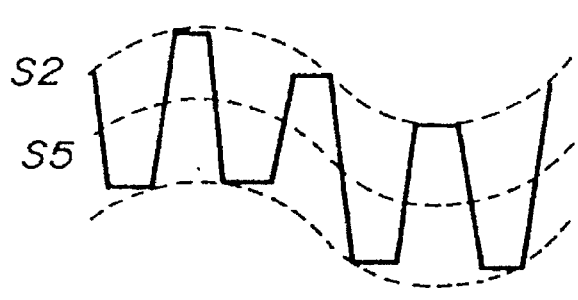
FIGS. 48A and 48B are waveform diagrams of the operation of the light amplifier shown in FIG. 47.
Figure 48B:
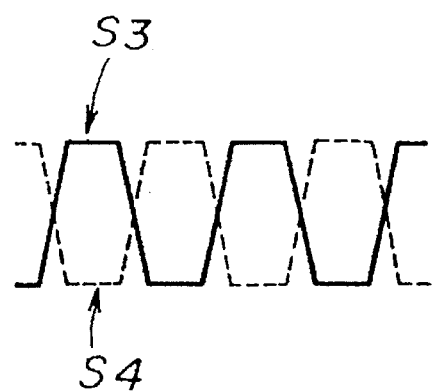

The AGC circuit 3 is formed by a differential amplifier, which functions to cancel the in-phase signals. Hence, the output signal S2 of the output buffer 121 and the output signal S5 of the output buffer 122 are varied as shown in FIG. 48A, and the output signals S3 and S4 of the AGC circuit 3 are varied as shown in FIG. 48B.

The external noise does not appear in the output signals S3 and S4 of the AGC circuit 3, and hence the offset compensation circuit 4 does not respond to the external noise. As a result, it is possible to determine the capacitance of the capacitor C1 (the time constant of the circuit) without any consideration of the external noise.

Figure 49:
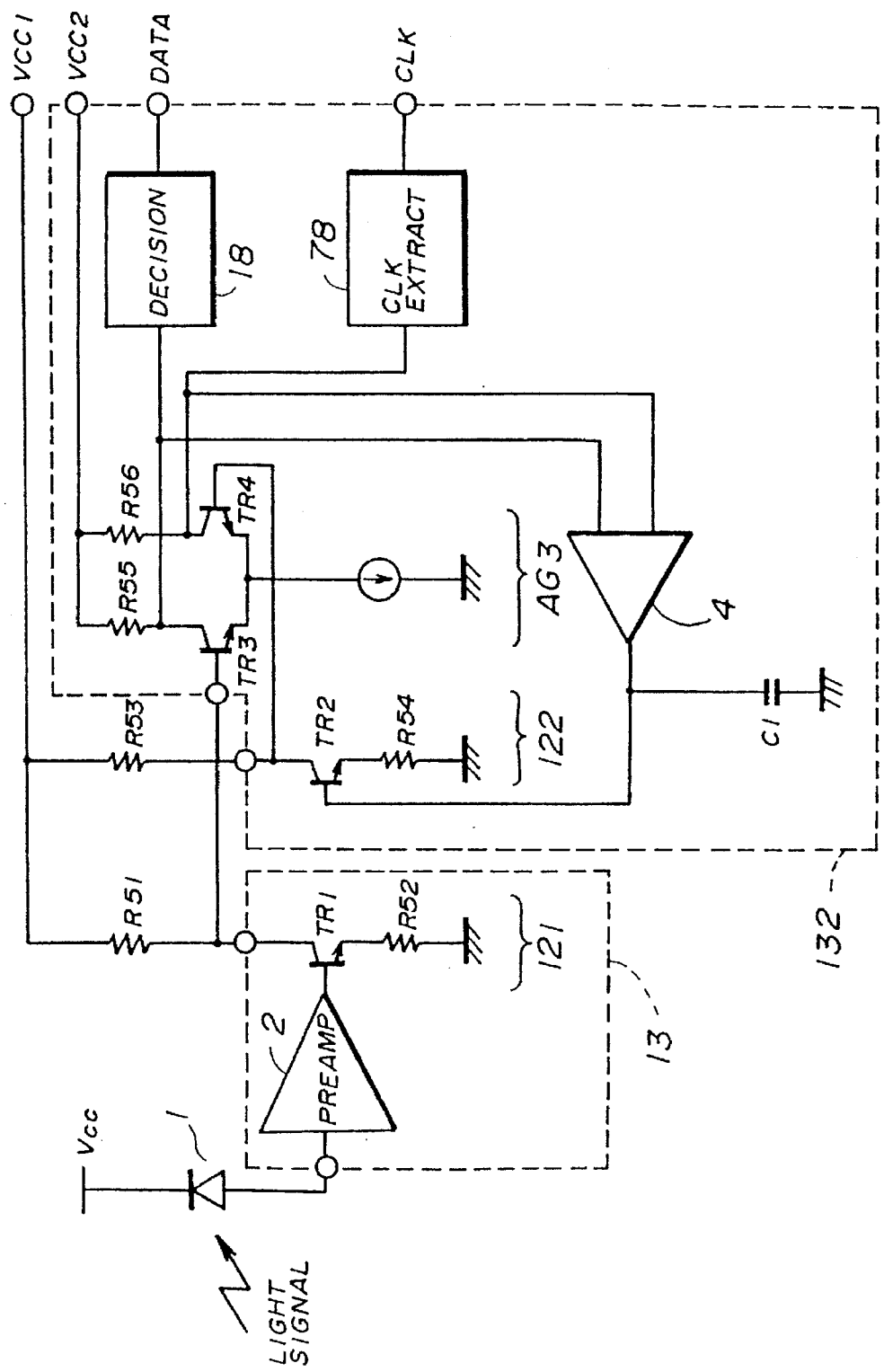
FIG. 49 is a block diagram showing the light amplifier shown in FIG. 47 in more detail.

FIG. 49 is a block diagram showing the configuration shown in FIG. 47 in more detail. A preamplifier module 131 is made up of the preamplifier 2, and the output buffer 121 comprised of a transistor TR1 and a resistor R52. A module 132 is made up of the AGC circuit 3, the offset compensation circuit 4, the decision circuit 18, the clock extracting circuit 78 and the output buffer 122. The output buffer 122 has the same circuit configuration as that of the output buffer 121, and is formed by a transistor TR2 and a resistor R54. The collectors of the transistors TR1 and TR2 are respectively connected directly to the bases of transistors TR3 and TR4 used to form the AGC amplifier 3 (open-collector circuit). Also, the collectors of the transistors TR1 and TR2 are connected to a common power supply line Vcc1 via respective resistors RS1 and R52. The collectors of the transistors TR3 and TR4 are connected to a common power supply line Vcc2 via respective resistors R55 and R56. The power supply voltage Vcc1 may be equal to or different from the power supply voltage Vcc2. Also, it is possible to determine the power supply voltages so that the power supply voltages Vcc, Vcc1 and Vcc2 are equal to each other or different from each other.

When R51=R53, then noise superimposed on the power supply voltage Vcc1 is transferred to the bases of the transistors TR3 and TR4 via the resistors R51 and R53 so that the levels of the nose applied to the bases of these transistors are equal to each other. The differential amplifier including the transistors TR3 and TR4, the resistors R55 and R56, and a constant-current source I functions to cancel the in-phase noise components applied to the bases of the transistors TR3 and TR4. Hence, no noise components do not appear at the collectors of the transistors TR3 and TR4. Hence, only the normal signals can be applied to the decision circuit 18 and the block extracting circuit 78.

Further, the input impedances of the transistors TR3 and TR4 are equal to each other resulting from use of the same output buffers 121 and 122 connected to the outputs of the preamplifier 2 and the AGC circuit 3. Hence, noise transferred via space is input at the same level, and the differential amplifier cancels the in-phase noise components.

It will be noted that the configurations shown in FIGS. 47 and 49 can be configured in the same way as has been described previously. For example, the output buffer 121 can be applied to the preamplifiers shown in FIGS. 16 and 17.

The present invention is not limited to the specifically disclosed embodiments, and variations and modifications may be made without departing from the scope of the present invention.

What is claimed is:

1. An equalizing amplifier equalizing an electric signal obtained from a light signal received via an optical transmission path, said equalizing amplifier comprising:

an AGC circuit generating first and second signals from the electric signal by referring to a threshold voltage, said first and second signals being complementary signals; and an offset compensation circuit generating a first difference signal based on a difference between said first and second signals, comparing said first difference signal with a first reference signal and outputting, as said threshold voltage, a resultant error signal to said AGC circuit, said threshold voltage being varied so that it is located in the center of an amplitude of said electric signal whereby an offset of said AGC circuit can be compensated for.

2. The equalizing amplifier as claimed in claim 1, wherein said first reference signal corresponds to a logic level of one of the first and second signals.

3. The equalizing amplifier as claimed in claim 1, further comprising an output buffer circuit which is connected to an output of the offset compensation circuit and has a configuration identical to that of an output buffer circuit proceeding to the equalizing amplifier.

4. An equalizing amplifier for equalizing an electric signal obtained from a light signal received via an optical transmission path, said equalizing amplifier comprising:

an AGC circuit generating first and second signals from the electric signal by referring to a threshold voltage, said first and second signals being complementary signals; and an offset compensation circuit generating a first difference signal based on a difference between said first and second signals, comparing said first difference signal with a first reference signal and outputting, as said threshold voltage, a resultant error signal to said AGC circuit, said threshold voltage being varied so that it is located in the center of an amplitude of said electric signal whereby an offset of said AGC circuit can be compensated for, wherein said offset compensation circuit comprises a circuit part which performs a level-shift operation on one of said first and second signals output from said AGC circuit and then generates said first difference signal based on the difference between the first and second signals.

5. The equalizing amplifier as claimed in claim 4, wherein said offset compensation circuit comprises:

a rectifying circuit performing a peak operation on said first difference signal; and an error detection circuit comparing a peak-rectified version of said first difference signal with said dirst reference voltage.

6. The equalizing amplifier as claimed in claim 4, wherein said first reference signal corresponds to a logic level of one of the first and second signals.

7. An equalizing amplifier for equalizing an electric signal obtained from a light signal received via an optical transmission path, said equalizing amplifier comprising:

an AGC circuit generating first and second signals from the electric signal by referring to a threshold voltage, said first and second signals being complementary signals; and an offset compensation circuit generating a first difference signal based on a difference between said first and second signals, comparing said first difference signal with a first reference signal and outputting, as said threshold voltage, a resultant error signal to said AGC circuit, said threshold voltage being varied so that it is located in the center of an amplitude of said electric signal whereby an offset of said AGC circuit can be compensated for, wherein said first reference signal corresponds to a logic level of one of the first and second signals, and wherein said offset compensation circuit comprises:

a rectifying circuit performing a peak-operation on said first difference signal; and an error detection circuit comparing a peak-rectified version of said first difference signal with said first reference signal.

8. An equalizing amplifier for equalizing an electric signal obtained from a light signal received via an optical transmission path, said equalizing amplifier comprising:

an AGC circuit generating first and second signals from the electric signal by referring to a threshold voltage, said first and second signals being complementary signals; and an offset compensation circuit generating a first difference signal based on a difference between said first and second signals, comparing said first difference signal with a first reference signal and outputting, as said threshold voltage, a resultant error signal to said AGC circuit, said threshold voltage being varied so that it is located in the center of an amplitude of said electric signal whereby an offset of said AGC circuit can be compensated for; and a level shift circuit which shifts a level of one of the first and second signals so that a first logic level of said first signal coincides with a second logic level of said second signal.

9. The equalizing amplifier as claimed in claim 8, wherein the first logic level and said second logic level correspond to a logic "0".

10. The equalizing amplifier as claimed in claim 8, wherein said level shift circuit comprises a resistance element to which either the first signal or the second signal is applied.

11. An equalizing amplifier for equalizing an electric signal obtained from a light signal received via an optical transmission path, said equalizing amplifier comprising:

an AGC circuit generating first and second signals from the electric signal by referring to a threshold voltage, said first and second signals being complementary signals;

an offset compensation circuit generating a first difference signal based on a difference between said first and second signals, comparing said first difference signal with a first reference signal and outputting, said threshold voltage, a resultant error signal to said AGC circuit, said threshold voltage being varied so that it is located in the center of an amplitude of said electric signal whereby an offset of said AGC circuit can be compensated for; and a gain control circuit which detects a second difference signal based on a difference between the first and second signals, compares said second difference signal with a second reference signal, and outputs, as a gain control signal, a resultant error signal to said AGC circuit; and wherein the gain control signal controls a gain of the AGC circuit.

12. The equalizing amplifier as claimed in claim 11, wherein:

said equalizing amplifier comprises a circuit part which shifts a level of one of the first and second signals and then generates said second difference signal based on the difference between the first and second signals;

said first and second reference voltages correspond to respective logic levels of the first and second signals;

said gain control circuit comprises a rectifying circuit which performs a peak rectifying operation on said second difference signal, and an error detection circuit compares a peak-rectified version of said second difference signal with said second reference voltage; and said equalizing amplifier comprises a level shift circuit which performs a level shift operation on one of the first and second signals so that a logic level "1" of said first signal coincides with a logic level "1" of said second signal.

13. The equalizing amplifier as claimed in 12, wherein:

said AGC circuit has first and second differential amplifiers having different gains;

the first and second differential amplifiers comprise transistors which receive said electric signal and said threshold voltage; and said AGC circuit comprises transistors which are connected in parallel with the first and second differential amplifiers and are controlled in accordance with said gain control signal.

14. The equalizing amplifier as claimed in claim 13, wherein said AGC circuit comprises constant-current circuits respectively provided for said first and second differential amplifiers.

15. A receiver comprising:

an equalizing amplifier which equalizes an electric signal obtained from a light signal transmitted over an optical transmission path;

a timing generator which generates a clock signal from timing information contained in said electric signal; and a decision circuit which makes a decision on an output signal of the equalizing amplifier using said clock signal, said equalizing amplifier comprising:

an AGC circuit generating first and second signals from the electric signal by referring to a threshold voltage, said first and second signals being complementary signals; and an offset compensation circuit generating a first difference signal based on a difference between said first and second signals, comparing said first difference signal with a first reference signal and outputting, as said threshold voltage, a resultant error signal to said AGC circuit, said threshold voltage being varied so that it is located in the center of an amplitude of said electric signal so that an offset of said AGC circuit can be compensated for.

16. The receiver as claimed in claim 14, wherein:

said decision circuit comprises a flip-flop circuit of a master-slave type;

said flip-flop comprises a plurality of differential amplifiers in which states thereof are changed in accordance with the output signal of the equalizing amplifier; and said decision circuit comprises transistors which are connected in parallel with the differential amplifiers and control operations of the differential amplifiers in accordance with said clock signal.

17. The receiver as claimed in claim 15, wherein said receiver further comprises a preamplifier which amplifies said electric signal obtained from the light signal and outputs an amplified signal to said equalizing amplifier.

18. The receiver as claimed in claim 17, wherein said preamplifier comprises:

a first transistor amplifying said electric signal;

a second transistor amplifying an output signal output via a collector of said first transistor;

a clamp circuit which has a parallel circuit having a resistance element and a third transistor and is provided between an emitter of said second transistor and a base of the first transistor; and a feedback circuit which is connected to the emitter of said second transistor and applies a variation in the emitter voltage of said second transistor to a base of said third transistor.

19. The receiver as claimed in claim 18, wherein said preamplifier comprises a circuit which is connected to the emitter of said first transistor and controls the emitter voltage of said first transistor at a predetermined voltage.

20. The receiver as claimed in claim 17, wherein said equalizing amplifier, said timing generator and said preamplifier are accommodated in a single module.

21. The receiver as claimed in claim 17, further comprising:

a first output buffer circuit connected to an output of said preamplifier; and a second output buffer circuit connected to an output of the offset compensation circuit, the first and second output buffer circuits having an identical circuit configuration.

22. The receiver as claimed in claim 16, wherein said receiver further comprises a preamplifier which amplifies said electric signal obtained from the light signal and outputs an amplified signal to said equalizing amplifier.

23. The receiver as claimed in claim 15, wherein, said receiver comprises:

a constant-current source circuit generating a first control voltage used to control a circuit provided in said receiver by utilizing a difference between voltages produced by a reference circuit having a resistor and a diode; and a circuit which generates one of a constant current and a constant voltage by comprising a predetermined voltage obtained in said reference circuit with an internal voltage obtained in a first current path in said receiver, generating a second control voltage for controlling a current flowing in said first current path so that a difference between said predetermined voltage and said internal voltage becomes a constant level and controlling a current flowing in a second current path provided parallel to said first current path by said second control voltage.

24. The receiver as claimed in claim 23, wherein said first current path comprises a resistance element externally connectable to said receiver.

25. The receiver as claimed in claim 15, wherein:

said receiver comprises a buffer which outputs the output signal of said decision circuit to an outside of the receiver;

said buffer comprises two differential amplifiers connected in series and current sources driving said two differential amplifiers; and said receiver comprises a circuit that controls an output voltage of one of said two differential amplifiers located at a front stage so that a collector voltage of a transistor contained in a one of the current sources associated with the other one of said two differential amplifiers located at a rear stage is made constant.

26. The receiver as claimed in claim 15, wherein said equalizing amplifier and said timing generator are accommodated in a single module.

27. A preamplifier comprising:

a first transistor amplifying an input signal;

a second transistor amplifying an output of the first transistor;

a clamp circuit that includes a resistance element and a third transistor connected in parallel and is provided between an emitter of the second transistor and a base of the first transistor; and a feedback circuit that is connected to the emitter of the second transistor and applies a variation in an emitter voltage of the second transistor to a base of the third transistor.

28. The preamplifier as claimed in claim 27, wherein said preamplifier comprises a circuit which is connected to the emitter of said first transistor and controls the emitter voltage of said first transistor at a predetermined voltage.

29. The preamplifier as claimed in claim 27, further comprising an output buffer circuit having a configuration identical to that of another output buffer circuit connected to an input terminal of a following differential amplifier and applying an output signal from the second transistor to another input terminal of said differential amplifier.

30. The preamplifier as claimed in claim 29, wherein said output buffer circuit and said another amplifier circuit receive an identical power supply voltage.

31. A preamplifier comprising:

a first transistor amplifying an input signal;

a second transistor amplifying an output of the first transistor;

a clamp circuit that includes a resistance element and a third transistor connected in parallel and is provided between an emitter of the second transistor and a base of the first transistor; and an output buffer circuit having a configuration identical to that of another output buffer circuit connected to an input terminal of a following differential amplifier and applying an output signal from the second transistor to another input terminal of said differential amplifier.

32. The preamplifier as claimed in claim 31, wherein said output buffer circuit and said another amplifier circuit receive an identical power supply voltage.

33. An equalizing amplifier for equalizing an electric signal obtained from a light signal received via an optical transmission path, said equalizing amplifier comprising:

an AGC circuit generating first and second signals from the electric signal by referring to a threshold voltage, said first and second signals being complementary signals; and an offset compensation circuit generating a first difference signal based on a difference between said first and second signals, comparing said first difference signal with a first reference signal and outputting, as said threshold voltage, a resultant error signal to said AGC circuit, said threshold voltage being varied so that it is located in the center of an amplitude of said electric signal whereby an offset of said AGC circuit can be compensated for;

wherein said offset compensation circuit comprises:

a first rectifying circuit that performs a peak rectifying operation on said first signal;

a second rectifying circuit that performs a peak rectifying operation on said second signal; and an error detecting circuit detecting a difference between a peak-rectified version of said first signal and a peak-rectified version of said second signal, and outputting said first difference signal functioning as said threshold voltage.

* * * * *